(12) United States Patent
Hill et al.

(10) Patent No.: US 12,117,493 B2
(45) Date of Patent: Oct. 15, 2024

(54) ENHANCED CHIRP EXCITATION SIGNAL FOR BROADBAND IMPEDANCE MEASUREMENT

(71) Applicant: Dynexus Technology, Inc., Loveland, CO (US)

(72) Inventors: Bryce Hill, Butte, MT (US); John Morrison, Butte, MT (US); Jon P. Christophersen, Moscow, ID (US)

(73) Assignee: Dynexus Technology, Inc., Loveland, CO (US)

( * ) Notice: Subject to any disclaimer, the term of this patent is extended or adjusted under 35 U.S.C. 154(b) by 219 days.

(21) Appl. No.: 17/607,643

(22) PCT Filed: May 1, 2020

(86) PCT No.: PCT/US2020/031021
§ 371 (c)(1),
(2) Date: Oct. 29, 2021

(87) PCT Pub. No.: WO2020/223630
PCT Pub. Date: Nov. 5, 2020

(65) Prior Publication Data
US 2023/0031969 A1    Feb. 2, 2023

Related U.S. Application Data

(60) Provisional application No. 62/842,313, filed on May 2, 2019.

(51) Int. Cl.
*G01R 31/367* (2019.01)
*G01R 31/389* (2019.01)

(52) U.S. Cl.
CPC ......... *G01R 31/367* (2019.01); *G01R 31/389* (2019.01)

(58) Field of Classification Search
CPC ............................ G01R 31/367; G01R 31/389
USPC .......................................................... 702/63
See application file for complete search history.

(56) References Cited

U.S. PATENT DOCUMENTS

| 4,498,044 A | 2/1985 | Horn |
| 4,697,134 A | 9/1987 | Burkum et al. |
| 5,061,890 A | 10/1991 | Longini |
| 5,261,007 A | 11/1993 | Hirsch |
| 5,281,920 A | 1/1994 | Wurst |

(Continued)

FOREIGN PATENT DOCUMENTS

| EP | 2447728 B1 | 6/2013 |
| JP | 2000-009817 A | 1/2000 |

(Continued)

OTHER PUBLICATIONS

Dung et al. ILP-Based Algorithm for Lithium-Ion Battery Charging Profile. IEEE, 2010, pp. 2286-2291.

(Continued)

*Primary Examiner* — Ricky Go
(74) *Attorney, Agent, or Firm* — Craig R. Miles; CR MILES P.C.

(57) ABSTRACT

Devices and methods to perform AC impedance measurement of a device which use an excitation signal including a root mean squared current or a root mean squared voltage in a sequence of one or more frequency groups, wherein each of said frequency groups includes a summation of one or more frequencies within a frequency spread.

19 Claims, 54 Drawing Sheets

(56) References Cited

U.S. PATENT DOCUMENTS

| | | |
|---|---|---|
| 5,349,535 A | 9/1994 | Gupta |
| 5,406,496 A | 4/1995 | Quinn |
| 5,457,377 A | 10/1995 | Jonsson |
| 5,512,832 A | 4/1996 | Russel et al. |
| 5,747,456 A | 5/1998 | Chorev et al. |
| 5,773,978 A | 6/1998 | Becker |
| 5,821,757 A | 10/1998 | Alvarez et al. |
| 5,946,482 A | 8/1999 | Barford et al. |
| 5,969,625 A | 10/1999 | Russo |
| 6,002,238 A | 12/1999 | Champlin |
| 6,072,299 A | 6/2000 | Kurle et al. |
| 6,160,382 A | 12/2000 | Yoon et al. |
| 6,208,147 B1 | 3/2001 | Yoon et al. |
| 6,222,369 B1 | 4/2001 | Champlin |
| 6,249,186 B1 | 6/2001 | Ebihara et al. |
| 6,262,563 B1 | 7/2001 | Champlin |
| 6,307,378 B1 | 10/2001 | Kozlowski |
| 6,313,607 B1 | 11/2001 | Champlin |
| 6,330,933 B1 | 12/2001 | Boeckman et al. |
| 6,340,889 B1 | 1/2002 | Sakurai |
| 6,359,419 B1 | 3/2002 | Verbrugge et al. |
| 6,417,669 B1 | 7/2002 | Champlin |
| 6,472,847 B2 | 10/2002 | Lundberg |
| 6,481,289 B2 | 11/2002 | Dixon et al. |
| 6,519,539 B1 | 2/2003 | Freeman et al. |
| 6,532,425 B1 | 3/2003 | Boost et al. |
| 6,542,077 B2 | 4/2003 | Joao |
| 6,556,001 B1 | 4/2003 | Wiegand et al. |
| 6,639,385 B2 | 10/2003 | Verbrugge et al. |
| 6,646,419 B1 | 11/2003 | Uing |
| 6,653,817 B2 | 11/2003 | Tate, Jr. et al. |
| 6,691,095 B2 | 2/2004 | Singh et al. |
| 6,693,439 B1 | 2/2004 | Liu et al. |
| 6,778,913 B2 | 8/2004 | Tinnemeyer |
| 6,816,797 B2 | 11/2004 | Freeman et al. |
| 6,832,171 B2 | 12/2004 | Barsoukov et al. |
| 6,839,597 B2 | 1/2005 | Hattori et al. |
| 6,876,174 B1 | 4/2005 | Samittier Marti et al. |
| 6,922,058 B2 | 6/2005 | Potempa |
| 7,019,542 B2 | 3/2006 | Tinnemeyer |
| 7,051,008 B2 | 5/2006 | Singh et al. |
| 7,065,474 B2 | 6/2006 | Petchenev et al. |
| 7,072,871 B1 | 7/2006 | Tinnemeyer |
| 7,113,853 B2 | 9/2006 | Hecklinger |
| 7,259,572 B2 | 8/2007 | Houldsworth et al. |
| 7,349,816 B2 | 3/2008 | Quint et al. |
| 7,395,163 B1 | 7/2008 | Morrison et al. |
| 7,567,057 B2 | 7/2009 | Elder et al. |
| 7,598,700 B2 | 10/2009 | Elder et al. |
| 7,616,003 B2 | 11/2009 | Satoh et al. |
| 7,675,293 B2 | 3/2010 | Christophersen et al. |
| 7,688,036 B2 | 3/2010 | Yarger et al. |
| 7,688,074 B2 | 3/2010 | Cox et al. |
| 7,698,078 B2 | 4/2010 | Kelty et al. |
| 7,898,263 B2 | 3/2011 | Ishida et al. |
| 7,928,735 B2 | 4/2011 | Huang et al. |
| 8,035,396 B2 | 10/2011 | Kim |
| 8,150,643 B1 | 4/2012 | Morrison et al. |
| 8,193,771 B2 | 6/2012 | Coccio |
| 8,332,342 B1 | 12/2012 | Saha et al. |
| 8,352,204 B2 | 1/2013 | Morrison et al. |
| 8,368,357 B2 | 2/2013 | Ghantous et al. |
| 8,410,783 B2 | 4/2013 | Staton |
| 8,415,926 B2 | 4/2013 | Bhardwaj et al. |
| 8,427,112 B2 | 4/2013 | Ghantous et al. |
| 8,447,544 B2 | 5/2013 | Hsu et al. |
| 8,467,984 B2 | 6/2013 | Gering |
| 8,487,628 B2 | 7/2013 | Sciarretta et al. |
| 8,513,921 B2 | 8/2013 | Berkowitz et al. |
| 8,521,497 B2 | 8/2013 | Gering |
| 8,532,945 B2 | 9/2013 | Sciarretta et al. |
| 8,548,762 B2 | 10/2013 | Prada et al. |
| 8,582,675 B1 | 11/2013 | Harris |
| 8,598,849 B2 | 12/2013 | Bhardwaj et al. |
| 8,638,070 B2 | 1/2014 | Maluf et al. |
| 8,648,602 B2 | 2/2014 | van Lammeren |
| 8,680,868 B2 | 3/2014 | van Lammeren et al. |
| 8,710,847 B2 | 4/2014 | Marvin et al. |
| 8,725,456 B1 | 5/2014 | Saha et al. |
| 8,738,310 B2 | 5/2014 | Swanton |
| 8,738,311 B2 | 5/2014 | Wu |
| 8,762,109 B2 | 6/2014 | Christophersen et al. |
| 8,773,145 B2 | 7/2014 | Phlippoteau et al. |
| 8,791,669 B2 | 7/2014 | Ghantous et al. |
| 8,831,897 B2 | 9/2014 | McHardy |
| 8,838,401 B2 | 9/2014 | Kelly |
| 8,849,598 B2 | 9/2014 | Mingant et al. |
| 8,868,363 B2 | 10/2014 | Morrison et al. |
| 8,878,549 B2 | 11/2014 | Nakanishi et al. |
| 8,889,309 B2 | 11/2014 | Manabe et al. |
| 8,901,886 B2 | 12/2014 | Berkowitz et al. |
| 8,907,631 B1 | 12/2014 | Gurries et al. |
| 8,907,675 B2 | 12/2014 | Phlippoteau et al. |
| 8,952,823 B2 | 2/2015 | Xie et al. |
| 8,970,178 B2 | 3/2015 | Berkowitz et al. |
| 8,975,874 B2 | 3/2015 | Berkowitz et al. |
| 9,030,173 B2 | 5/2015 | McHardy et al. |
| 9,035,621 B2 | 5/2015 | Berkowitz et al. |
| 9,035,623 B1 | 5/2015 | Berkowitz et al. |
| 9,063,018 B1 | 6/2015 | Ghantous et al. |
| 9,121,910 B2 | 9/2015 | Maluf et al. |
| 9,142,994 B2 | 9/2015 | Berkowitz et al. |
| 9,207,285 B1 | 12/2015 | Swanton et al. |
| 9,244,130 B2 | 1/2016 | Morrison et al. |
| 9,252,465 B2 | 2/2016 | Hariharan |
| 9,312,577 B2 | 4/2016 | Jamison |
| 9,373,972 B2 | 6/2016 | Ghantous et al. |
| 9,385,555 B2 | 7/2016 | Ghantous et al. |
| 9,461,492 B1 | 10/2016 | Berkowitz et al. |
| 9,465,077 B2 | 10/2016 | Love et al. |
| 9,519,031 B2 | 12/2016 | Jamison |
| 9,669,723 B2 | 6/2017 | Sugeno et al. |
| 9,851,414 B2 | 12/2017 | Morrison et al. |
| 10,189,354 B2 | 1/2019 | Brochhaus |
| 10,345,384 B2 | 7/2019 | Christophersen et al. |
| 10,379,168 B2 | 8/2019 | Christophersen et al. |
| 11,146,103 B1* | 10/2021 | Davies .................. G06F 9/4401 |
| 2001/0035756 A1 | 11/2001 | Kozlowski |
| 2002/0065621 A1 | 5/2002 | Jungerman |
| 2003/0184307 A1 | 10/2003 | Kozlowski et al. |
| 2003/0206021 A1 | 11/2003 | Laletin et al. |
| 2004/0095249 A1 | 5/2004 | Zaccaria |
| 2004/0162683 A1 | 8/2004 | Verbrugge et al. |
| 2005/0086070 A1 | 4/2005 | Engelman |
| 2005/0127908 A1 | 6/2005 | Schlicker et al. |
| 2005/0182584 A1 | 8/2005 | Plusquellic |
| 2006/0111854 A1 | 5/2006 | Plett |
| 2006/0111870 A1 | 5/2006 | Plett |
| 2006/0170397 A1 | 8/2006 | Srinivasan et al. |
| 2006/0186890 A1 | 8/2006 | Iwane et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0182371 A1 | 8/2007 | Boebel |
| 2007/0182576 A1 | 8/2007 | Proska et al. |
| 2007/0257681 A1 | 11/2007 | Christophersen et al. |
| 2008/0071487 A1* | 3/2008 | Zeng ..................... G01L 1/125 |
| | | 702/65 |
| 2008/0303528 A1 | 12/2008 | Kim |
| 2009/0076752 A1 | 3/2009 | Wang et al. |
| 2009/0278037 A1 | 11/2009 | Grothe, Jr. |
| 2010/0010762 A1 | 1/2010 | Seki |
| 2010/0121588 A1 | 5/2010 | Elder et al. |
| 2010/0201320 A1 | 8/2010 | Coe et al. |
| 2010/0207772 A1 | 8/2010 | Yamamoto |
| 2010/0274510 A1 | 10/2010 | Morrison et al. |
| 2010/0332165 A1 | 12/2010 | Morrison et al. |
| 2011/0018543 A1 | 1/2011 | Bos et al. |
| 2011/0077879 A1 | 3/2011 | Paryani |
| 2011/0077880 A1 | 3/2011 | Gering |
| 2011/0082621 A1 | 4/2011 | Berkobin et al. |
| 2011/0169452 A1 | 7/2011 | Cooper et al. |
| 2011/0270559 A1 | 11/2011 | Christophersen et al. |
| 2011/0301931 A1 | 12/2011 | Gering |

(56) References Cited

U.S. PATENT DOCUMENTS

| | | |
|---|---|---|
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0217985 A1 | 8/2012 | Amanuma |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0135110 A1 | 5/2013 | Xie et al. |
| 2013/0141109 A1 | 6/2013 | Love et al. |
| 2013/0229156 A1 | 9/2013 | Brandon et al. |
| 2013/0245973 A1 | 9/2013 | Ross, Jr. et al. |
| 2013/0267943 A1 | 10/2013 | Hancock |
| 2014/0032147 A1* | 1/2014 | Verhulst ............... G01R 27/16 702/65 |
| 2014/0125284 A1 | 5/2014 | Qahouq |
| 2014/0188414 A1 | 7/2014 | Jeong et al. |
| 2014/0358462 A1* | 12/2014 | Christophersen .... G01R 31/392 702/65 |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2015/0280290 A1 | 10/2015 | Saha et al. |
| 2016/0157014 A1 | 6/2016 | Van Schyndel et al. |
| 2016/0157015 A1 | 6/2016 | Van Schyndel |
| 2016/0274060 A1 | 9/2016 | Denenberg et al. |
| 2017/0254859 A1 | 9/2017 | Christophersen et al. |
| 2018/0143257 A1 | 5/2018 | Garcia et al. |
| 2019/0214937 A1 | 7/2019 | Schmidt |

FOREIGN PATENT DOCUMENTS

| | | |
|---|---|---|
| JP | 2003-090869 A | 3/2003 |
| JP | 2003-223918 A | 8/2003 |
| JP | 2007-085772 A | 4/2007 |
| JP | 2011-174925 A | 9/2011 |
| JP | 2012-078287 A | 4/2012 |
| JP | 2013-517755 A | 5/2013 |
| JP | 014-106119 A | 6/2014 |
| JP | 2015-078992 A | 4/2015 |
| WO | 2004/106946 A2 | 12/2004 |
| WO | 2010/144834 A2 | 12/2010 |
| WO | 2010/144857 A2 | 12/2010 |
| WO | 2011/041094 A1 | 4/2011 |
| WO | 2011/140123 A1 | 11/2011 |
| WO | 2011/140131 A1 | 11/2011 |
| WO | WO 2012/025706 A1 | 3/2012 |
| WO | 2013/085996 A1 | 6/2013 |
| WO | 2014/070831 A1 | 5/2014 |
| WO | 2015/029647 A1 | 3/2015 |
| WO | 2016/012922 A1 | 1/2016 |
| WO | WO 2017/003917 A1 | 1/2017 |
| WO | 2020/223630 | 11/2020 |
| WO | 2020/223651 | 11/2020 |

OTHER PUBLICATIONS

Farmann et al. Critical review of on-board capacity estimation techniques for lithium-ion batteries in electric and hybrid electric vehicles. Journal of Power Sources, May 2015, 281:114-130.

Goebel et al. Prognostics in Battery Health Management. IEEE Instrumentation & Measurement Magazine, Sep. 2008, 11(4):33-40.

Gopalakrishnan et al. Electrochemical impedance spectroscopy characterization and parameterization of lithium nickel manganese cobalt oxide pouch cells: dependency analysis of temperature and state of charge. Ionics 25(1), Jan. 2019 (published online Jun. 2018, Springer, Germany), 14 pages.

Gould et al. New Battery Model and State-of-Health Determination Through Subspace Parameter Estimation and State-Observer Techniques. IEEE Transactions on Vehicular Technology, Oct. 2009, 58(8):3905-3916.

Guha et al. Remaining Useful Life Estimation of Lithium-Ion Batteries based on the Internal Resistance Growth Model. Indian Control Conference (ICC), Jan. 2017, pp. 33-38.

Hariprakash et al. Monitoring sealed automotive lead-acid batteries by sparse-impedance spectroscopy. Proc. Indian Acad. Sci. (Chem. Sci.), Oct. 2003, 115(5):465- 472.

Hariprakash et al. On-line monitoring of lead-acid batteries by galvanostatic non-destructive technique. Journal of Power Sources, Oct. 2004, 137(1):128-133.

Harting et al. State-of-Health Diagnosis of Lithium-Ion Batteries Using Nonlinear Frequency Response Analysis. Journal of The Electrochemical Society, Jan. 2019, 166(2):A277-A285.

Hill et al. Steady State Frequency Response Utilizing an Enhanced Chirp Test Signal. 2019 IEEE Aerospace Conference, Mar. 2019, pp. 1-8.

Hlavac et al. VRLA Battery Monitoring Using Conductance Technology. IEEE, 12-3 (1995) pp. 284-291.

Howey et al. On-line measurement of battery impedance using motor controller excitation. IEEE Transactions on Vehicular Technology, Jul. 2014, 63(6):2557-2566.

Huang et al. An Online Battery Impedance Measurement Method Using DC-DC Power Converter Control. IEEE Transactions on Industrial Electronics, Nov. 2014, 61(11):5987-5995.

Karden et al. A method for measurement of interpretation of impedance spectra for industrial batteries. Journal of Power Sources, Jan. 2000, 85(1):72-78.

Kolmel et al. Quality-oriented production planning of battery assembly systems for electric mobility. Procedia CIRP 23, Dec. 2014, pp. 149-154.

Kozlowski A Novel Online Measurement Technique for AC Impedance of Batteries and Other Electrochemical Systems. The Sixteenth Annual Battery Conference on Applications and Advances (Proceedings), Jan. 2001, pp. 257-262.

Kozlowski. Electrochemical Cell Prognostics using Online Impedance Measurements and Model-Based Data Fusion Techniques. Aerospace Conference, 2003 Proceedings, vol. 7-3257, Mar. 2003, 14 pages.

Lamb et al. Determination of Battery Stability With Advanced Diagnostics. SAND2017-6959, Unlimited Release, Jul. 2017, 56 pages.

Lamb et al. Determination of Battery Stability With Advanced Diagnostics. (Report No. DOT HS 812 249), Washington, DC: National Highway Traffic Safety Administration, Mar. 2016, 42 pages.

Le et al. Lithium-ion Battery State of Health Estimation Using Ah-V Characterization. Annual Conference of the Prognostics and Health Management Society, 2011, 3(1), 7 pages.

Li et al. Understanding the molecular mechanism of pulse current charging for stable lithium-metal batteries. Science Advances, Jul. 2017, 3(7), 10 pages.

Love et al. State-of-Health Monitoring of 18650 4S Packs With a Single-Point Impedance Diagnostic. Journal of Power Sources, Oct. 2014, 266:512-519.

Lu et al. A review on the key issues for lithium-ion battery management in electric vehicles. Journal of Power Sources, Mar. 2013, 226:272-288.

Mingant et al. Towards onboard Li-ion battery state-of-health diagnosis by a virtual sensor. World Electric Vehicle Journal, May 2012, 5(2):405-411.

Novak. Developing an advanced, predictive battery health monitoring solution with a low-cost microcontroller solution. Texas Instruments, White Paper, Sep. 2012, 6 pages.

Noworolski et al. Reducing and Utilizing Electrical Noises for Battery Monitoring Purposes. IEEE 32-4 (Sep. 2004), pp. 511-614.

Okoshi et al. Battery condition monitoring (BCM) technologies about lead-acid batteries. Journal of Power Sources, Aug. 2006, 158(2):874-878.

(56) References Cited

OTHER PUBLICATIONS

Pastor-Fernandez et al. A Comparison between EIS and IC-DV as Li-ion Diagnostic Techniques to Identify and Quantify the Effects of Degradation Modes within BMS. Journal of Power Sources, Aug. 2017, 360:301-318.
Pastor-Fernandez et al. A Study of Cell-to-Cell Interactions and Degradation in Parallel Strings: Implications for the Battery Management System. Journal of Power Sources, Oct. 2016, 329:574-585.
Perez et al. Guidelines for the characterization of the internal impedance of lithium-ion batteries in PHM algorithms. International Journal of Prognostics and Health Management, Apr. 2018, ISSN 2153-2648, 11 pages.
Piret et al. Tracking of electrochemical impedance of batteries. Journal of Power Sources, Apr. 2016, 312:60-69.
Pop et al. State-of-the-art of battery state-of-charge determination. Measurement Science and Technology, Dec. 2005, 16(4) R93-R110.
Qnovo. Fundamentals of Qnovo Adaptive Charging in Lithium Ion Batteries. http://qnovo.com/wp-content/uploads/2015/12/Onovo_TechWhitePaper_v2.4.pdf, Dec. 2015, 13 pages.
Rahmoun et al. Determination of the Impedance of Lithium-Ion Batteries using Methods of Digital Signal Processing. Energy Procedia, Dec. 2014, 46:204-213.
Raijmakers et al. Crosstalk Interferences on Impedance Measurements in Battery Packs. IFAC-PapersOnline, Jun. 2016, 49(11):042-047.
Saha et al. Comparison of Prognostic Algorithms for Estimating Remaining Useful Life of Batteries. Transactions of the Institute of Measurement and Control, Jun. 2009, 31(3), 10 pages.
Saha et al. Prognostics Methods for Battery Health Monitoring Using a Bayesian Framework. IEEE Transactions on Instrumentation and Measurement, Feb. 2009, 58(2):291-296.
Salehen et al. Development of battery management systems (BMS) for electric vehicles (EVs) in Malaysia MATEC Web of Conferences, Jan. 2017, 90(11):01001, 8 pages.
Sazhin et al. Enhancing Li-Ion Battery Safety by Early Detection of Nascent Internal Shorts. Journal of The Electrochemical Society, Jan. 2017, 164(1):A6281-A6287.
Schweiger et al. Comparison of Several Methods for Determining the Internal Resistance of Lithium Ion Cells. Sensors, Jun. 2010, 10(6):5604-5625.
Singh et al. Fuzzy logic modeling of EIS measurements on lithium-ion batteries. Electrochimica Acta, Jan. 2006, 51(8):1673-1679.
Socher et al. Improving the functional safety of automotive batteries using in-situ impedance spectroscopy. Transportation Research Procedia, Dec. 2016, 14:3661-3666.
Srivastav et al. State-of-charge indication in Li-ion batteries by simulated impedance spectroscopy. J Appl Electrochem, Feb. 2017, 47(2):229-236.
Sternad et al. Condition monitoring of Lithium-Ion Batteries for electric and hybrid electric vehicles. Elektrotechnik & Informationstechnik, May 2009, 126(5):186-193.
Stroe et al. Diagnosis of Lithium-Ion Batteries State-of-Health based on Electrochemical Impedance Spectroscopy Technique. Proceedings of the 2014 Energy Conversion Congress and Exposition (ECCE) IEEE Press, Sep. 2014, pp. 1576-4582.
Morrison et al. An Advanced Calibration Procedure for Complex Impedance Spectrum Measurements of Advanced Energy Storage. 58th International Instrumentation Symposium, Jun. 2012, INL/CON-12-24519, 17 pages.
Morrison et al. Fast Summation Transformation for Battery Impedance Identification. IEEE Aerospace Conference, Mar. 2009, 9 pages.
Morrison et al. Real Time Estimation of Battery Impedance. IEEE Aerospace Conference, Mar. 2006, 13 pages.
Morrison. DC Buffering and Floating Current for a High Voltage IMB Application. INL/EXT-14-32858, Aug. 2014, 8 pages.
Morrison. Development and Implementation of a Calibration Procedure for Complex Impedance Spectrum Measurements with Applications to Embedded Battery Health Monitoring and Management Systems. University of Connecticut Master's Thesis, 2012, 119 pages.
Morrison. Signals and Systems: State Variable Description of Linear Time Invariant Systems. Montana Tech Digital Commons, Sep. 2013, Chapter 17, pp. 198-216.
Morrison. Signals and Systems: Synchronous Detection. Montana Tech Digital Commons, Sep. 2013, Chapter 20, pp. 243-246.
Motloch et al. High-Power Battery Testing Procedures and Analytical Methodologies for HEV's. 7, SAE Int. Passenger Cars Electron. Electr. Syst., vol. 111 (2002), pp. 797-802.
Nikolopoulos et al. Accurate Method of Representation of High-Voltage Measuring Systems and its Application in High-Impulse-Voltage Measurements. IEEE, Mar. 1989, 136(2):66-72.
Piller et al. Methods for state-of-charge determination and their applications. Journal of Power Sources, Jun. 2001, 96(1):113-120.
Qahouq et al. Single-Perturbation-Cycle Online Battery Impedance Spectrum Measurement Method With Closed-Loop Control of Power Converter. IEEE Transactions on Industrial Electronics, Sep. 2017, 64(9):7019-7029.
Qahouq. Online Battery Impedance Spectrum Measurement Method. IEEE Applied Power Electronics Conference and Exposition, Mar. 2016, pp. 3611-3615.
Ramos et al. Comparison of impedance measurements in a DSP using ellipse-fit and seven-parameter sine-fit algorithms. Measurement, May 2009, 42(9):1370-1379.
Ran et al. Prediction of State of Charge of Lithium-ion Rechargeable Battery with Electrochemical Impedance Spectroscopy Theory. 5th IEEE Conference on Industrial Electronics and Applications, Jul. 2010, pp. 684-688.
Ranade et al. An overview of harmonics modeling and simulation, Tutorial on Harmonics Modeling and Simulation. IEEE Power Engineering Society, 1998, Chapter 1, 7 pages.
Ranieri et al. Electronic Module for the Thermal Monitoring of a Li-ion Battery Cell through the Electrochemical Impedance Estimation. 22nd International Workshop on Thermal Investigations of ICs and Systems, Sep. 2016, pp. 294-297.
Smith et al. Model Validation Approaches for Nonlinear Feedback Systems Using Frequency Response Measurements. IEEE Proceedings of the 38th IEEE Conference on Decision and Control, Dec. 1999, vol. 2, pp. 1500-1504.
Smyth. Development of a Real Time Battery Impedance Measuring System. M.S. Thesis, Montana Tech of the University of Montana, 2008, 128 pages.
Thomas et al. Statistical methodology for predicting the life of lithium-ion cells via accelerated degradation testing. Journal of Power Sources, Sep. 2008, 184(1):312-317.
Unkelhaeuser et al. Electrochemical Storage System Abuse Test Procedure Manual. United States Advanced Battery Consortium, SAND99-0497, Jul. 1999, 33 pages.
Varnosfaderani et al. Online Impedance Spectroscopy Estimation of a dc-dc converter connected Battery using an Earth Leakage Monitoring Circuit. 19th European Conference on Power Electronics and Applications, Sep. 2017, pp. P.1-P.10.
Verbrugge et al. Adaptive state of charge algorithm for nickel metal hydride batteries including hysteresis phenomena. Journal of Power Sources, Feb. 2004, 126(1-2):236-249.
Verbrugge. Adaptive, multi-parameter battery state estimator with optimized time-weighting factors. J Appl Electrochem, May 2007, 37(5):605-616.
Wang et al. State Estimation of Lithium ion Battery Based on Electrochemical Impedance Spectroscopy with On-board Impedance Measurement System. IEEE Vehicle Power and Propulsion Conference, Oct. 2015, 5 pages.
Zhang et al. Cycling degradation of an automotive LiFePO4 lithium-ion battery. Journal of Power Sources, Feb. 2011, 196(3):1513-1520.
Zhu et al. PSpice Simulation via AC Impedance for PEFC at Operational Loads. http://folk.ntnu.no/skoge/prost/proceedings/aiche-2005/topical/pdffiles/T1/papers/215c.pdf, 2005, 3 pages.
Ziemer et al. Signals and Linear System Analysis, Chapter 2, pp. 16-100, in: Principles of Communications, 5th edition, John Wiley & Sons.

(56) References Cited

OTHER PUBLICATIONS

Solartron Analytical. 1260 Impedance/Gain-Phase Analyzer. Operating Manual, Jan. 1996, 215 pages.
Solartron Analytical. 1287 Electrochemical Interface, User Guide, Aug. 2002, 134 pages.
Ineel. FreedomCAR Battery Test Manual for Power-Assist Hybrid Electric Vehicles. Oct. 2003, DOE/ID-11069, 130 pages.
Ineel. FreedomCAR Ultracapacitor Test Manual. DOE/ID-11173, Revision 0, Sep. 2004, 116 pages.
Idaho National Laboratory. Battery Test Manual for Plug-In Hybrid Electric Vehicles, INL/EXT-07-12536, Revision 0, Mar. 2008, 68 pages.
Idaho National Laboratory. Battery Test Manual for Plug-In Hybrid Electric Vehicles, INL/EXT-07-12536, Revision 2, Dec. 2010, 71 pages.
Katayama et al. Real-Time Electrochemical Impedance Diagnosis for Fuel Cells Using a DC-DC Converter. IEEE Transactions on Energy Conversion, Jun. 2015, 30(2):707-713.
Koch et al. Electrochemical Impedance Spectroscopy for Online Battery Monitoring—Power Electronics Control. 16th European Conference on Power Electronics and Applications, 2014, 10 pages.
Koch et al. Impedance Spectroscopy for Battery Monitoring with Switched Mode Amplifiers. 16th International Power Electronics and Motion Control Conference and Exposition, Sep. 2014, pp. 496-501.
Koch et al. On-line Electrochemical Impedance Spectroscopy Implementation for Telecommunication Power Supplies. IEEE International Telecommunications Energy Conference, 2015, 6 pages.
Jespersen et al. Capacity Measurements of Li-Ion Batteries using AC Impedance Spectroscopy. EVS24 International Battery, Hybrid and Fuel Cell Electric Vehicle Symposium, May 2009, in: 2009 World Electric Vehicle Journal, 3(1):0127-0133.
Jiang et al. Electrochemical impedance spectra for lithium-ion battery ageing considering the rate of discharge ability. Energy Procedia, May 2017, 105:844-849.
Kiel et al. Extensive Validation of a Nonintrusive Continuous Battery Monitoring Device. Battcon 2008, in: Proc. BattCon Conference May 2008, pp. 18-1--18-10.
Mingant et al. Novel state-of-health diagnostic method for Li-ion battery in service. Applied Energy, Elsevier, Dec. 2016, 183:390-398.
Perez et al. Guidelines for the Characterization of the Internal Impedance of Lithium-Ion Batteries in PHM Algorithms. International Journal of Prognostics and Health Management, Apr. 2018, 9, 11 pages.
Remy et al. Qualification and Life Testing of Li-ion VES16 Batteries. E3S Web of Conferences 16, Jan. 2017, 8 pages.
Seo et al. Detection of internal short circuit in Li-ion battery by estimating its resistance. Proceedings of the 4th IIAE International Conference on Intelligent Systems and Image Processing, Jan. 2016, 6 pages.
Taberna et al. Electrochemical Characteristics and Impedance Spectroscopy Studies of Carbon-Carbon Supercapacitors. Journal of the Electrochemical Society, Jan. 2003, 150(3):A292-A300.
Tachibana et al. Development of in situ a.c. impedance measurement system under constant-current conditions and its application to galvanostatic discharge of electrolytic manganese dioxide in alkaline solution. Journal of Power Sources, Jul. 1998, 74(1):29-33.
Tang et al. Temperature Dependent Performance and in Situ AC Impedance of High-Temperature PEM Fuel Cells Using the Nafion-112 Membrane. Journal of The Electrochemical Society, Sep. 2006, 153(11):A2036-A2043.
Varnosfaderani et al. A Comparison of Online Electrochemical Spectroscopy Impedance Estimation of Batteries. IEEE Access, Feb. 2018, vol. 6, pp. 23668-23677.
Verizon. Verizon NEBSTM Compliance: Qualification Requirements for Lithium Ion (Li-ion) Cells Batteries and Battery Strings. Verizon Technical Purchasing Requirements VZ.TPR.9810, Sep. 2015, Issue 1, 29 pages.
Waligo et al. A Comparison of the Different Broadband Impedance Measurement Techniques for Lithium-Ion Batteries. Energy Conversion congress and Exposition (ECCE), IEEE (Sep. 2016), 7 pages.
Waters. Monitoring the state of health of VRLA batteries through ohmic measurements. Proceedings of Power and Energy Systems in Converging Markets, Oct. 1997, 6 pages.
Weng et al. On-board state of health monitoring of lithium-ion batteries using incremental capacity analysis with support vector regression. Journal of Power Sources, Aug. 2013, 235:36-44.
Wu et al. A Review on Fault Mechanisms and Diagnosis Approach for Li-Ion Batteries. Journal of Nanomaterials, Oct. 2015, vol. 2015, Article ID 631263, 10 pages.
Xing et al. Battery Management Systems in Electric and Hybrid Vehicles. Energies, Oct. 2011, 4(11):1840-1857.
Xing et al. Prognostics and Health Monitoring for Lithium-ion Battery. Proceedings of the IEEE International Conference on Intelligence and Security Informatics, Jul. 2011, pp. 242-247.
Yamada et al. The intelligent automotive battery, 'Cybox'. Journal of Power Sources, Dec. 2008, 185(2):1478-1483.
Yoo et al. An Electrochemical Impedance Measurement Technique Employing Fourier Transform. Analytical Chemistry, May 2000, 72(9):2035-2041.
Zechang et al. Battery Management Systems in the China-made 'Start' series FCHVs. IEEE Vehicle Power and Propulsion Conference (VPPC) (Sep. 2008) 6 pages.
Zenati et al. Estimation of the SOC and the SOH of li-ion batteries, by combining impedance measurements with the fuzzy logic inference. Proceedings of the 36th Annual Conference of IEEE Industrial Electronics, Nov. 2010, pp. 1767-1772.
Zhai et al. The Application of the EIS in Li-ion Batteries Measurement. Journal of Physics: Conference Series, Oct. 2006, 48(1):1157-1161.
Zhang et al. Prediction of Lithium-Ion Battery's Remaining Useful Life Based on Relevance Vector Machine. SAE Int. J. All. Power, May 2016, 5(1):30-40.
Zhang et al. Remote Vehicle State of Health Monitoring and Its Application to Vehicle No-Start Prediction, 2009 IEEE Autotestcon, Oct. 2009, pp. 88-93.
Zhu et al. PSpice Simulation via AC Impedance for PEFC at Operational Loads. http://folk.ntnu.no/skoge/prosl/proceedings/aiche-2005/topical/pdffiles/T1/papers/215c.pdf, 2005, 3 pages.
Zhu et al. In-Situ Electrical Characterization of PEM Fuel Cells at Load. American Institute of Chemical Engineers, 2007, 5 pages.
Zhu et al. In-Stu Assessment of PEM Fuel Cells via AC Impedance at Operational Loads. http://folk.ntnu.no/skoge/prost/proceedings/aiche-2004/pdffiles/papers/014g.pdf, 2004, 5 pages.
Zou et al. Combined State of Charge and State of Health estimation over lithium-ion battery cell cycle lifespan for electric vehicles. Journal of Power Sources, Jan. 2015, 273:793-803.
Adany et al. Switching algorithms for extending battery life in Electric Vehicles. Journal of Power Sources, Jun. 2013, 231:50-59.
Ahmed et al. Enabling fast charging—A battery technology gap assessment. Journal of Power Sources, Nov. 2017, 367:250-262.
Baert et al. Determination of the State-of-Health of VRLA Batteries by Means of Noise Measurements. Intelec 2001, Nov. 2001, Conference Publication No. 484, pp. 301-306.
Bald et al. Hardware Architecture for Rapid Impedance Measurements of 50V Battery Modules. San Diego: The International Society of Automation, 58th International Instrumentation Symposium, INL/CON-12-24516, Jun. 2012, 18 pages.
Banaei et al. Online Detection of terminal voltage in Li-ion Batteries via Battery Impulse Response. IEEE, Oct. 2009, pp. 194-198.
Barsukov et al. Challenges and Solutions in Battery Fuel Gauging. Power Management Workbook, 2004, 10 pages, Texas Instruments Inc.
Beelen et al. A comparison and accuracy analysis of impedance-based temperature estimation methods for Li-ion batteries. Applied Energy, Aug. 2016, 175:128-140.
Berecibar et al. Critical review of state of health estimation methods of Li-ion batteries for real applications. Renewable and Sustainable Energy Reviews, Apr. 2016, 56:572-587.

(56) References Cited

OTHER PUBLICATIONS

Blanke et al. Impedance measurements on lead-acid batteries for state-of-charge, state-of-health and cranking capability prognosis in electric and hybrid electric vehicles. Journal of Power Sources, Jun. 2005, 144:418-425.
Blidberg. Correlation between different impedance measurement methods for battery cells. KTH Chemical Science and Engineering, 2012, 42 pages, Stockholm, Sweden.
Bohlen et al. Impedance Based Battery Diagnosis for Automotive Applications. 35th Annual IEEE Power Electronics Specialists Conference, Apr. 2004, 4:2192-2797.
Bose et al. Battery state of health estimation through coup de fouet: field experience. Intelec, Twenty-Second International Telecommunications Energy Conference (Cat. No.00CH37131), 2000, pp. 597-601.
Bose et al. Lessons Learned in Using Ohmic Techniques for Battery Monitoring. IEEE, 2001, pp. 99-104.
Brauer et al. Residential Energy Storage from Repurposed Electric Vehicle Batteries: Market Overview and Development of a Service-Centered Business Model. IEEE 18th Conference on Business Informatics, Aug. 2016, pp. 143-152.
Breugelmans et al. Odd random phase multisine electrochemical impedance spectroscopy to quantify a non-stationary behaviour: Theory and validation by calculating an instantaneous impedance value. Electrochimica Acta, Aug. 2012, 76:375-382.
Burnham et al. Enabling fast charging—Infrastructure and economic considerations. Journal of Power Sources, Nov. 2017, 367:237-249.
Cabrera-Castillo et al. Calculation of the state of safety (SOS) for lithium ion batteries. Journal of Power Sources, Aug. 2016, 324:509-520.
Carkhuff et al. Impedance-Based Battery Management System for Safety Monitoring of Lithium-Ion Batteries. IEEE Transactions on Industrial Electronics, Aug. 2018, 65(8):6497-6504.
Chan. Swept Sine Chirps for Measuring Impulse Response. Stanford Research Systems Inc., https:/thinksrs.com/downloads/pdfs/applicationnotes/SRI_SweptSine.pdf, 2010, 6 pages.
Cheng et al. Battery-Management System (BMS) and SOC Development for Electrical Vehicles. IEEE Transactions on Vehicular Technology, Jan. 2011, 60(1):76-88.
Christensen et al. Using on-board Electrochemical Impedance Spectroscopy in Battery Management Systems. World Electric Vehicle Journal, Nov. 2013, 6:0793-0799.
Cordioli et al. Development of a Methodology Based on Odd Random Phase Electrochemical Impedance Spectroscopy to Evaluate Corrosion Protection of Coatings. Proceedings of the 4th International Conference on Self-Healing Materials, Jun. 2013, pp. 152-155.
Cox et al. Battery State of Health Monitoring, Combining Conductance Technology with other Measurement Parameters for Real-Time Battery Performance Analysis. Intelec, International Telecommunications Energy Conference (Proceedings), Feb. 2000, 19-2, pp. 342-347.
Crow et al. Integrated Prognostic Health Monitoring of Battery Health in Ground Robots. Penn State Applied Research Laboratory, 32nd Association for Unmanned Vehicle Systems International Meeting, Jun. 2005, 16 pages.
Damlund. Analysis and Interpretation of AC-measurements on Batteries used to assess State-of-Health and Capacity-condition. IEEE, 1995, pp. 828-833.
Diard et al. Constant load vs constant current EIS study of electrochemical battery discharge. Electrochimica Acta, 1997, 42(23-24):3417-3420.
Diard et al. EIS study of electrochemical battery discharge on constant load. Journal of Power Sources, Jan. 1998, 70(1):78-84.
Diard et al. Impedance measurements of polymer electrolyte membrane fuel cells running on constant load Journal of Power Sources, Aug. 1998, 74(2):244-245.

U.S. Department of Energy. Battery Calendar Life Estimator Manual: Modeling and Simulation. U.S. Department of Energy Vehicle Technologies Program, Revision 1, Oct. 2012, INL-EXT-08-15136, 84 pages.
Aglzim et al. Characterization of the Resistance of a Fuel Cell on Load by Electrochemical Impedance Spectroscopy. Proceedings from the EUROCON Conference, IEEE 2007, pp. 1489-1492.
Albrecht. Battery Complex Impedance Identification with Random Signal Techniques. MS Thesis, Montana Tech of the University of Montana, May 2005, 99 pages.
Ashtiani. Battery Hazard Modes and Risk Mitigation Analysis. USABC Version 0.0, Aug. 2007, 10 pages.
Bald. Rapid Impedance Measurements for 50-V Battery Modules. Montana Tech MS Thesis, 2012, 115 pages.
U.S. Department of Energy. Battery Test Manual for 12 Volt Start/Stop Vehicles, U.S. Department of Energy Vehicle Technologies Program, INL/EXT-12-26503, Revision 1, May 2015, 67 pages.
U.S. Department of Energy. Battery Test Manual for 48 Volt Mild Hybrid Electric Vehicles, U.S. Department of Energy Vehicle Technologies Program, INL/EXT-15-36567, Revision 0, Mar. 2017, 70 pages.
U.S. Department of Energy. Battery Test Manual for Plug-In Hybrid Electric Vehicles, U.S. Department of Energy Vehicle Technologies Program, INL/EXT-14-32849, Revision 3, Sep. 2014, 83 pages.
Belt et al. Calendar and PHEV cycle life aging of high-energy, lithium-ion cells containing blended spinel and layered-oxide cathodes. Journal of Power Sources, Dec. 2011, 196(23):10213-10221.
Bloom et al. An Investigation of the Impedance Rise and Power Fade in High-Power Li-Ion Cells. 19th International Electric Vehicle Symposium (EVS-19), Oct. 2002, 14 pages.
Chan. Swept Sine Chirps for Measuring Impulse Response. Application Note, Stanford Research Systems Inc., 2010, https://thinksrs.com/downloads/pdfs/applicationnotes/SR1_SweptSine.pdf.
Chen et al. Sinusoidal-Ripple-Current Charging Strategy and Optimal Charging Frequency Study for Li-Ion Batteries. IEEE Transactions on Industrial Electronics, Jan. 2013, 60(1):88-97.
Cho et al. Battery Impedance Analysis Considering DC Component in Sinusoidal Ripple-Current Charging. IEEE Transactions on Industrial Electronics, Mar. 2016, 63(3):1561-1573.
Christophersen et al. Battery Technology Life Verification Testing and Analysis. Idaho National Laboratory INL/CON-07-12282, Dec. 2007, 12 pages.
Christophersen et al. Performance Evaluation of Gen3 Advanced Technology Development Cells. 214th ECS Meeting, Abstract #549, The Electrochemical Society, 2008, 1 page.
Christophersen et al. Pulse resistance effects due to charging or discharging of high-power lithium-ion cells: A path dependence study. Journal of Power Sources, Nov. 2007,173(2):998-1005.
Christophersen et al. Advanced Technology Development Program for Lithium-Ion Batteries: Gen 2 Performance Evaluation Final Report. INL/EXT-05-00913, Jul. 2006, 140 pages.
Christophersen et al. Crosstalk Compensation for a Rapid, Higher-Resolution Impedance Spectrum Measurement. Aerospace Conference, 2012 IEEE, Mar. 2012, 16 pages.
Christophersen et al. Effects of Reference Performance Testing during Aging Using Commercial Lithium-ion Cells. J. Electrochem Soc., May 2006, 153(7):A1406-A1416.
Christophersen et al. Electrochemical Impedance Spectroscopy Testing on the Advanced Technology Development Program Lithium-ion Cells. Sep. 2002, IEEE Trans. Veh. Technol., 56(3):1851-1855.
Christophersen et al. Long-Term Validation of Rapid Impedance Spectrum Measurements as a Battery State-of-Health Assessment Technique. SAE Int. J. Alt. Power, May 2013, 6(1):146-155.
Christophersen et al. Lumped Parameter Modeling as a Predictive Tool for a Battery Status Monitor. Oct. 2003, Proceedings from IEEE Vehicular Technology Conference, 6 pages.
Christophersen et al. Rapid Impedance Spectrum Measurements for State-of-Health Assessment of Energy Storage Devices. SAE Int. J. Passeng. Cars—Electron. Electr. Syst., Apr. 2012, 5(1), 11 pages.
Christophersen et al. Impedance Noise Identification for State-of-Health Prognostics. 43rd Power Sources Conference, Jul. 2008, 4 pages.

(56) References Cited

OTHER PUBLICATIONS

Christopherson. Battery Test Manual for Electric Vehicles. Idaho National Laboratory, U.S. Department of Energy Vehicle Technologies Program, INL/ EXT-15-34184, Revision 3, Jun. 2015, 67 pages.

Delaille et al. Study of the 'coup de fouet' of lead-acid cells as a function of their state-of-charge and state-of-health. Journal of Power Sources, Aug. 2006,158(2):1019-1028.

Din et al. A Scalable Active Battery Management System With Embedded Real-Time Electrochemical Impedance Spectroscopy. IEEE Transactions on Power Electronics, Jul. 2017, 32(7):5688-5698.

Din et al. Online Spectroscopic Diagnostics Implemented in an Efficient Battery Management System. 16th Workshop on Control and Modeling for Power Electronics, 2015, 7 pages.

Doan et al. Intelligent Charger with Online Battery Diagnosis Function. 9th International Conference on Power Electronics—ECCE Asia, Jun. 2015, pp. 1644-1649.

Doughty et al. FreedomCAR Electrical Energy Storage System Abuse Test Manual for Electric and Hybrid Electric Vehicle Applications. SAND2005-3123, Aug. 2006, 46 pages.

Egloff et al. A Critical Analysis of an Instrumentation Current Sources. 59th International Instrumentation Symposium, May 2013, 12 pages.

Fasmin et al. Review—Nonlinear Electrochemical Impedance Spectroscopy. Journal of The Electrochemical Society, May 2017, 164(7):H443-H455.

Fenton et al. BSM Development Documentation Senior Project Final Report for the Idaho National Laboratory. May 2005, Montana Tech of the University of Montana, 21 pages.

Ford, Jr. Validation of Push Pull Current. Proceedings of the Annual Montana Tech Electrical and General Engineering Symposium, Jan. 2016, 25 pages.

Garcia et al. On-line State-of-Health and Remaining-Useful-Life Assessment of Batteries using Rapid Impedance Spectrum Measurements. 45th Power Sources Conference Proceedings, Jun. 2012, 7.3, pp. 115-118.

Haskins et al. Battery Technology Life Verification Test Manual. Idaho National Laboratory, Feb. 2005, INEEL/EXT-04-01986, 133 pages.

Hirschorn et al. On Selection of the Perturbation Amplitude Required to Avoid Nonlinear Effects in Impedance Measurements. Israel Journal of Chemistry, 2008, vol. 48, pp. 133-142.

Hoffmann et al. Development and Test of a Real Time Battery Impedance Estimation System. IEEE Aerospace 2006 Conference, Mar. 2006, IEEE 0-7803-9546-8/06, 8 pages.

Huet. A review of impedance measurements for determination of the state-of-charge or state-of-health of secondary batteries. Journal of Power Sources, Jan. 1998, 70(1):59-69.

\* cited by examiner

ENHANCED CHIRP EXCITATION SIGNAL FOR BROADBAND IMPEDANCE MEASUREMENT

This International Patent Cooperation Treaty Patent application claims the benefit of U.S. Provisional Patent Application No. 62/842,313, filed May 2, 2019, hereby incorporated by reference herein.

I. TECHNICAL FIELD

Devices and methods to perform AC impedance measurement of a device which use an excitation signal including a root mean squared current or a root mean squared voltage in a sequence of one or more frequency groups, wherein each of said frequency groups includes a summation of one or more frequencies within a frequency spread.

II. BACKGROUND

Electrochemical cells ("EC") transform stored chemical energy into electrical energy. Impedance measurement devices ("IMD") perform measurements that can reveal changes in the behavior of electrochemical processes in an electrochemical cell as a function of age and use which can provide insights into changes in the electrode surface and diffusion layer. The frequency range of interest of the impedance spectra of these energy storage devices generally spans a range of about 0.01 Hz to about 2 kHz. It can be difficult to obtain impedance spectrum having a steady state frequency response with very low frequencies of interest and meeting the requirement of a rapid measurement. This difficulty can be overcome by the use of an EC excitation test signal which comprises a sum of sines (SOS) with the frequencies of interest applied in parallel and restricted to harmonics that spanned the range of interest. The IMD assembles an excitation time record of an SOS current or voltage at the frequencies of interest, and implements the excitation time record to excite the EC with the SOS current or voltage (also referred to as the "excitation signal") and simultaneously captures a response time record comprising the voltage response to the current and frequencies (or a current response to the voltage and frequencies)(also referred as referred to as the "response signal") applied to the EC. A variety of impedance measurement algorithms can be used to transform the captured response time record into the frequency spectrum, including as examples, harmonic compensated synchronous detection ("HCSD"), fast summation transformation ("FST"), time cross talk compensation ("TCTC"), and harmonic orthogonal synchronous transformation ("HOST"). The excitation time record can have a duration of one period of the lowest frequency. The beginning of the excitation time record can further include a portion going backwards from time zero (also referred to as "a negative time period), which as an example can be ten percent (10%) of the period of the lowest frequency in excitation time record. The "negative time" can be discarded from the captured response time record prior to being processed into the impedance spectrum to effectively satisfy a steady state sinusoidal assumption for the resulting impedance spectrum.

However, there remains an unresolved and long-standing problem, for that reason that the response time record can include a rogue wave artifact (also referred to as a "crest factor") of approximately three times the root mean square ("RMS") of the SOS. This artifact impacts resolution of the impedance measurement, pursuant to Equation 1.

$$V_P = \sqrt{\frac{2}{N}} \frac{V_{FS}}{3}$$

There would be a very substantial advantage in an IMD that applied an excitation time record to excite and EC which reduced or eliminated the rogue wave artifact.

III. DISCLOSURE OF THE INVENTION

Accordingly, a broad object of embodiments of the invention can be to provide devices to perform AC impedance measurement which reduces or eliminates the rogue wave artifact with excitation time records which excite a test device using an excitation signal including a root mean squared current or a root mean squared voltage in a sequence of one or more frequency groups, wherein each of said frequency groups includes a summation of one or more frequencies within a frequency spread and recording a response time record of a response of said device to the excitation time record and wherein an initial time period of the response time record of each of the one or more frequency groups can be discarded prior to the response time record being processed with an impedance spectrum algorithm to determine impedance of the test device.

Another broad object of embodiments of the invention can be to provide a method of determining impedance of a test device including exciting the device using an excitation time record including one or more of a root mean squared current or a root mean squared voltage in a sequence of one or more frequency groups, wherein each of said frequency groups includes a summation of one or more frequencies within a frequency spread, recording a response time record of a response of said device to said excitation time record, discarding an initial time period of said response time record of each of said one or more frequency groups, processing said response time record using an impedance spectrum algorithm, and determining impedance of said device.

Naturally, further objects of the invention are disclosed throughout other areas of the specification, drawings, photographs, and claims.

IV. BRIEF DESCRIPTION OF THE DRAWINGS

V. MODE(S) FOR CARRYING OUT THE INVENTION

Figure 1:
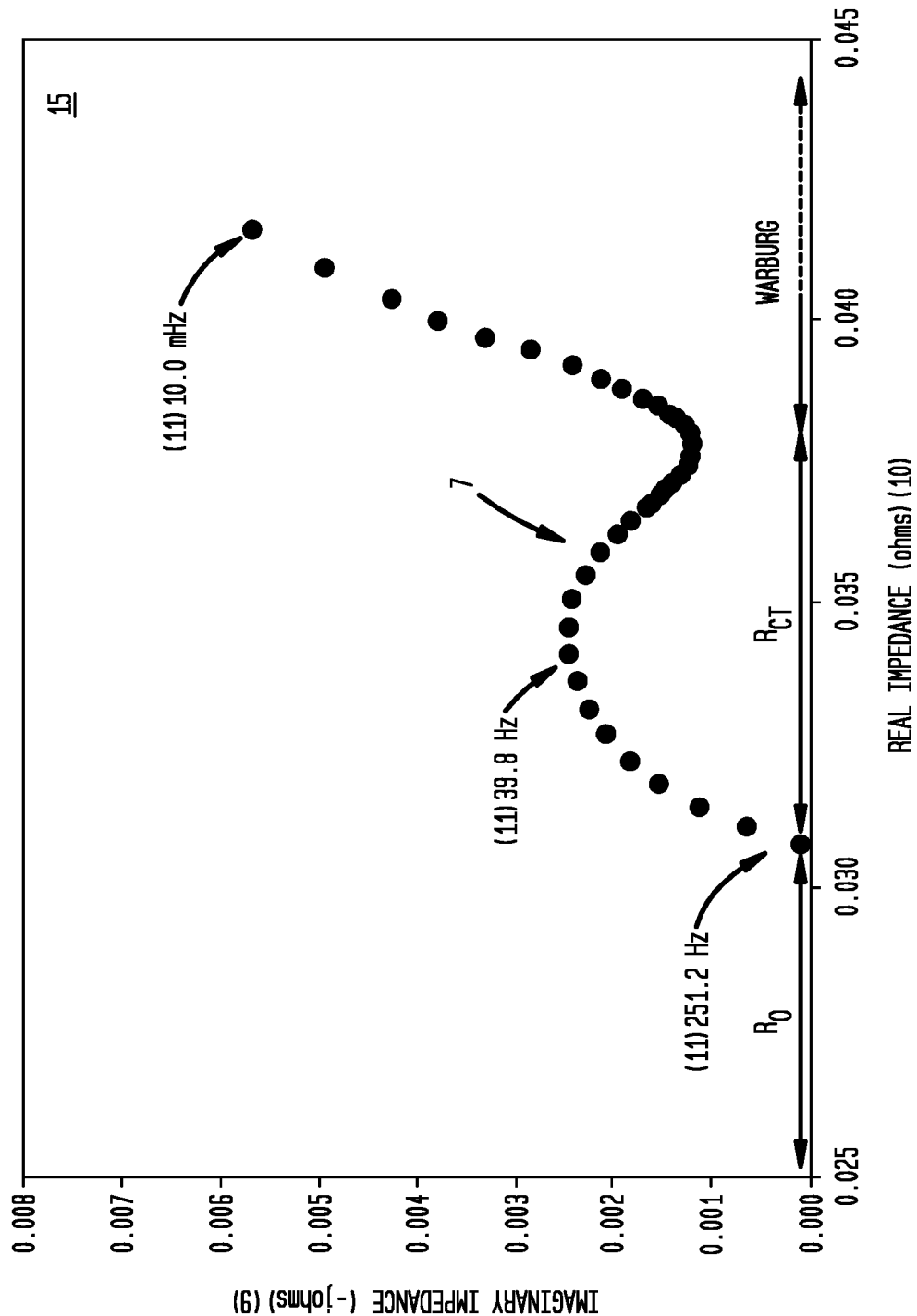
FIG. 1 illustrates a battery impedance plot of real impedance on the X axis versus negative imaginary impedance on the Y axis and illustrates ohmic resistance value (Ro) where the plot crosses the X axis, the charge transfer resistance (Rct) and the low-frequency tail referred to as the Warburg tail (Warburg).
Figure 53:
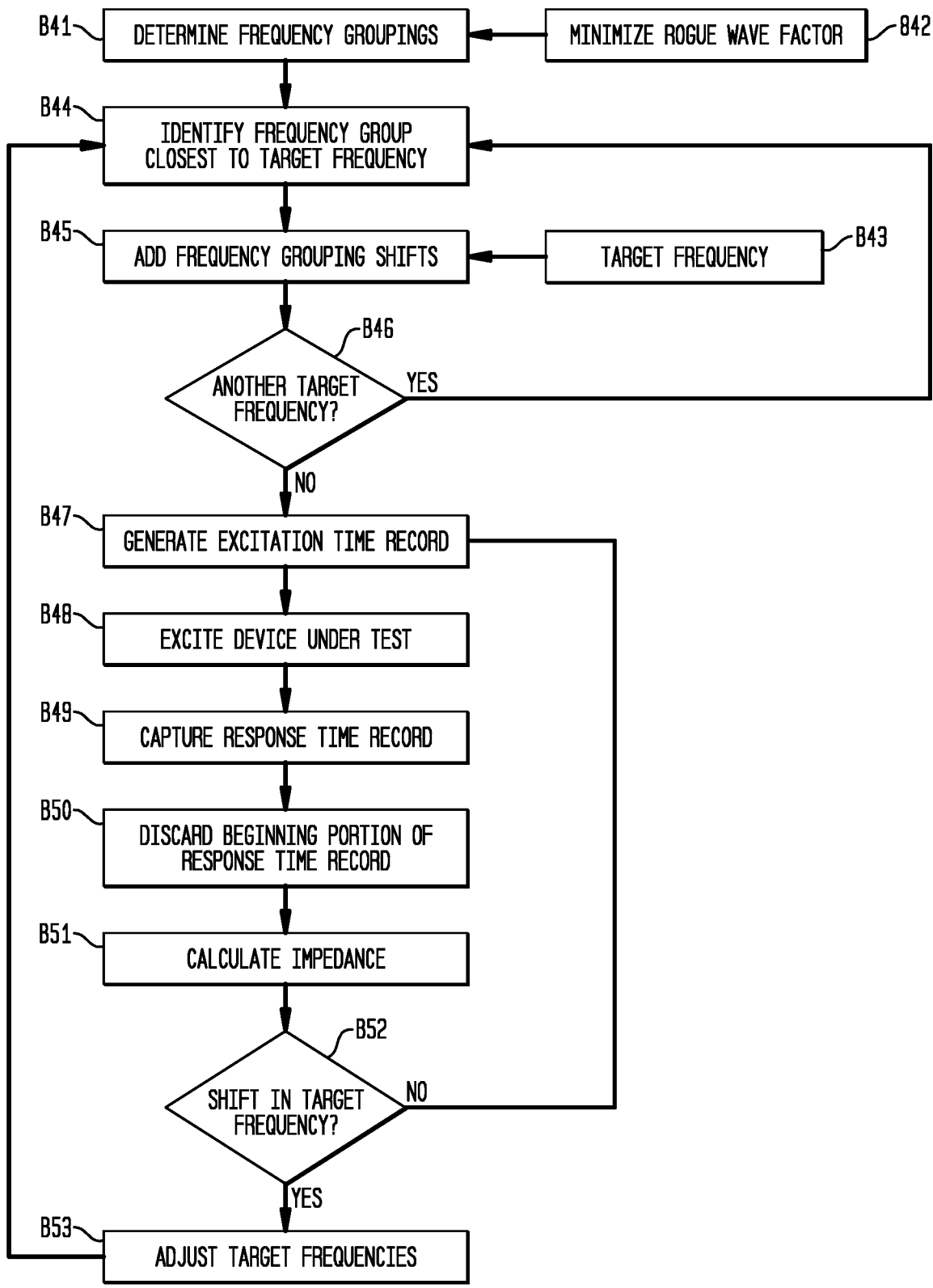
FIG. 53 is a block flow diagram of a method of performing embodiments impedance measurement of a device (3) with step group chirp including targeted frequencies.

Now, with general reference to FIGS. 1 through 53, which provide illustrative examples of IMD (1) and methods of using IMD (1) for performing impedance measurements (2) of a device (3). A device (3) can, as illustrative examples, include electrical circuits (4), electrochemical cells (5) (whether individual cells, modules, or packs), or electrical circuits (4) including an electrochemical cell (5), or components or combinations thereof. The electrical circuit (4) including an electrochemical cell (5) can, but need not necessarily, include a load (6) consuming electrical power from the electrochemical cell (5).

Elements, circuits, modules, and functions may be shown in block diagram form. Moreover, specific implementations shown and described are illustrative only and should not be construed as the only way to implement the present disclosure unless specified otherwise herein. Additionally, block definitions and partitioning of logic between various blocks is illustrative of a specific implementation. However, the present disclosure may be practiced by numerous other partitioning solutions. For the most part, details concerning timing considerations and the like have been omitted where such details are not necessary to obtain a complete understanding of the present disclosure by persons of ordinary skill in the relevant art.

Those of ordinary skill would appreciate that the various illustrative logical blocks, modules, circuits, and algorithm described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

When implemented with hardware, the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. When executing software for carrying out processes for embodiments described herein, a general-purpose processor should be considered a special-purpose processor configured for carrying out such processes. A processor may also be implemented as a combination of computing devices, such as, a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, or a step depending on the application. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

Electrochemical Impedance Spectroscopy. Electrical Impedance Spectroscopy (EIS) involves measuring a response signal to a stimulus signal. The stimulus signal can be either a current stimulus signal or a voltage stimulus signal with the response signal being the complement (for example, if the stimulus signal comprises a sum of sines ("SOS") root mean square ("RMS") current stimulus signal (SOS RMS current) then the response comprises a voltage response signal, if the stimulus signal comprises a voltage stimulus signal then the response signal comprises a current response signal). Data processing then calculates the complex impedance of the device at the stimulus signal frequency. This process is generally performed at each of a plurality of frequencies to create an array of the complex impedances. Conventional use of EIS produces impedance measurements, typically including a frequency range between about 100 kHz to about 10 mHz, and depending on impedance measurement parameters have duration in a range of about ten minutes to about an hour to perform.

iRIS. In-line rapid impedance spectroscopy ("iRIS") can generate impedance measurements in less time than conventional EIS IMD and depending on impedance measurement parameters, having a duration in a range of about 1 sec to about 80 sec. iRIS devices can as examples perform impedance measurements from about 1.6 kHz to about 12 mHz in about 80 sec, from about 1.6 kHz to about 0.1 Hz in about 10 sec, or from about 1.6 kHz to about 0.8 Hz in about 1.2 sec; although this is not intended to preclude certain embodiments including or using conventional EIS IMD. As illustrative examples, iRIS devices can measure electrochemical cells of 50V having impedances to about 3 mΩ with about 0.1 mΩ resolution. Measurable impedance can be lowered to about 1 mΩ with about 0.04 mΩ resolution, as the voltage threshold is reduced toward 10 V; however, these illustrative examples are not intended to preclude embodiments having measurable impedance or resolution outside of these ranges.

Impedance Plots. Now, with primary reference to FIG. 1, an impedance spectrum (7) is typically displayed graphically as a plot (8) similar to a standard Nyquist plot. Following convention among electrochemical researchers, these plots differ in that a negative imaginary impedance in ohms (9)(also referred to as "imaginary impedance") is plotted on the Y axis, and only positive impedance in ohms (10) (also referred to as "real impedance"), of each of a plurality of frequencies (11) used to excite the electrochemical cell (5), is plotted on the X axis. The ohmic resistance value (Ro) is the real impedance value where the plot crosses the X axis (in the example of FIG. 1, the ohmic resistance occurs at about 251.2 Hz). The mid-frequency semicircle is the charge transfer resistance (Rct) and the low-frequency tail is often referred to as the Warburg tail ("Warburg").

Figure 2:
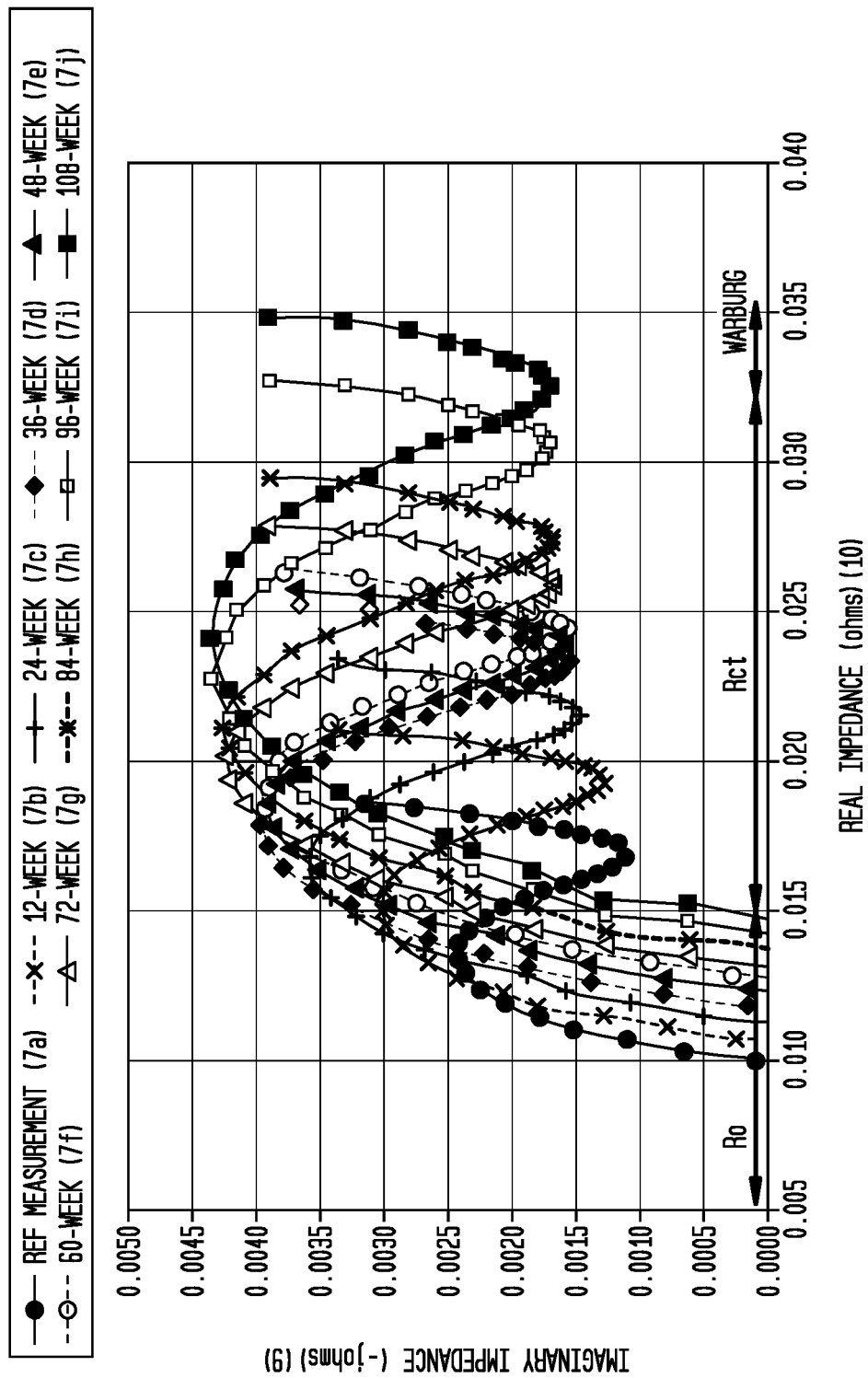
FIG. 2 illustrates a plurality of impedance spectrum as battery impedance plots $7a \ldots 7j$ showing change in impedance of a battery over time.

Now with primary reference to FIG. 2, which displays a plurality of impedance spectrum (7) as battery impedance plots (7a . . . 0.7j) showing change in impedance of an electrochemical cell (5) over time. Plot (7a) illustrates a baseline impedance measurement (2) of the electrochemical cell (5). Plots (7b . . . 7d) illustrate impedance measurements (2) of the battery (5) upon elapse of 12, 24, and 36 weeks, respectively. Plots (7e . . . 7g) illustrate impedance measurements of the battery (5) upon elapse of 48, 60, and 72 weeks, respectively. Plots (7h . . . 7j) illustrate impedance measurements (2) of the electrochemical cell (5) upon elapse of 84, 96, and 108 weeks, respectively. The semicircles within the plots, corresponding to Rct or the Ro, or combinations thereof, can increase as the cell ages and can thus be used to effectively estimate the battery state of health by analyzing movement of the Rct within the plots (7b . . . 7j) over time.

Figure 3A:
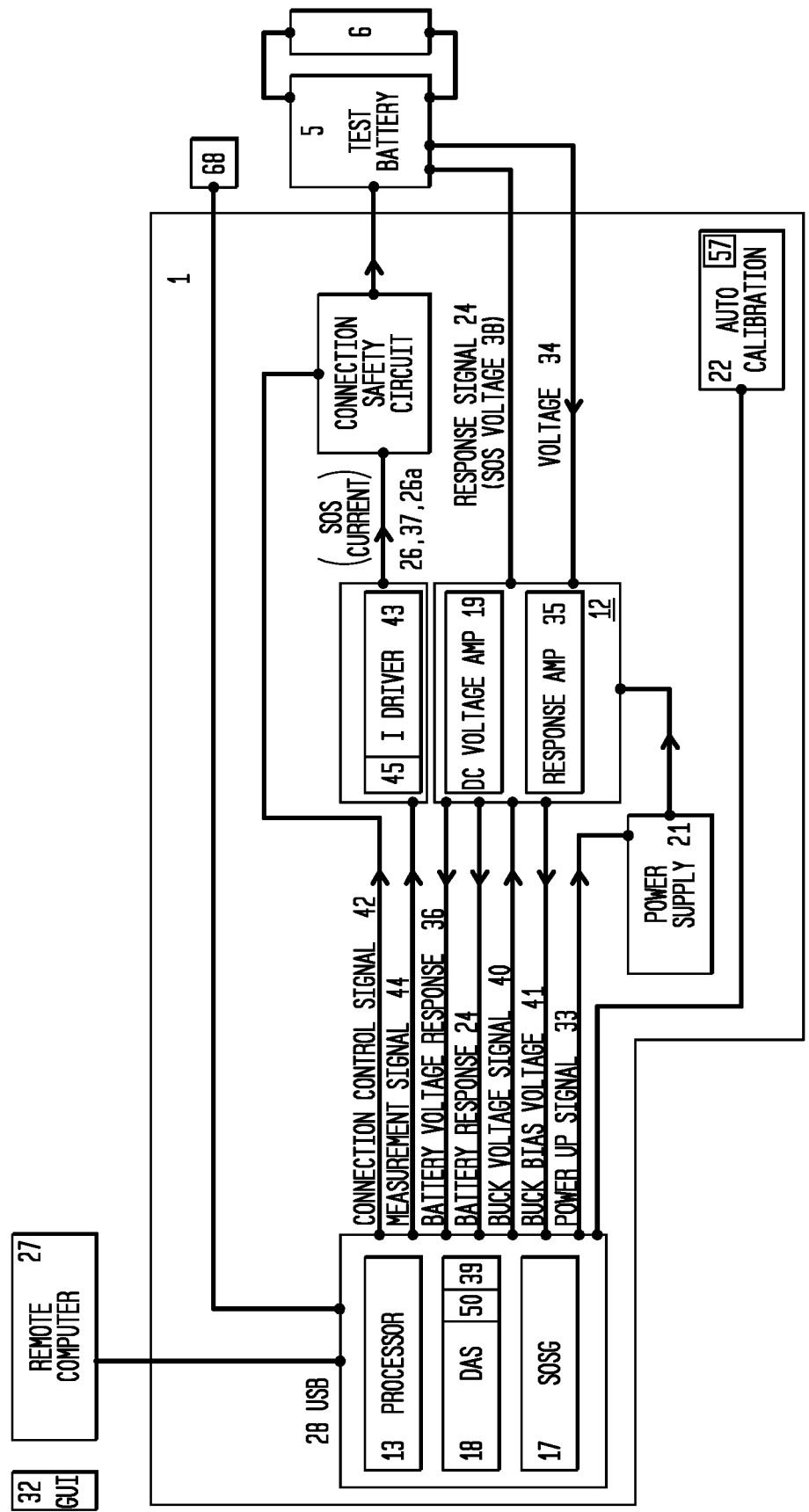
FIG. 3A depicts circuits of an illustrative impedance measurement device and battery management system disposed in a vehicle or other device.
Figure 3B:
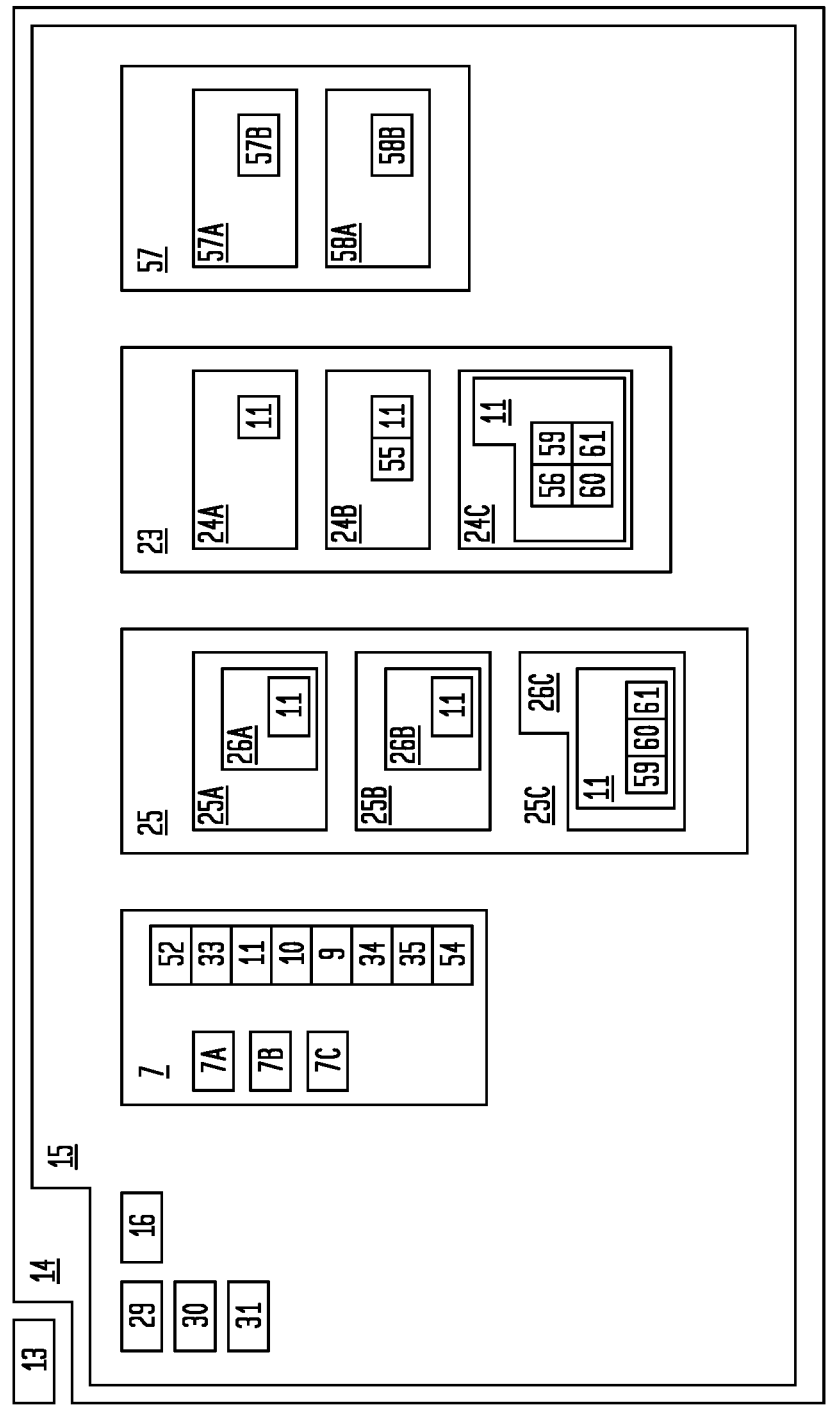
FIG. 3B is an enlargement of the processor and memory depicted in FIG. 3A.

Impedance Measurement Device. Now, with general reference to FIGS. 3A and 3B which depict block diagrams of an illustrative IMD (1), which can, but need not necessarily, be an iRIS device, including a processor (13) in communication with a non-transitory computer readable medium (14) containing a program code (15) which implements one or more impedance spectrum algorithms (16), a sum of sines generator ("SOSG")(17); a data acquisition system ("DAS") (18); one or more amplifiers (12), a connection safety circuit (20) and a power supply (21). Auto calibration (22) may be included in some embodiments under control of the processor (13); although in certain embodiments, calibration can be performed as described in U.S. Pat. No. 10,436,873, hereby incorporated by reference herein. An illustrative impedance measurement device (1) suitable for use in particular embodiments can be made and used as described in U.S. Pat. No. 10,379,168, hereby incorporate by reference herein.

Examples of impedance spectrum algorithms (16) useful to process a response time records (23) of a response signal (24) to determine impedance measurements (2) as a function of the plurality of frequencies (11) assembled in the excitation time record (25) to generate the excitation signal (26) to excite the device (3) under test include, but are not limited to, harmonic compensated synchronous detection (HCSD), fast summation transformation (FST), generalized fast summation transformation (GFST), frequency cross talk compensation (FCTC), time cross talk compensation (TCTC), harmonic orthogonal synchronous transformation (HOST), and combinations thereof. See, for example, U.S. Pat. Nos. 7,688,036; 7,395,163 B1; 7,675,293 B2; 8,150,643 B1; 8,352,204 B2; 8,762,109 B2; 8,868,363 B2; and 9,244,130 B2, and United States Patent Publications Nos. 2011/0270559 A1; 2014/0358462 A1; and 2017/0003354 A1 which describe the implementation of one more of the impedance spectrum algorithms (16).

The IMD (1) can, but need not necessarily, include a remote computer (27)(or the computer may be local or integral to the IMD (1)) via a Universal Serial Bus (USB) interface (28) or other suitable interface, such as, for example, hardwire serial interfaces, hardwire parallel interfaces, and wireless interfaces (as examples, WI-FI®, ZIG-BEE®, BLUETOOTH®. In particular embodiments, the remote computer (27) can include all or part of the components necessary to control the IMD (1) to perform impedance measurements (2) of the device (3) under test.

The processor (13) (whether integral to the IMD (1) or included in the remote computer (27)) can synchronize and control the DAS (18), the SOSG (17) and the preamplifier (10) in accordance with control impedance measurement parameters (29) and generate impedance measurement commands (30) to operate the IMD(1) dictated by the program code (16). In particular embodiments, the processor (13) can interface with the remote computer (27) to download desired impedance measurement parameters (29) and impedance measurement commands (30) and upload various impedance measurement data (31). As non-limiting examples, the processor (13) or memory (14) can to hold the excitation time record (25) and the response time record (24) until processed using the desired impedance spectrum algorithm (16).

The processor (13) may be configured to accept downloaded impedance measurement commands (29) and impedance measurement parameters (30) and upload to the remote computer (27) archived impedance measurement data (31) under direction of the remote computer (27). Additionally, the IMD (1) may be able to be controlled via human interaction in a user interface ("GUI") (32) on the remote computer (27) or the IMD (1) for the purpose of inputting impedance measurement parameters (29) and impedance measurement commands (30) to the IMD (1).

When an impedance measurement (2) is triggered, the DAS (18) can send out a power up signal (33) to a power supply (21) to power up a DC voltage amplifier (19) and a connection safety circuit (20). In the illustrative example, the device (3) under test is an electrochemical cell (5) (a "battery") and the DC battery voltage (34) may be measured by a battery response amplifier (35) and input to the DAS (18) as the battery voltage analog signal (36) of the DC battery voltage (34). The DAS (18) or the processor (13) may digitize the battery voltage analog signal (36) of the DC battery voltage (36) and may send the digitized result to the remote computer (27).

When the excitation signal (26), and in this particular embodiment the SOS current (37), stimulates the battery (5) under test, the response signal (24), and in this embodiment the SOS voltage response (38) at its terminals includes the DC battery voltage (34) plus a SOS voltage response (24) of the SOS current (37) acting on the internal impedance of the battery (5). It is this SOS voltage response (38) that, when captured and processed, yields the impedance spectrum (7) of the response signal (24). To accurately detect the SOS voltage response (38), the DC battery voltage (34) can be subtracted out prior to measuring the SOS voltage response (38) allowing an analog to digital convertor (39) to focus on the response signal (24) which can substantially improve accuracy. This subtraction of the DC battery voltage (34) may be accomplished by measuring the DC battery voltage (34) prior to the application of the stimulus signal (26) (for example an SOS current (37)) to the battery (5) under test and then feeding back a computer generated buck voltage signal (40) to generate a buck bias voltage (41) by the battery response amplifier (35) from the total of the DC battery voltage (34) and the SOS voltage response (38) to yield only the corresponding response signal (24) (for example an SOS voltage (38)).

The remote computer (27) or the processor (13) can send a connection signal (42) to the connection safety circuit (20) to connect the battery (5) to current drivers (43) in the DC voltage amplifier (19). With the DC voltage amplifier (19) connected to the battery (5), the remote computer (27) or processor (13) sends a battery impedance measurement signal (44) to the DC voltage amplifier (19).

The impedance measurement signal (44) may be smoothed out using a smoothing filter (45), then fed into a current driver (43), which converts the signal into the excitation signal (26), such as an SOS current (37). The battery response amplifier (35) detects the DC battery voltage (34) and subtracts the buck bias voltage (41) to become the battery response signal (24) that may be digitized by the DAS (18). The captured impedance measurement time record (23) may be processed using one or more of the spectrum algorithms (16) to generate the impedance spectrum (7) which can be converted to impedance plots (8).

As an illustrative example, the IMD (1) can process a battery impedance spectrum (7) with at least fifteen frequencies of resolution for FST and eleven frequencies for GFST (based upon triads) or HCSD, when the start frequency is 0.1 Hz. In addition, the IMD (1) can support a dither feature (46) of high spectrum resolution with dither steps anywhere between 1 and 2 for FST based upon octaves and anywhere between 1 and 3 for GFST based upon triads. For suitable results, the captured response time record (23) may be as low as one period of the lowest frequency and the IMD (1) may be able to process a response time record (23) with a start frequency (47) of as low as about 10 mHz or a stop frequency (48) as high as about 10 kHz; however, these illustrative examples are not intended to obviate embodiments which can have a lower start frequency or a higher stop frequency.

The SOSG (17) can, under control of the processor (13) or remote computer (27), generate a zero-order hold synthesis of the SOS as an input to the DC voltage amplifier (19). As a non-limiting example, a sample rate (49) for the analog to digital convertor (43) may be configured at least one-hundred times the highest excitation signal frequency (11) and compatible with the smoothing filter (45) within the DC voltage amplifier (19).

In one embodiment, the SOSG (17) under control of the processor (13) can synthesize a sample clock (50) to be used by the DAS (18). FST requires a sampling frequency that is octave harmonic with the highest frequency of the SOS excitation signal (24) and is at least 4 times higher. GFST based on triads requires a sampling frequency that is triad harmonic with the highest frequency of the SOS excitation signal (24) and is at least 9 times higher. The SOSG (17) can include a programmable signal level for the DAC output to the smoothing filter (45), which enables the processor (13) to control the level of the SOS RMS current (37) to the battery (5) under test.

The DAS (18) may be configured with 16 bits of resolution and accept an external sample clock (50) from the SOSG (17). The DAS (18) may accept an enable signal from the processor (13) to start acquiring data concurrent with the application of the excitation signal (26), such as the SOS current signal (37) to the battery (5) under test. The DAS (18) can accept the analog battery voltage signal (36) that has been conditioned by the DC voltage amplifier (19) for digitizing. The DAS (18) may include a buffer memory to hold a sample of the digitized battery voltage signal (36) for uploading to memory (14). Each of the acquired samples (51) may become part of the response time record (23) that is input into the spectrum algorithms (16).

The impedance spectrum (7) generated during an impedance measurement (2) of a battery (5) can be passed to the processor (13) or the remote computer (27) in any suitable format (as an illustrative example: Comma Separated Values (CSV) format). Each individual impedance spectrum (7) may further include one or more of: a time stamp (52), an information header (53), the stimulus signal frequencies (11), the real impedance (10), the imaginary impedance (9) and the DC battery voltage (34) for the impedance spectrum (7), SOS RMS current (37); the magnitude and phase calibration constants (54).

In-line Rapid Impedance Spectroscopy)(iRIS®). Again, with primary reference to FIG. 3, particular embodiments of the IMD (1) or iRIS device can measure the impedance spectrum (7) of a device (3), electrical circuit (4), electrochemical cell (5), or other device, or component, under test in one second or less. An iRIS device (1) can be configured to measure all of the component stimulus signal frequencies (11) of an excitation signal (26), such as an SOS current (37), in parallel within one period of the lowest frequency (11). In one embodiment, the iRIS device (1) can process a battery impedance spectrum (7) with at least 15 frequencies (11) of resolution for FST and 11 frequencies (11) for GFST (based upon triads) when the start frequency (47) comprises about 0.1 Hz. In addition, the iRIS device (1) may be able to support a dither feature (46) of high spectrum resolution with dither steps occurring in a range of 1 and 2 for FST based upon octaves and occurring in a range of 1 and 3 for GFST based upon triads. The response time record (25) can, but need not necessarily, comprise one period of the lowest frequency (11) and the 1 MB (1) (iRIS device) can, but need not necessarily, process a response signal (24), such as an SOS voltage response (38) with a start frequency (47) of as low as about 10 mHz or a stop frequency (48) as high as about 10 kHz, as above described.

Chirp. Now with primary reference to FIGS. 4 through 7, in particular embodiments, an excitation time record (25) can be assembled to excite the device (3) under test with an excitation signal (26) including a single sine wave having its frequency continuously modulated as a ramp starting at a low frequency and ending with a high frequency (referred to as "a chirp (26A)"). Thus, the IMD (1) employing excitation time record (25) which generates a chirp (26A) cannot achieve a steady state sinusoidal in the excitation signal (26) or the response signal (24). When the excitation time record (25) implements a chirp (26A) with a log frequency spread, the ratio of the FFT of the chirp excitation signal (26A) to the FFT of the chirp response signal (26A) does approach a steady state system. This approach in the form of a log base 2 chirp (26A) was evaluated via simulations and a reduction to practice operable to generate measured data. An example of a log base 2 chirp can be performed by an IMD (1) which assembles a chirp excitation time record (25A) generating a sample frequency of 40 kHz and a frequency spread starting at 2 kHz and decreasing by octaves for a total of 15 frequencies (11). The duration of the chirp (26A) being about ten seconds with the number of data points collected of about 400,000. The expression for the discrete relationship of the log base 2 chirp is given by Equation 2, where $V_P$ is the peak of the chirp signal, $f_{START}$ is the start frequency, a is a scale factor for the desired sweep, and $\Delta t$ is the time step.

$$Ch(i)=V_p \sin(2\pi f_{start} 2^{\alpha(i-1)\Delta t}(i-1)\Delta t)$$

Given log base 2 for M=15 frequencies ending at 2 kHz ($f_e$nd) and decreasing to the start frequency is given by:

$$f_{start} = f_{end}\left(\frac{1}{2}\right)^{(M-1)}$$

Figure 4:
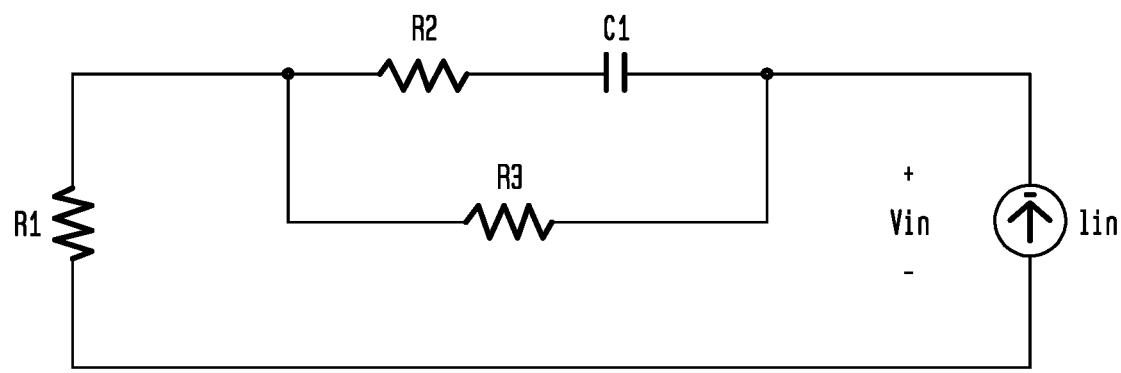
FIG. 4 is an electrical schematic diagram of a model test electrical circuit and corresponding test device.

Now, with primary reference to FIG. 4, which depicts a schematic diagram of the model test circuit (4) used in evaluation of the log base 2 chirp. The model test circuit (4) having an impedance substantially equivalent to the internal impedance of a lithium ion battery. As an example, the recursive model for the test circuit was realized with the following parameters:

$R1, R2, R_3 = 15$ mOhms; and $C1=9F$.

Figure 5:
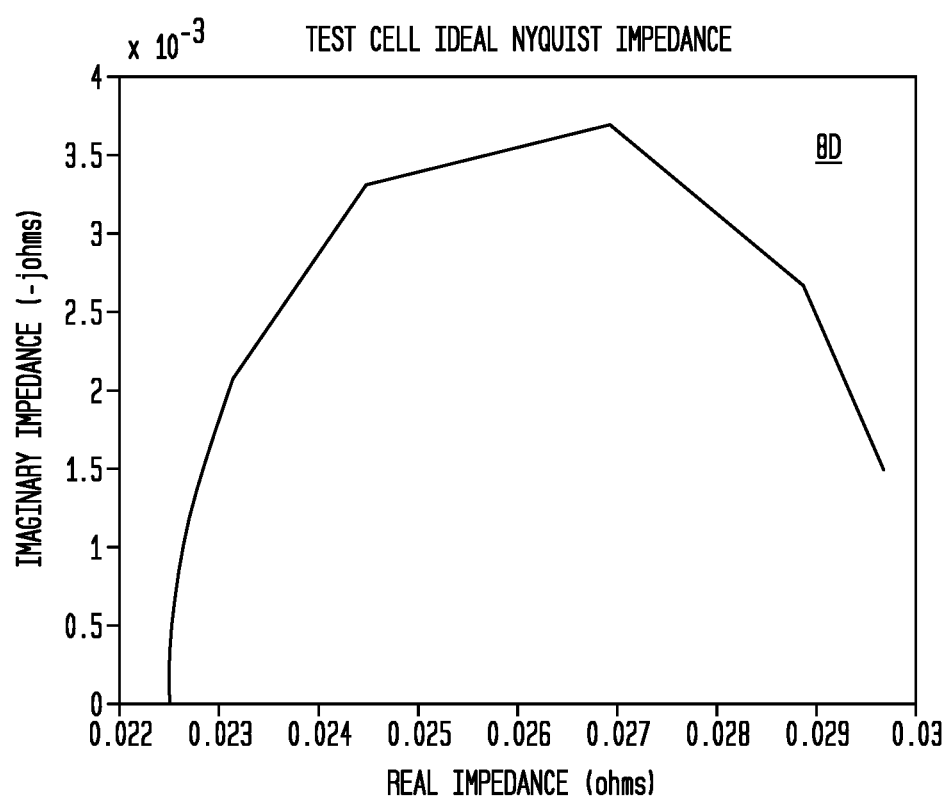
FIG. 5 depicts an ideal jw Nyquist impedance plot of the model test circuit or test device shown in FIG. 4.

Now with primary reference to FIG. 5, which depicts an ideal jw Nyquist plot (8D) of model test circuit (4) based on the example parameter values. The spectrum is plotted over a frequency range having a high frequency of 2 kHz stepping down by 15 octaves.

Figure 6:
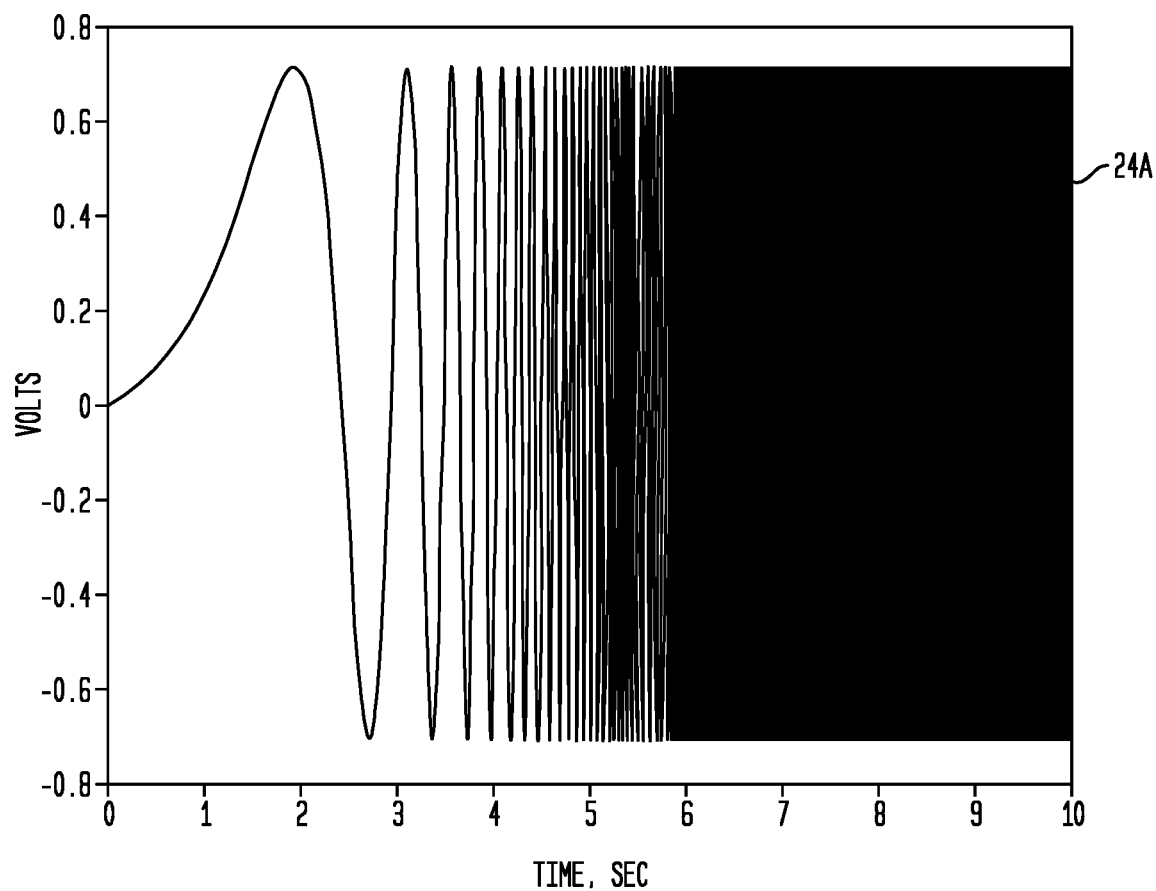
FIG. 6 depicts an embodiment of a simulated chirp response time record of a chirp excitation signal used to excite the model test circuit.

Now, with primary reference to FIG. 6, the IMD (1) assembled an excitation time record (25) using the chirp excitation time record (25A) including a chirp excitation signal (26A) expressed by Equation 2 with an RMS current set at 500 mA which yields: $V_p=0.707$. The IMD (1) excited the model test circuit (4) using the chirp excitation signal (26A) and captured a chirp response signal (24A). FIG. 6 depicts a plot of the chirp response time record (23A) of the input chirp excitation signal (26A). The ratio of the FFT of the response time record (23A) to the FFT of the input chirp excitation time record (25A) comprises the impedance spectrum. Given that the chirp response signal (24A) comprises about 10 seconds, the FFT frequency resolution is about 0.1 Hz. Additionally, with the sample frequency established at about 40 kHz the Nyquist frequency comprises about 20 kHz with the impedance spectrum of the model test circuit (4) below about 50 Hz.

Figure 7:
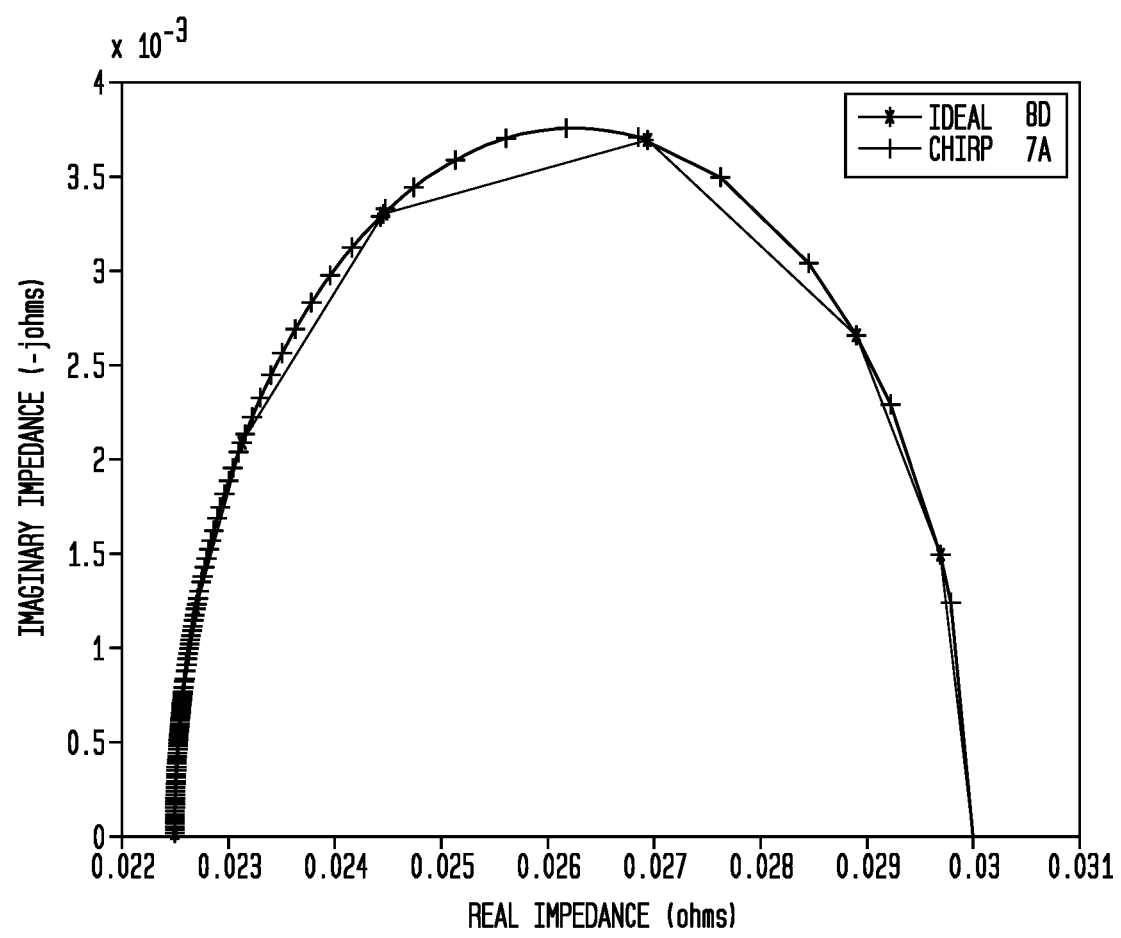
FIG. 7 depicts a simulated chirp impedance spectrum obtained from the chirp response signal shown in FIG. 6 as chirp impedance spectrum plot superimposed with the jw ideal spectrum plot shown in FIG. 5.

Now, with primary reference to FIG. 7, the chirp impedance spectrum (7A) obtained from the chirp excitation signal (26A) can be superimposed with the jw ideal spectrum plot (8D) shown in FIG. 5 which evidences substantial agreement between the plots. However, the use of a chirp excitation signal (26A) for impedance measurements in systems having low signal to noise ratio (S/N) may not generate or may generate data which may not have sufficient precision, reproducibility, or reliability in certain applications.

Step Chirp. Now with general reference to FIGS. 8 through 11, in particular embodiments, the excitation time record (25) can be assembled as a step chirp excitation time record (25B) to generate a step chirp excitation signal (26B)(also referred to as a "step chirp"). A step chirp (26B) comprises a step of at least one full period of a frequency which one full period lapses before the next frequency starts and the frequencies go from low frequency, stepping to high frequency as octave harmonics. An TCTC algorithm can, but need not necessarily, be used to process the step chirp response time record (23B) based on "least squares" which mitigates noise via averaging. In the illustrative examples of step chirp (26B), the same recursive model test circuit (4) shown in FIG. 4 with the same sample rate and frequency range. However, the signal VP was set at 1A which yields:

$$V_{RMS} = \frac{1}{\sqrt{2}}$$

Figure 8:
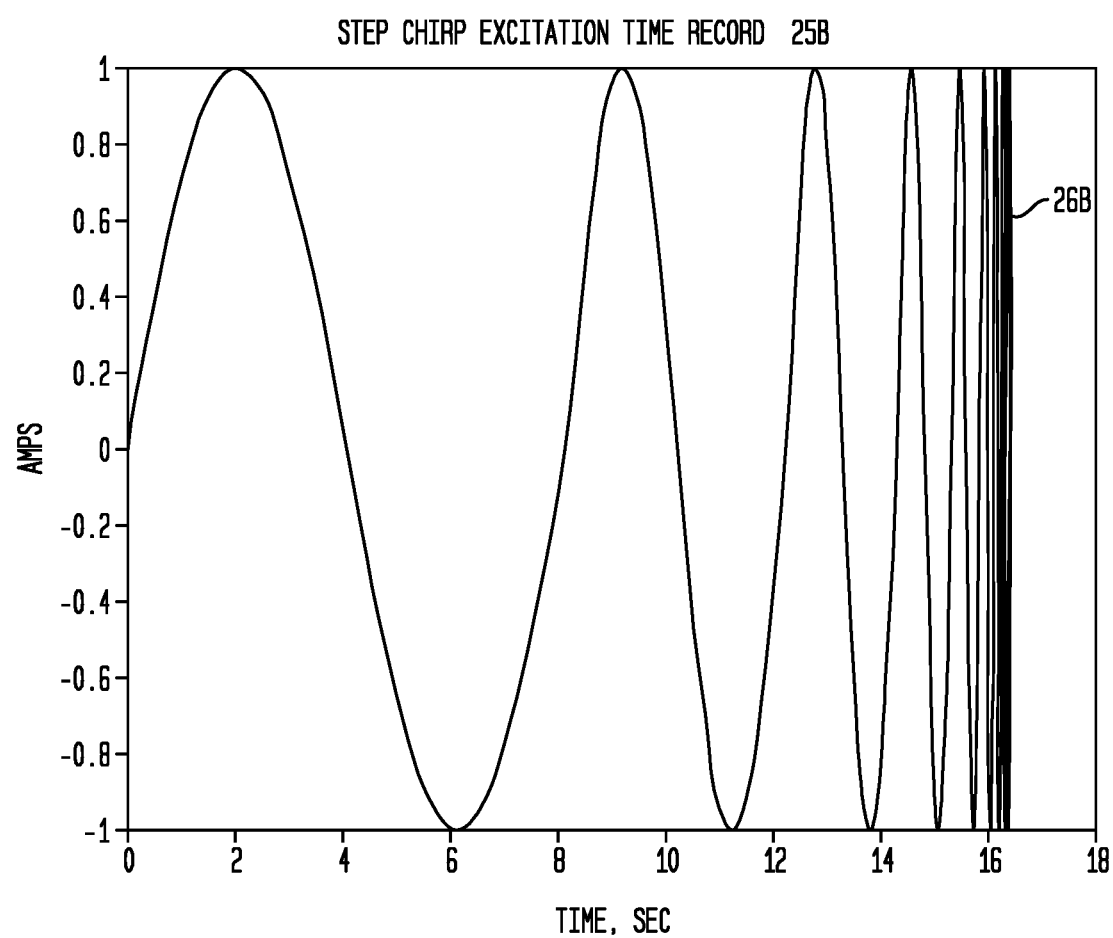
FIG. 8 depicts an embodiment of a simulated step chirp excitation record including a step chirp excitation signal having one period of each frequency.

Now with primary reference to FIG. 8, which depicts a step chirp excitation time record (25B), the step chirp excitation signal (26B) has a longer duration than the duration of the chirp excitation signal (26A) depicted in FIG. 6 (16.5 sec vs 10 sec). In a first baseline simulation each period was processed with TCTC based upon a single known frequency with the assumption that steady state sinusoidal is valid.

Figure 9:
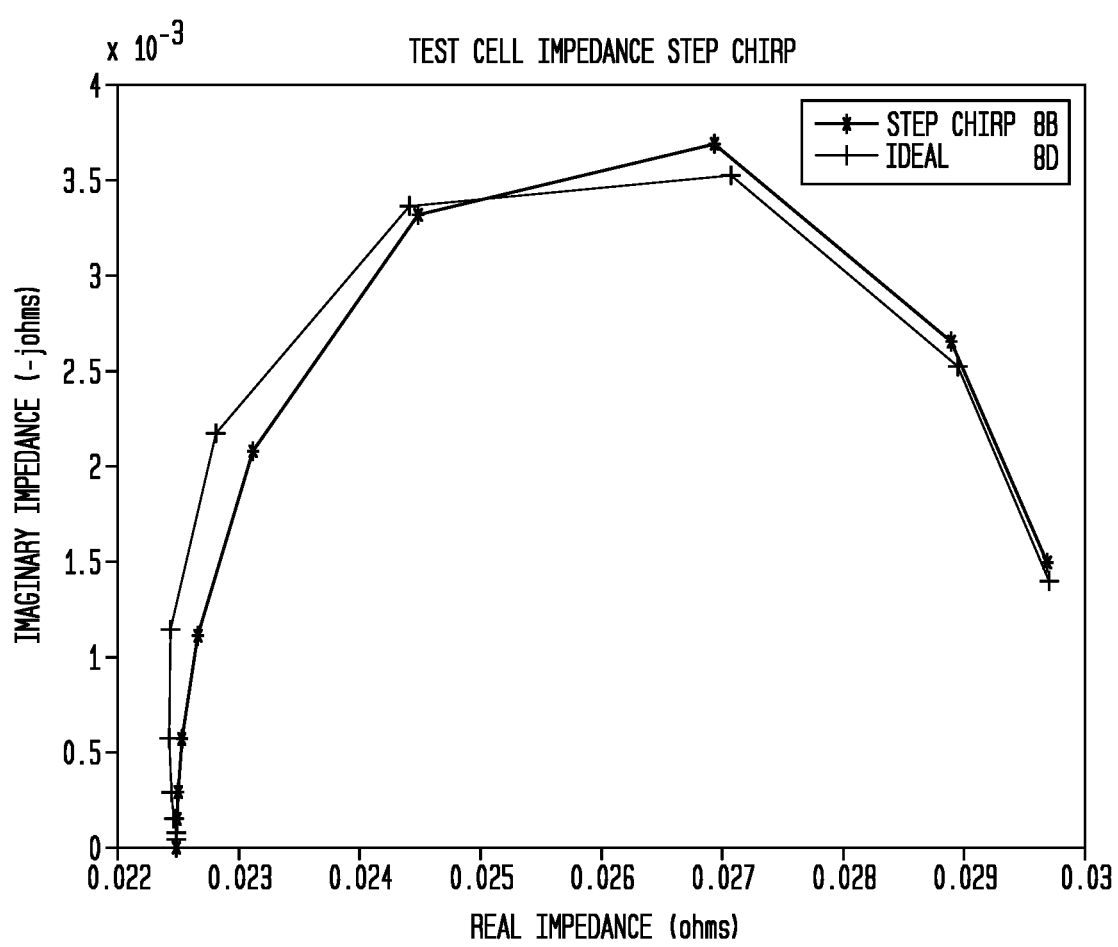
FIG. 9 depicts a simulated step chirp impedance spectrum plot of the embodiment of FIG. 8 superimposed with the ideal jw impedance spectrum depicted in FIG. 5.

Now with primary reference to FIG. 9, which depicts the resultant step chirp impedance spectrum plot (8B) of the first baseline simulation superimposed with the ideal jw impedance spectrum (8D) depicted in FIG. 5. The superimposed plots evidence that the assumption of steady state may not be valid.

Figure 10:
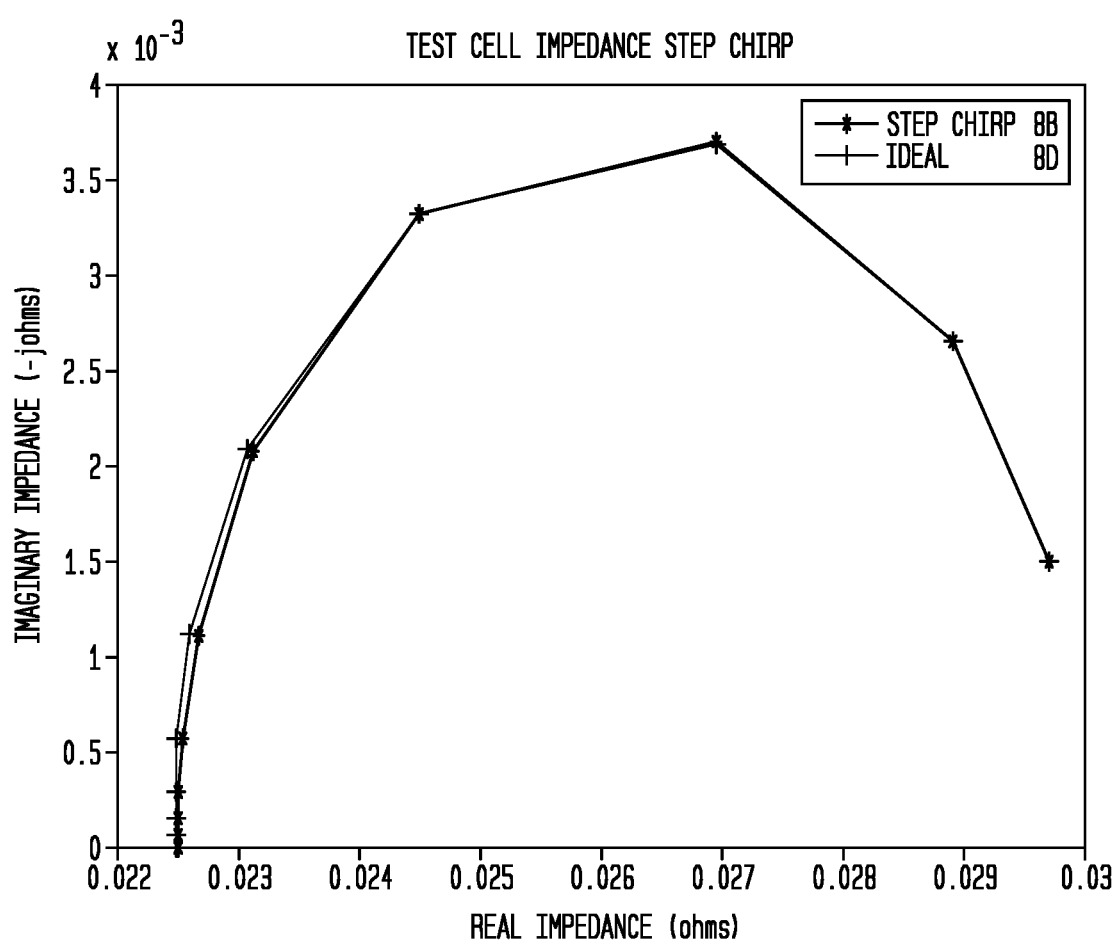
FIG. 10 depicts a simulated step chirp impedance spectrum plot superimposed with the ideal jw impedance spectrum depicted in FIG. 5 resulting from an embodiment of a step chirp excitation record including a step chirp excitation signal having two periods in each frequency and discarding the first period of each frequency.

Now, with primary reference to FIG. 10, in a second baseline simulation, step chirp (26B) included two periods of each frequency (11) and process by TCTC included only the second of the two periods. The step chirp impedance spectrum plot (8B) superimposed with the ideal jw impedance spectrum (8D) depicted in FIG. 5 evidences close agreement, therefore, the steady state assumption remains valid with disagreement only at higher frequencies. However, the disadvantage of using two periods of each frequency is a doubling of the duration of the step chirp response time record (23B).

In particular embodiments, the IMD (1) assembles an excitation time record (25) including an SOS excitation signal (26) having frequencies (11) which are octave harmonic over the frequency range with an excitation signal duration for analysis of one period of the lowest frequency. To enable the assumption of steady state a fraction of the response time record (23) at the beginning of the SOS excitation signal 26, includes a negative time portion (55), usually 10% of the signal duration. This "negative time" portion (55) which is not processed enables the steady state assumption. The data processing can be accomplished by HCSD. However, HCSD requires an integer number of one or more full periods of the time record for successful data processing. The impedance spectrum algorithm (16) used with stepped chirp (26B) can also be TCTC, which enables processing of less than a full period of each frequency.

Figure 11:
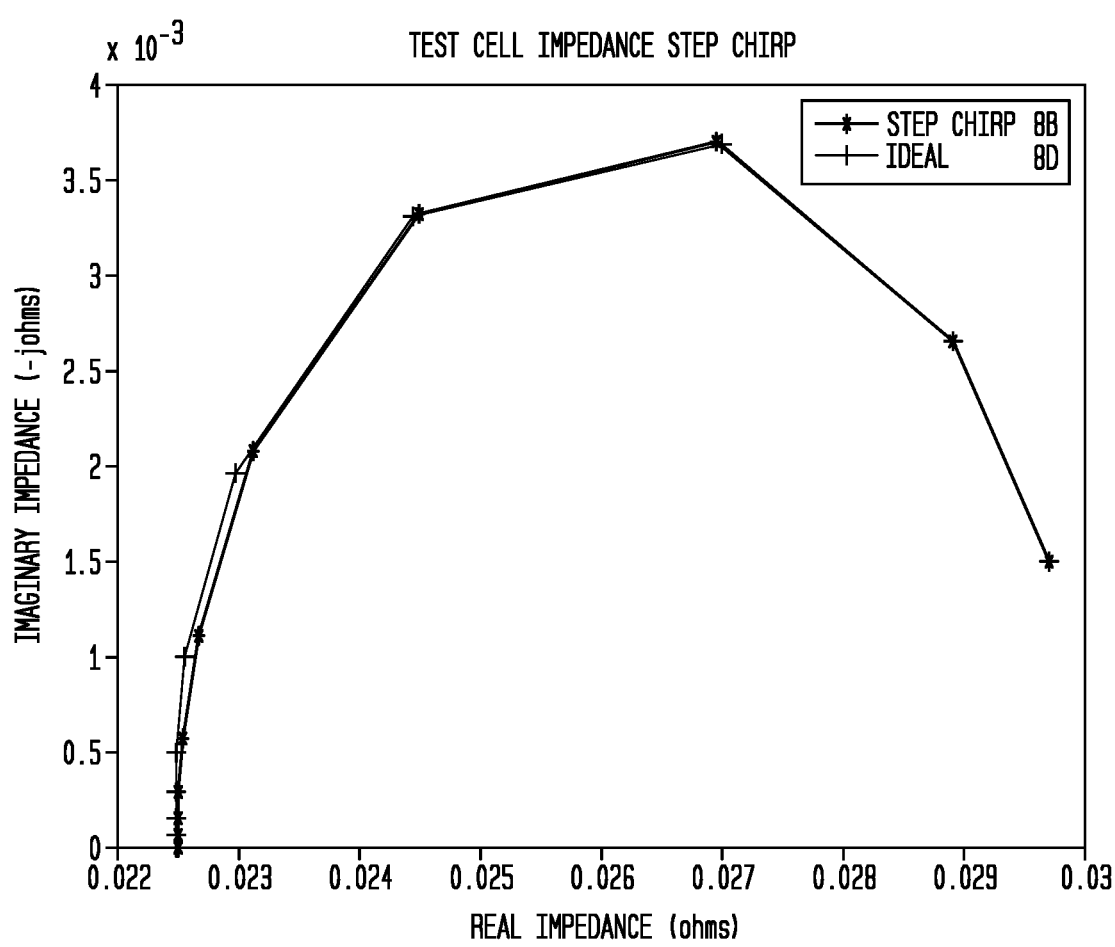
FIG. 11 depicts a simulated step chirp impedance spectrum plot superimposed with the plot of the ideal impedance jw spectrum plot depicted in FIG. 5 resulting from an embodiment of a step chirp excitation record including a step chirp excitation signal having one period in each frequency and discarding the initial portion of each frequency for analysis by TCTC.

Thus, with primary reference to FIG. 11, in particular embodiments of step chirp (26B), the step chirp excitation time record (25B) includes a single period of each frequency (11) but processing of the step chirp response time record (23B) includes only a part of each period of each frequency (11), wherein the initial portion (56) of the period of each frequency (11) can be discarded and processing includes only end portion of each period of each frequency (11). The discarded initial portion (56) of each period of each frequency establishes the steady state assumption. In the illustrative example of FIG. 11, the embodiment of stepped chirp (26A) includes only one period of each frequency (11) and initial portion (56) comprising about 30% of the period of each frequency (11) can be discarded to establish the steady state assumption. The resultant step chirp impedance spectrum plot superimposed with the plot of the ideal impedance jw spectrum plot (8D) depicted in FIG. 5 evidences that the result is substantially identical for embodiments which utilize two periods of each frequency and discard the first of the two periods, as above described and depicted in FIG. 10. Embodiments of step chirp (26B) which discard the initial portion (56) of the period of each frequency and processed using TCTC accommodate the assumption of steady state. However, this illustrative example is not intended to preclude embodiments of step chirp (26B) in which the discarded initial portion (56) of each period of each frequency (11) is lesser or greater than 30% and depending the application, the discarded initial portion (56) of each period of each frequency occur incrementally in range of about 5% to about 80%.

Examples of Impedance Measurements Using Chirp and Step Chirp

Illustrative examples of impedance measurements (2) using chirp (26A) and step chirp (26B) were performed using an IMD (1) as above described. For both chirp (26A) and step chirp (26B) the RMS of the excitation current was about 500 mA, otherwise all the parameters of the excitation signals (26) were established substantially as above described. A physical test device (3) was substantially the same or equivalent to the model test circuit (4) above described and depicted in FIG. 4. The reference EIS spectrum (8E) for the test device (3) used for all of the illustrative impedance measurements was obtained using a Solartron Potentiostat Galvanostat instrument. The nominal parameters for the test device (3) were: R1=15 mOhm, R2=15 mOhm, R3=15 mOhm, C1=9F. The impedance measurements (2) were calibrated in order to account for gains and frequency response of the IMD (1) by performing measurements with a shunt (57) of known value with the identical measurement conditions as performed with the test device (3). The shunt response time record (58) from the shunt (57) was normalized to the shunt value. The response time records (23) for the test device (3) and the shunt (57) were normalized and transformed to the frequency domain and the ratio recorded as measured impedance (2) of the test device (3).

Examples of Impedance Measurements Using Chirp

Illustrative measurements using chirp (26A) included a chirp excitation time record (25A) which generated an RMS excitation current of about 500 mA RMS having 15 frequencies starting at 2 kHz and decreasing in octaves for a 10 second duration. The frequency range within the chirp was about 0.1 Hz to about 2000 Hz, well within the Nyquist frequency of 20 kHz. Two measurements were taken, the first with the shunt (57) and the second with the physical test device (3). The 1 MB (1) captured the time records as .csv files. Both .csv files were post processed with a software tool. The shunt (57) chirp response time record (58A) was normalized to the shunt value and processed to the frequency domain with FFT. The test device (3) chirp response time record (23A) was also processed with FFT.

Chirp Example I

Figure 12:
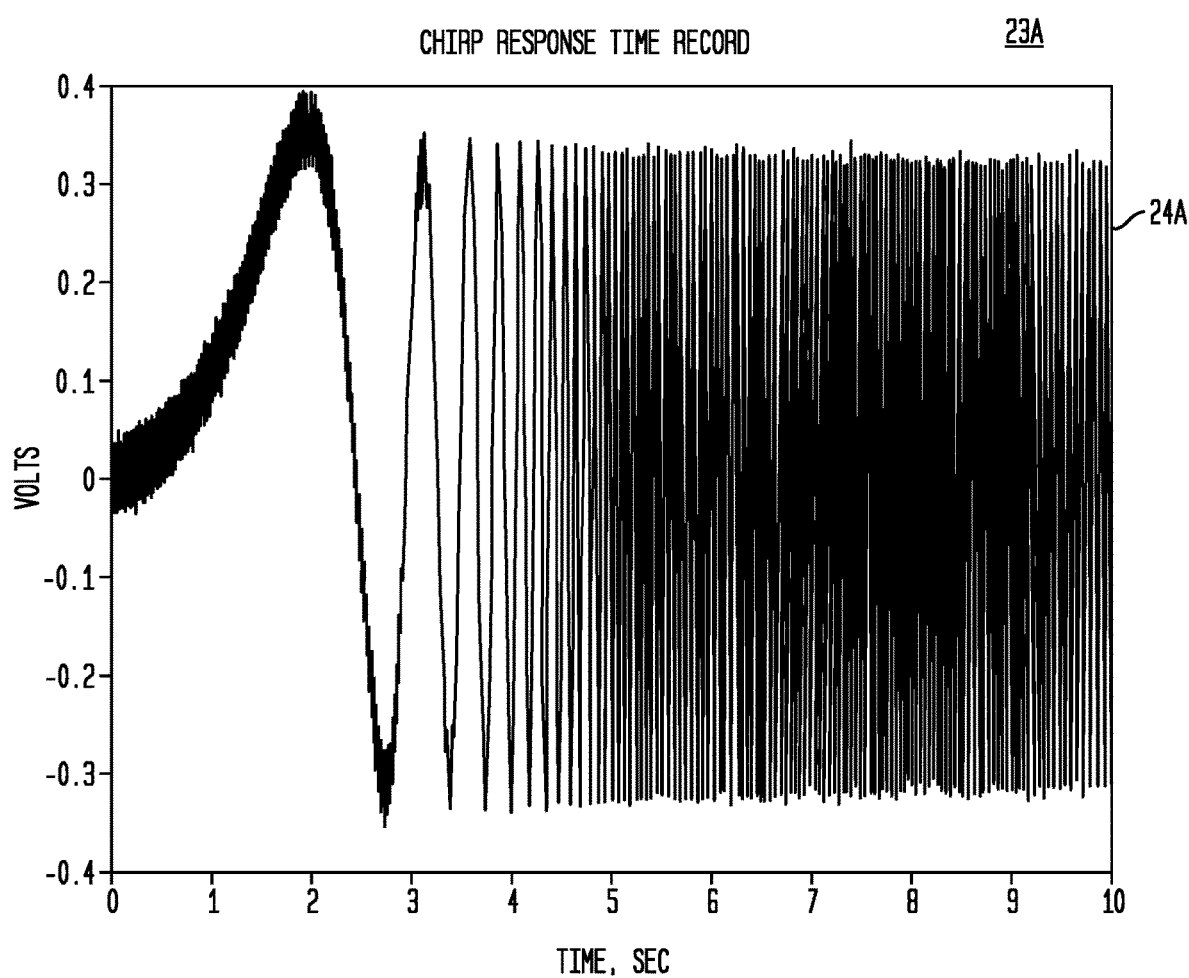
FIG. 12 depicts an embodiment of a measured chirp response time record including the chirp response signal of the test device shown in FIG. 4.
Figure 13:
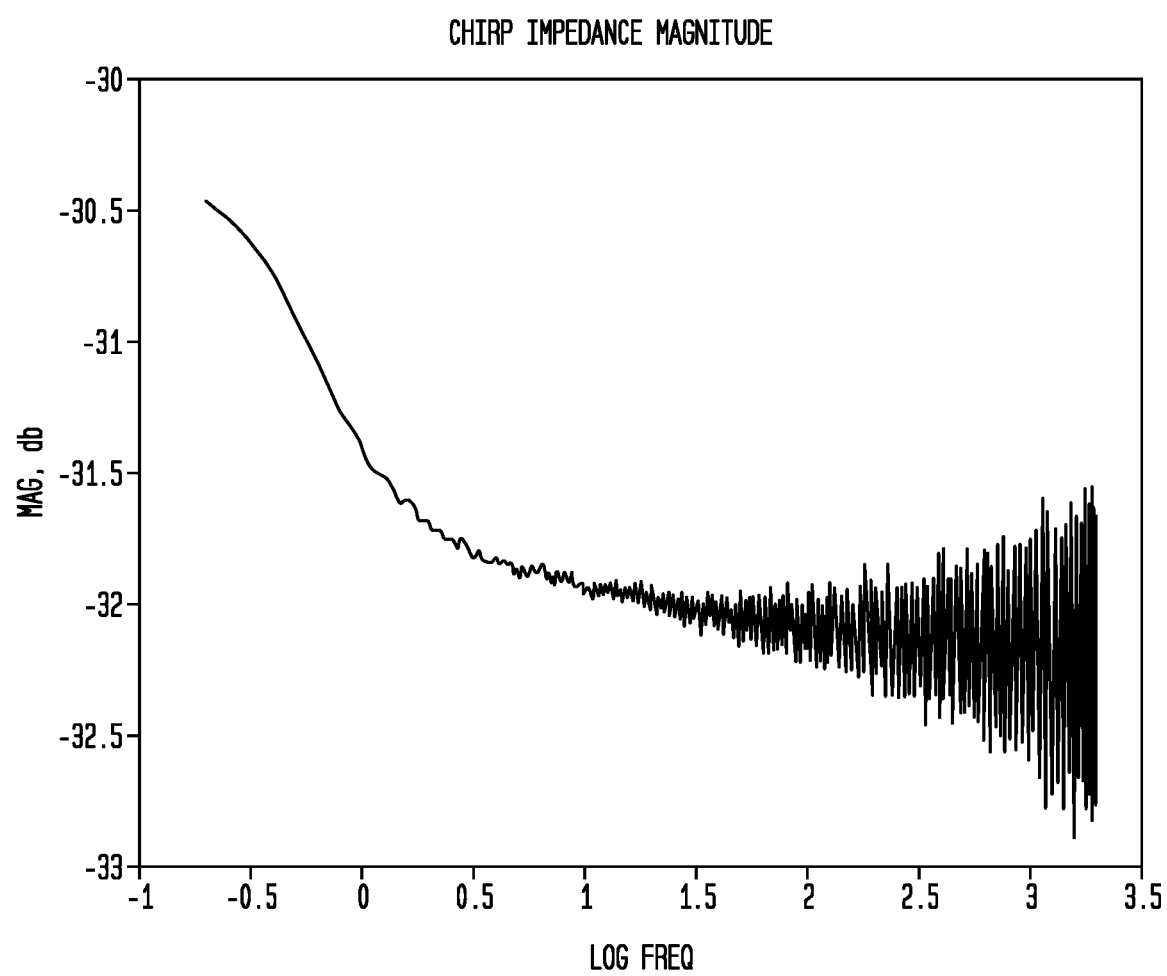
FIG. 13 depicts a part of the measured magnitude of the chirp frequency response of FIG. 12 evidencing increasing noise with increasing frequency.
Figure 14:
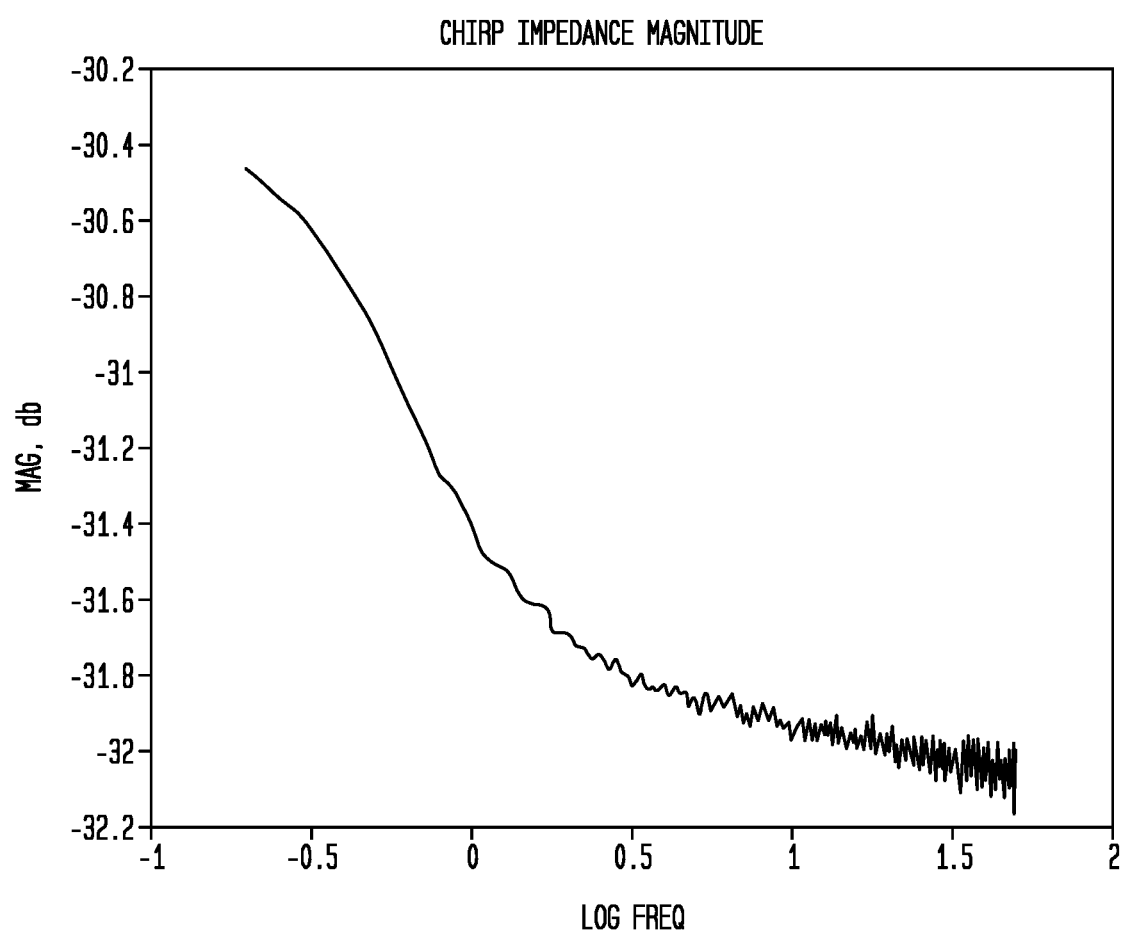
FIG. 14 depicts the plot of FIG. 13 of the first 500 points of the chirp frequency response depicted in FIG. 13.
Figure 15:
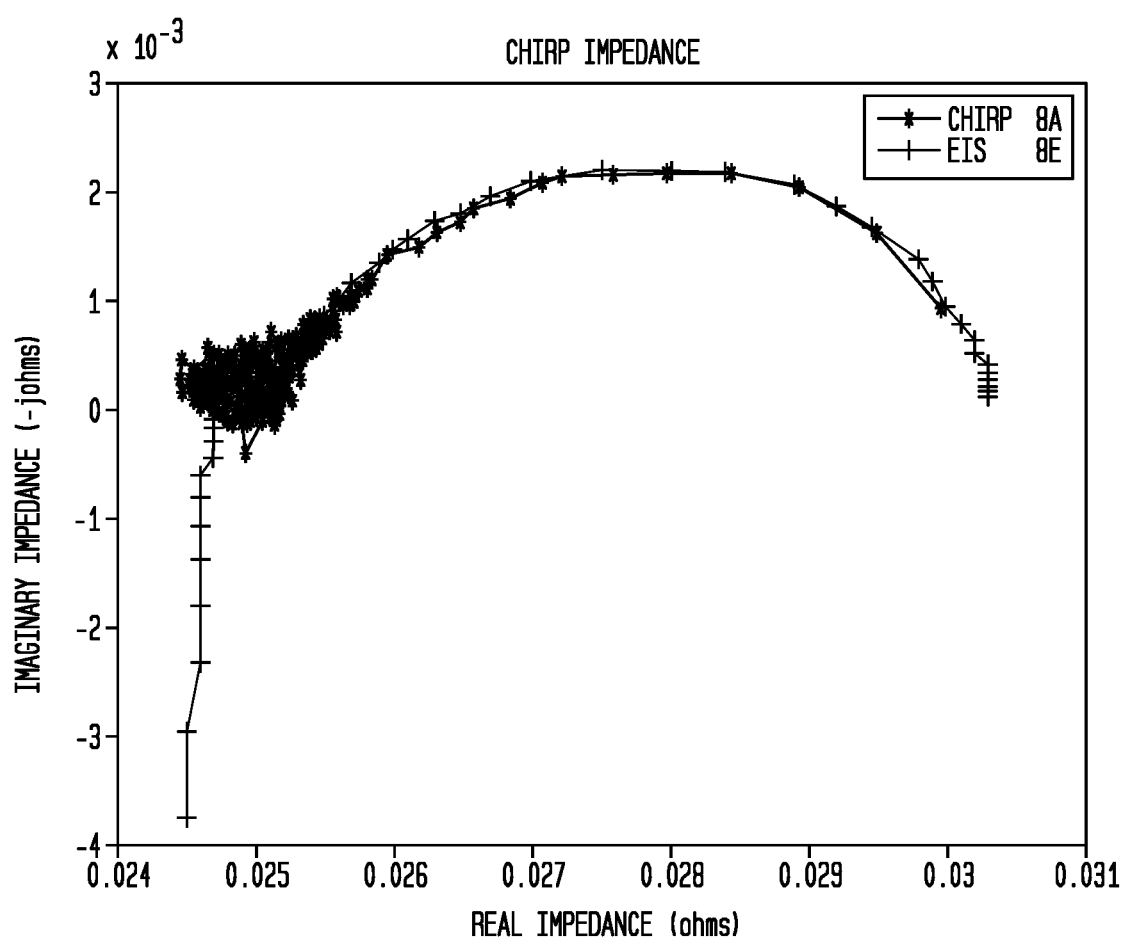
FIG. 15 depicts the measured chirp impedance spectrum plot of the embodiment of FIG. 12 superimposed with the EIS reference spectrum plot.

Now, with primary reference to FIGS. 12 through 15, the first example of chirp depicts a plot of the chirp response time record (23A) including the chirp response signal (24A) of the test device (3) as depicted in FIG. 12. The ratio between the FFT of the chirp response time record (23A) to the FFT of the shunt normalized time record was generated to obtain the measured impedance (2) of the first 20,000 points of the time record plotted as magnitude against frequency as shown in the example of FIG. 13. FIG. 13 evidences that noise in the magnitude of the chirp frequency response time record (23A) increases with frequency. However, the principle part of the test device response was well below 100 Hz, thus FIG. 14 depicts the same plot as in FIG. 13, but with only the first 500 points of the chirp frequency response (23A). In FIG. 14, the noise is reduced but still increases with frequency. FIG. 15 superimposes the chirp impedance spectrum plot (8A) with the EIS reference spectrum plot (8E). The plots have close agreement at low frequency and evidence increasing noise at high frequency.

Chirp Example II

Figure 16:
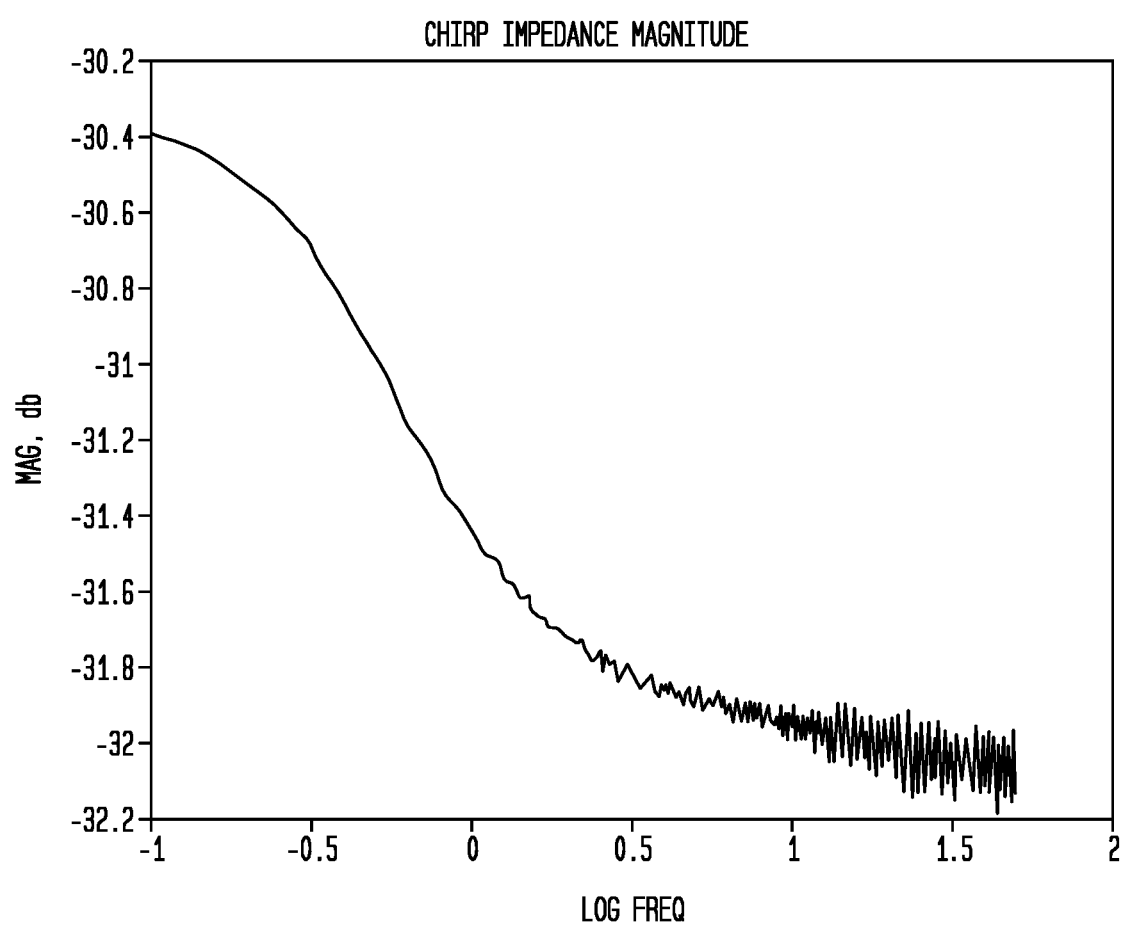
FIG. 16 depicts a portion of the measured magnitude of the chirp frequency response in which the frequency sweep rate is halved and the duration of the chirp excitation signal is doubled maintaining the frequency range.
Figure 17:
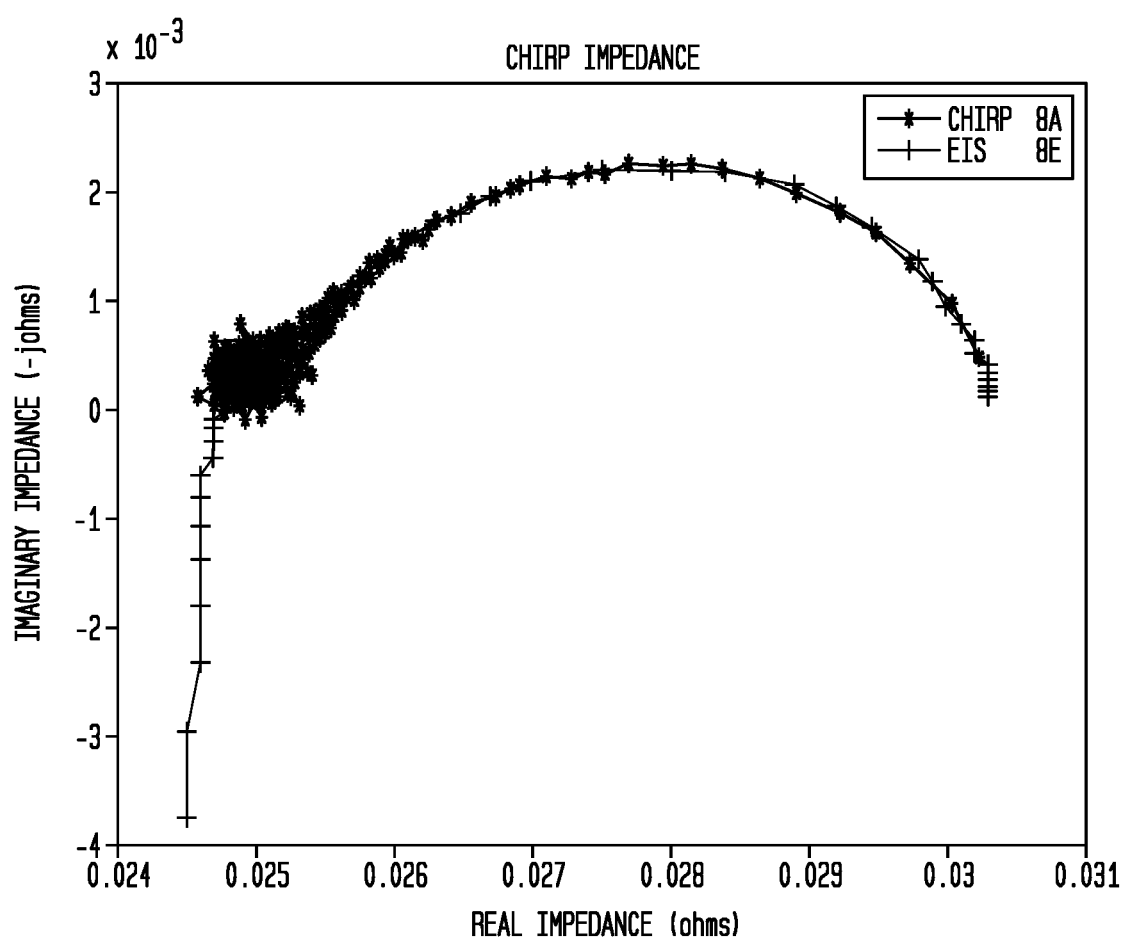
FIG. 17 depicts the measured chirp impedance measurement plot of the embodiment of FIG. 16 superimposed with the EIS reference spectrum plot.

Now with primary reference to FIGS. 16 and 17, the second example of chirp (26A) maintains the same chirp excitation time record (25A) as the first example of chirp (26A), except that the frequency sweep rate about halved and the duration of the chirp excitation signal (26A) about doubled thus holding the about the same frequency range. FIG. 16 depicts the impedance magnitude chirp frequency response (23A) to about 50 Hz and FIG. 17 depicts the chirp impedance measurement plot (8A) superimposed with the EIS reference spectrum plot (8E). Because the chirp response time record (25A) is 20 seconds in the frequency domain, the frequency step is 0.05 Hz, and thus, the applicable frequencies from the FFT results exclude the first data point as 0.05 Hz was not within the chirp frequency spread. As seen in FIG. 17, the agreement between the chirp impedance spectrum plot (8A) and the EIS reference spectrum plot (8E) improves; however there remains increasing noise at the higher frequency.

Examples of Impedance Measurements Using Step Chirp

Now with general reference to FIGS. 18 through 26, which depict illustrative measurements using step chirp (26B) included a step chirp excitation time record (25B) which generated an RMS excitation current of about 500 mA having 15 frequencies in the first step chirp example and 18 frequencies in the second step chirp example each stepping down from 2 kHz in harmonic octaves. Impedance measurements (2) using the same step chirp excitation time record (25B) were made on the above described shunt (57) and test device (3). The impedance measurements (2) were archived in .csv files for post processing. TCTC was used to process the .csv data with the steady state assumption validated by discarding the initial portion (56) of the period of each frequency, as above described. The post processed results for each of the first and second step chirp impedance spectrum plots (8B) were superimposed with the EIS reference spectrum plot (8E).

Step Chirp Example I

Figure 18:
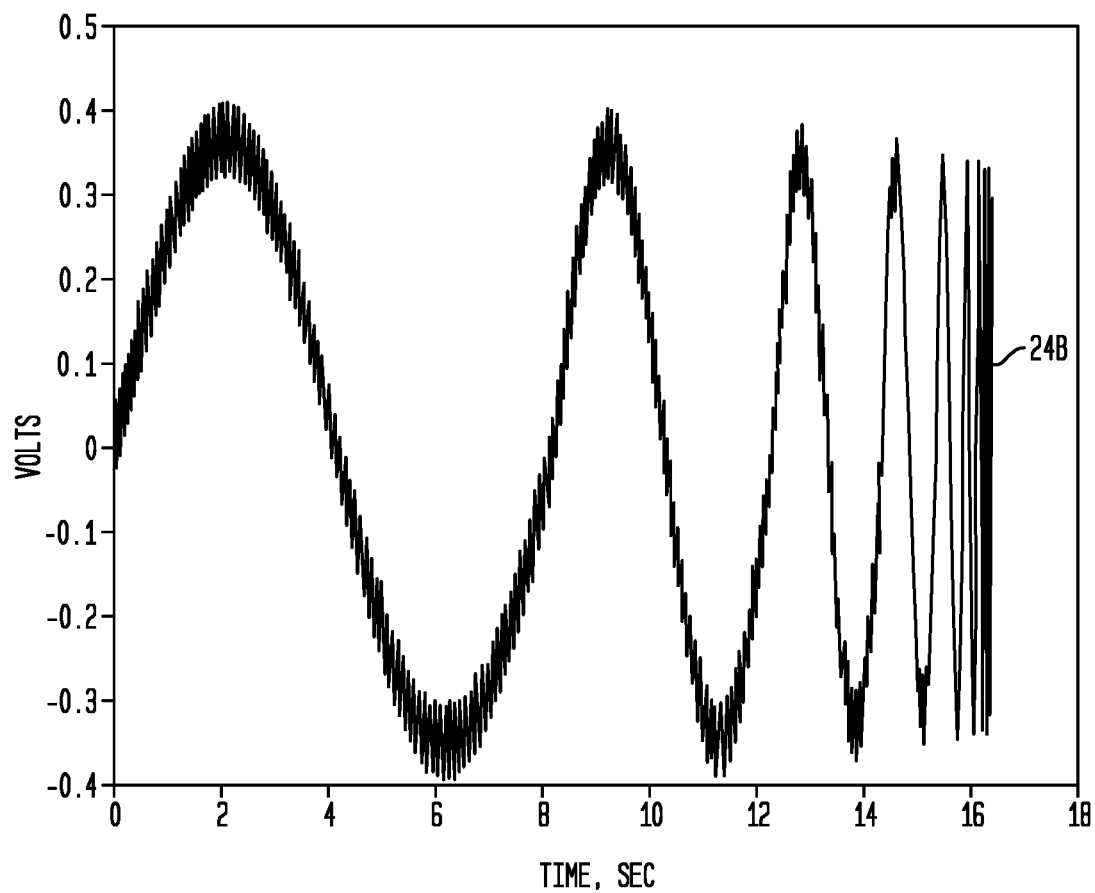
FIG. 18 depicts an embodiment of a measured step chirp response time record of the test device shown in FIG. 4.
Figure 19:
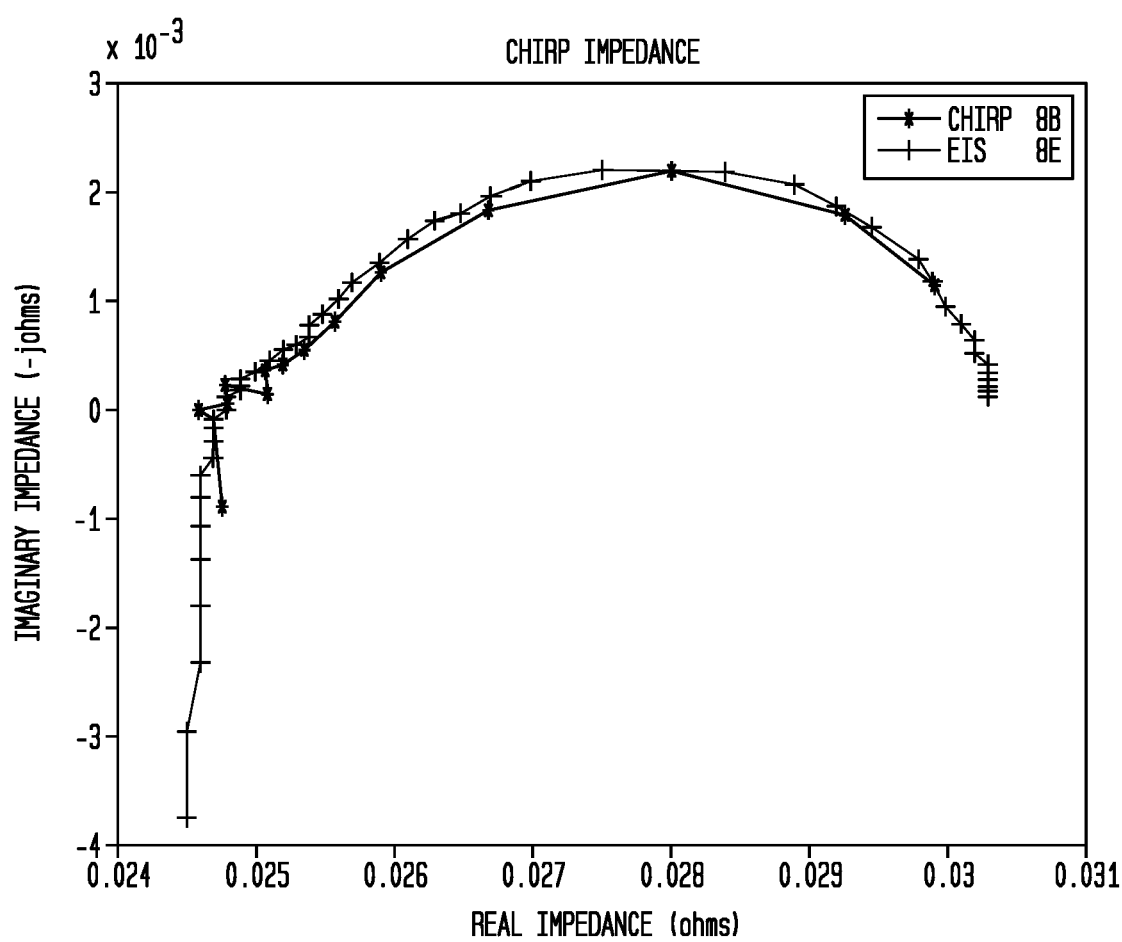
FIG. 19 depicts the resultant measured step chirp impedance spectrum plot of the embodiment of FIG. 18 superimposed with the EIS reference spectrum plot.

Now, with primary reference to FIGS. 18 and 19, which respectively illustrate the step chirp response time record (23B) of the test device (3), and the resultant step chirp impedance spectrum plot (8B) superimposed with the EIS reference spectrum plot (8E) of the first example of step chirp (26B). FIG. 19 evidences that there is substantial agreement between the step chirp impedance spectrum plot (8B) and the EIS reference spectrum plot (8E); although noise increases at higher frequency. However, a frequency at 2000 Hz only includes twenty data points per period and step chirp (26B) includes only one period per frequency. The noise may be corrected by including sufficient data points to average out the noise at higher frequency. This can be accomplished by either increasing the sampling rate to higher than about 40 kHz or increasing the number of periods.

Step Chirp Example II

Figure 20:
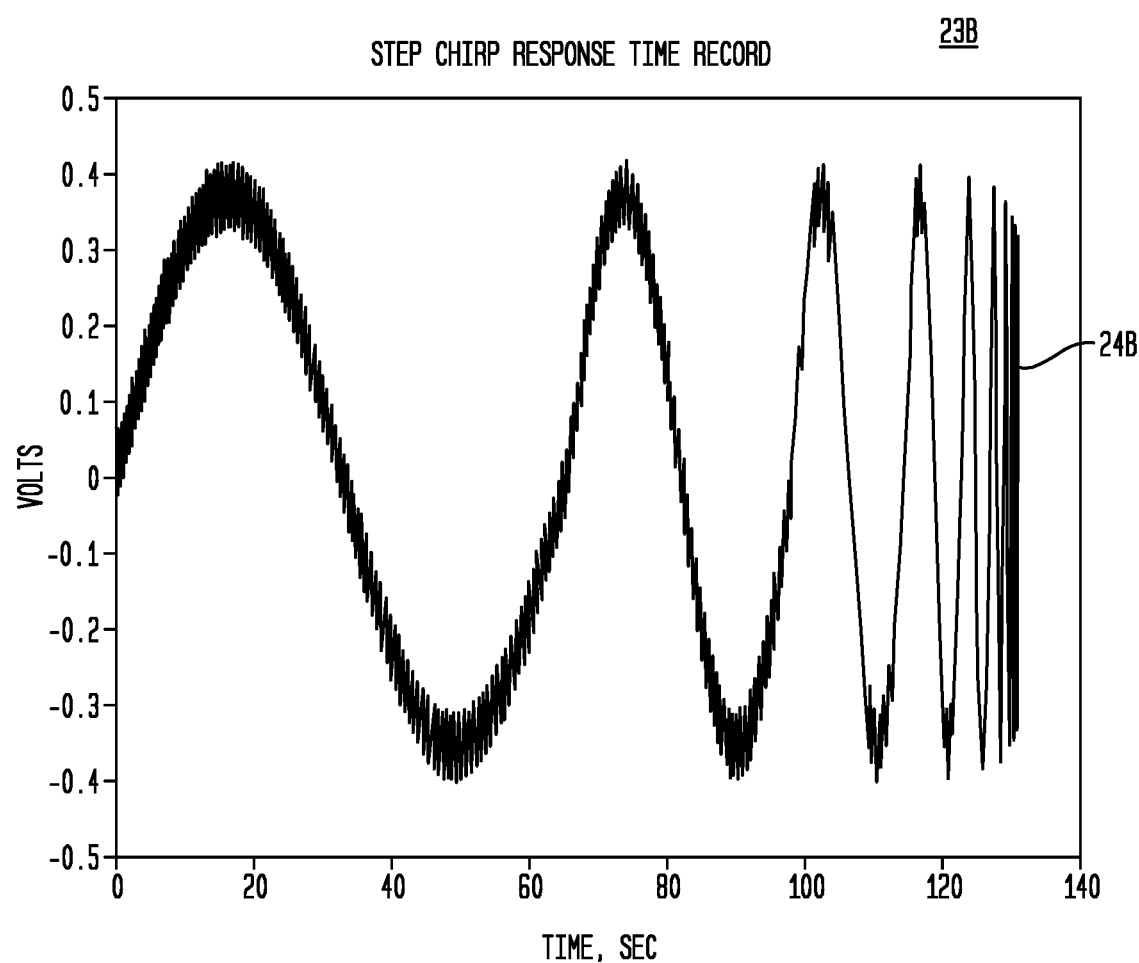
FIG. 20 depicts another embodiment of a measured step chirp response time record of the test device shown in FIG. 4.
Figure 21:
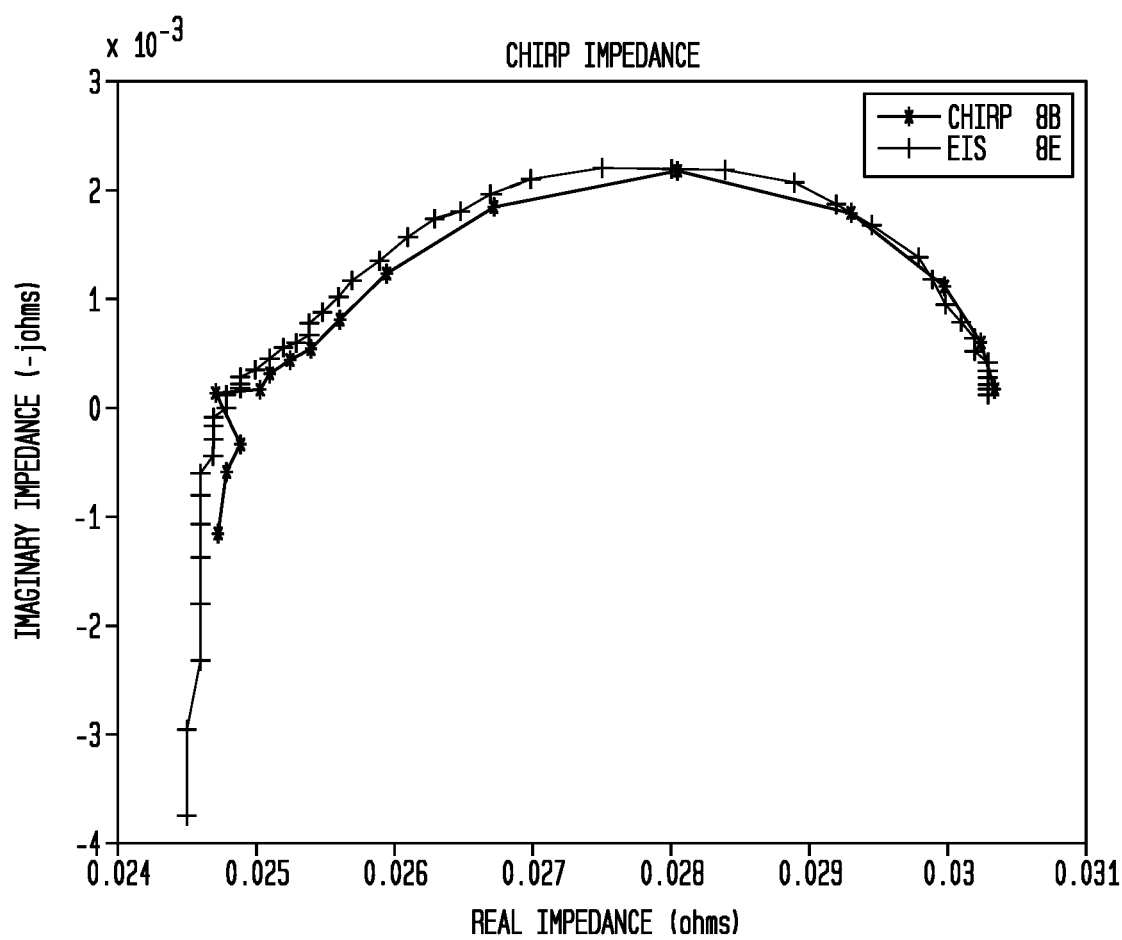
FIG. 21 depicts the resultant measured step chirp impedance spectrum plot of the embodiment of FIG. 20 superimposed with the EIS reference spectrum plot.

Now, with primary reference to FIGS. 20 and 21 which respectively illustrate the step chirp response time record (23B) of the test device (3), and the resultant step chirp impedance spectrum plot (8B) superimposed with the EIS reference spectrum plot (8E) of the second example of step chirp in which step chirp excitation time record (25B) remains the same as in the first example of step chirp except that 18 frequencies step down from 2 kHz in harmonic octaves. FIG. 20 evidences that step chirp response time record (23B) is longer in this example compared to the step chirp response time record (23B) depicted in FIG. 18 due to an increased number of octave frequencies. FIG. 21 evidences that there is substantial agreement between the step chirp impedance spectrum plot (8B) and the EIS reference spectrum plot (8E); although the noise still increases at higher frequency. The noise may be corrected by increasing the sample rate or including additional periods at higher frequency. Adding more periods at higher frequencies to the excitation time record may not substantially increase the overall test duration.

Step Chirp Example III

Figure 22:
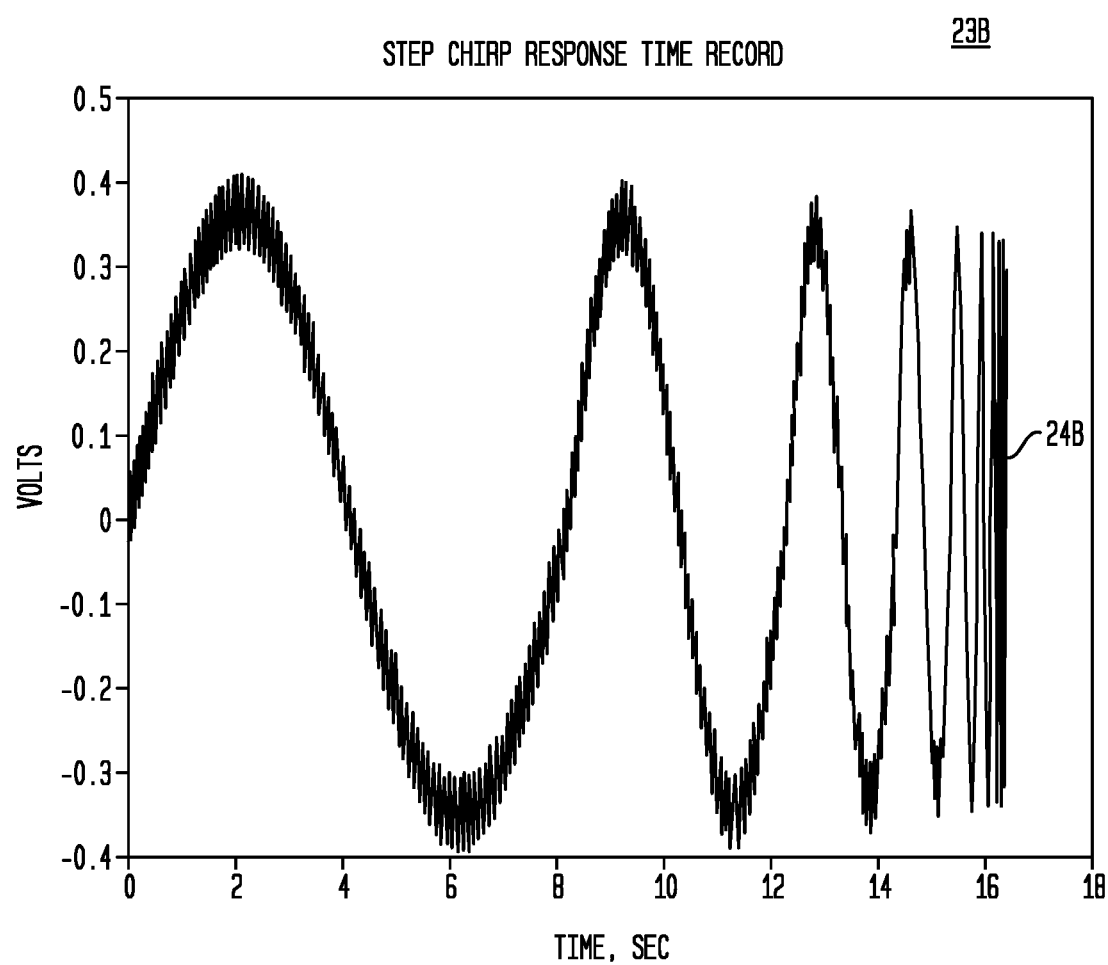
FIG. 22 depicts another embodiment of a measured step chirp response time record of the test device shown in FIG. 4.
Figure 23:
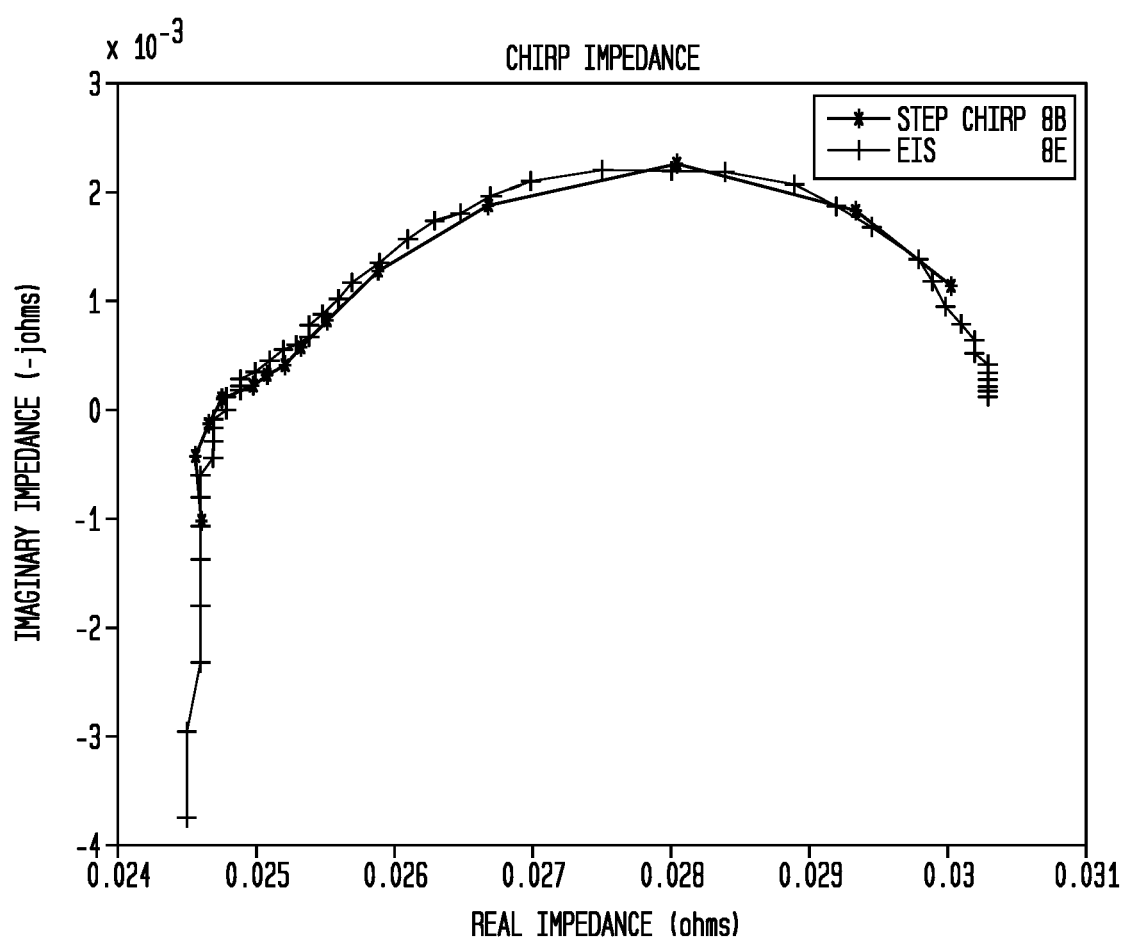
FIG. 23 depicts the resultant measured step chirp impedance spectrum plot of the embodiment of FIG. 22 superimposed with the EIS reference spectrum plot.

Now, with primary reference to FIGS. 22 and 23 which respectively illustrate the step chirp response time record (23B) for the test device (3), and the resultant step chirp impedance spectrum plot (8B) superimposed with the EIS reference spectrum plot (8E) of the third example of step chirp (26B) in which step chirp excitation time record (25B) remains the same as in the first and second examples of step chirp (26B) except that 15 frequencies step down from 2 kHz in harmonic octaves and with additional periods added at higher frequencies in decreasing number 20, 10, 5, 3, 2, 1 . . . stepping down to the lowest frequency. FIG. 23 evidences that there is substantial agreement between the step chirp impedance spectrum plot (8B) and the EIS reference spectrum plot (8E), and the additional periods added at higher frequency can substantially reduce the noise at higher frequencies.

Step Chirp Example IV

Figure 24:
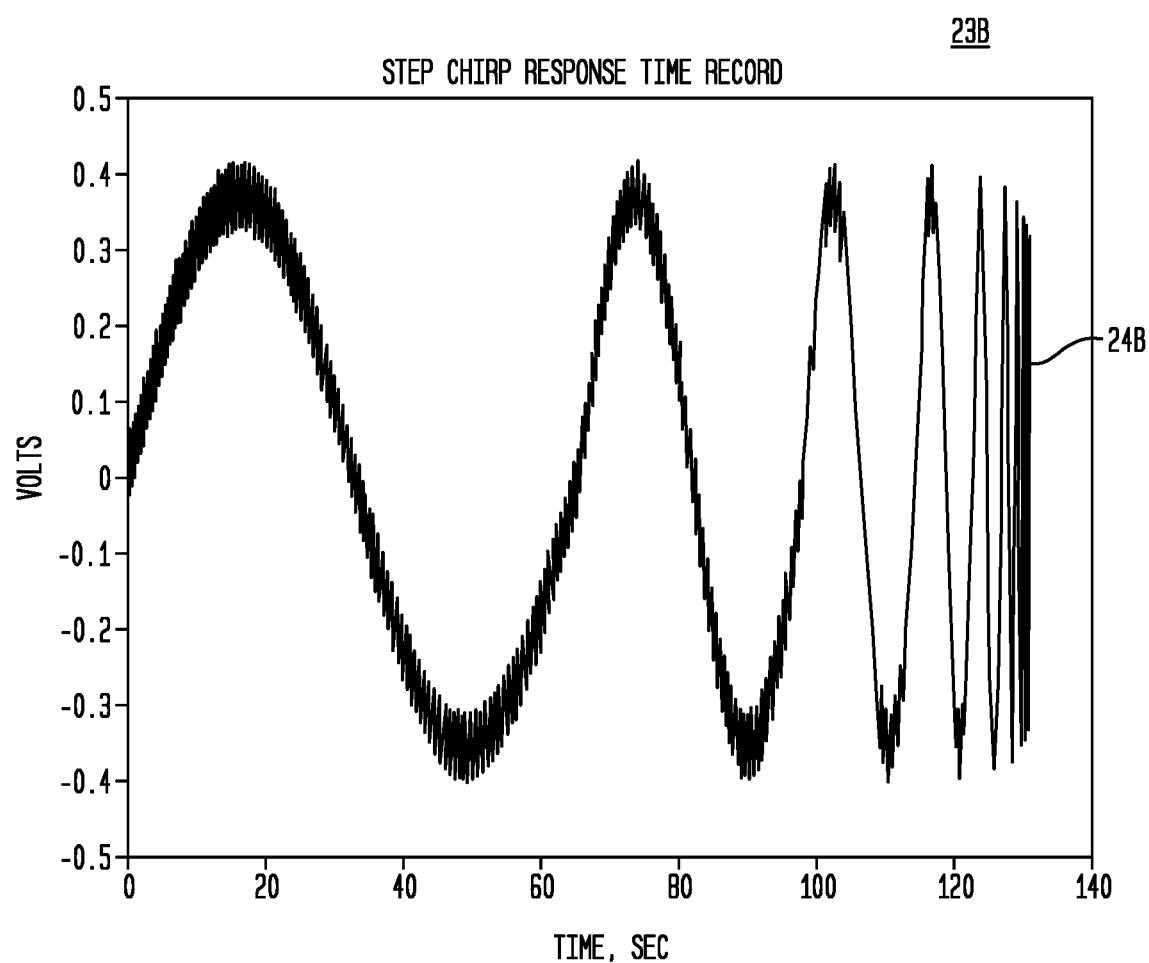
FIG. 24 depicts another embodiment of a measured step chirp response time record of the test device shown in FIG. 4.
Figure 25:
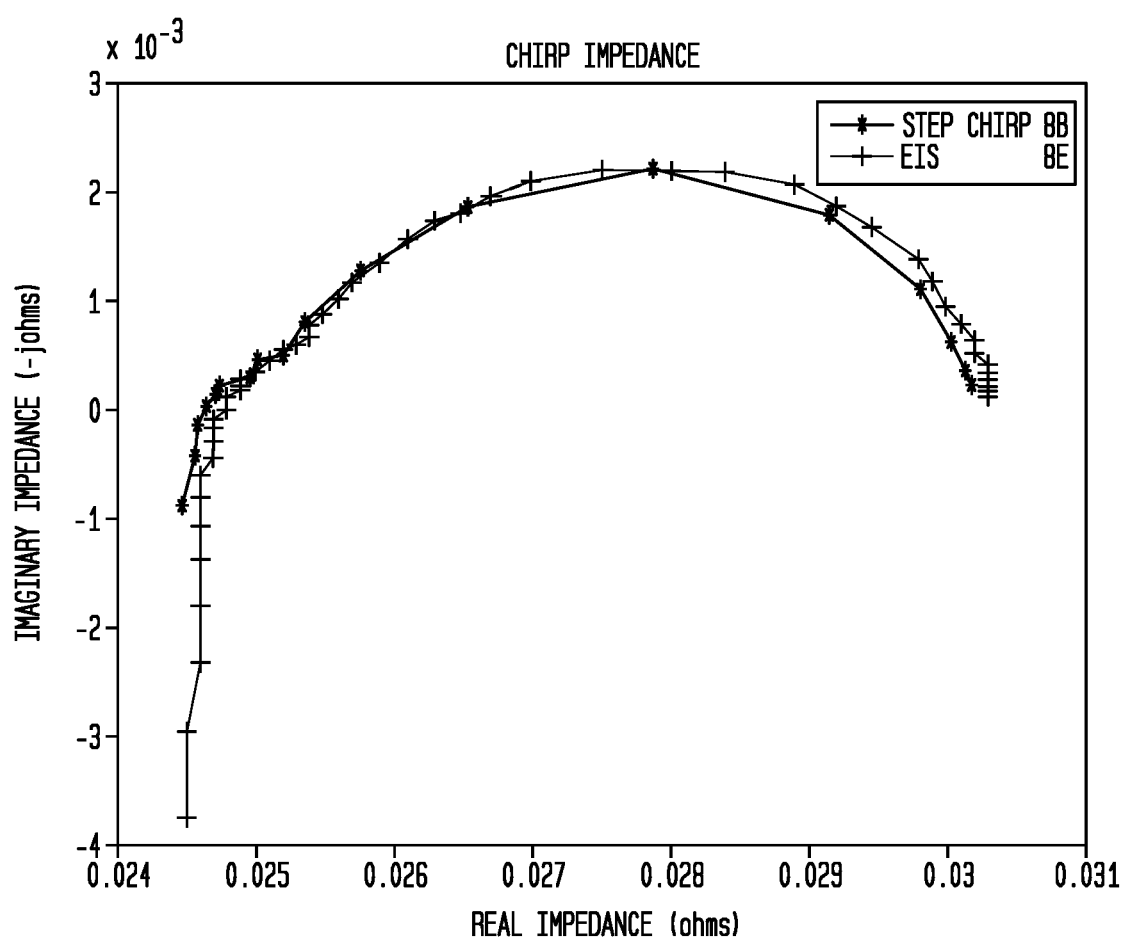
FIG. 25 depicts the resultant measured step chirp impedance spectrum plot of the embodiment of FIG. 24 superimposed with the EIS reference spectrum plot.

Now, with primary reference to FIGS. 24 through 25 which respectively illustrate the step chirp response time record (23B) of the test device (3), and the resultant step chirp impedance spectrum plot (8B) superimposed with the EIS reference spectrum plot (8E) of the fourth example of step chirp (26B) in which step chirp excitation time record (25B) remains the same as in the prior examples of step chirp (26B) except that 18 frequencies step down from 2 kHz in harmonic octaves and with additional periods added at higher frequencies in decreasing number 20, 10, 5, 3, 2, 1 . . . stepping down to the lowest frequency. FIG. 25 evidences that there is substantial agreement between the step chirp impedance spectrum plot (8B) and the EIS reference spectrum plot (8E) data, and the additional periods added at higher frequency can substantially reduce the noise at higher frequencies.

Figure 26:
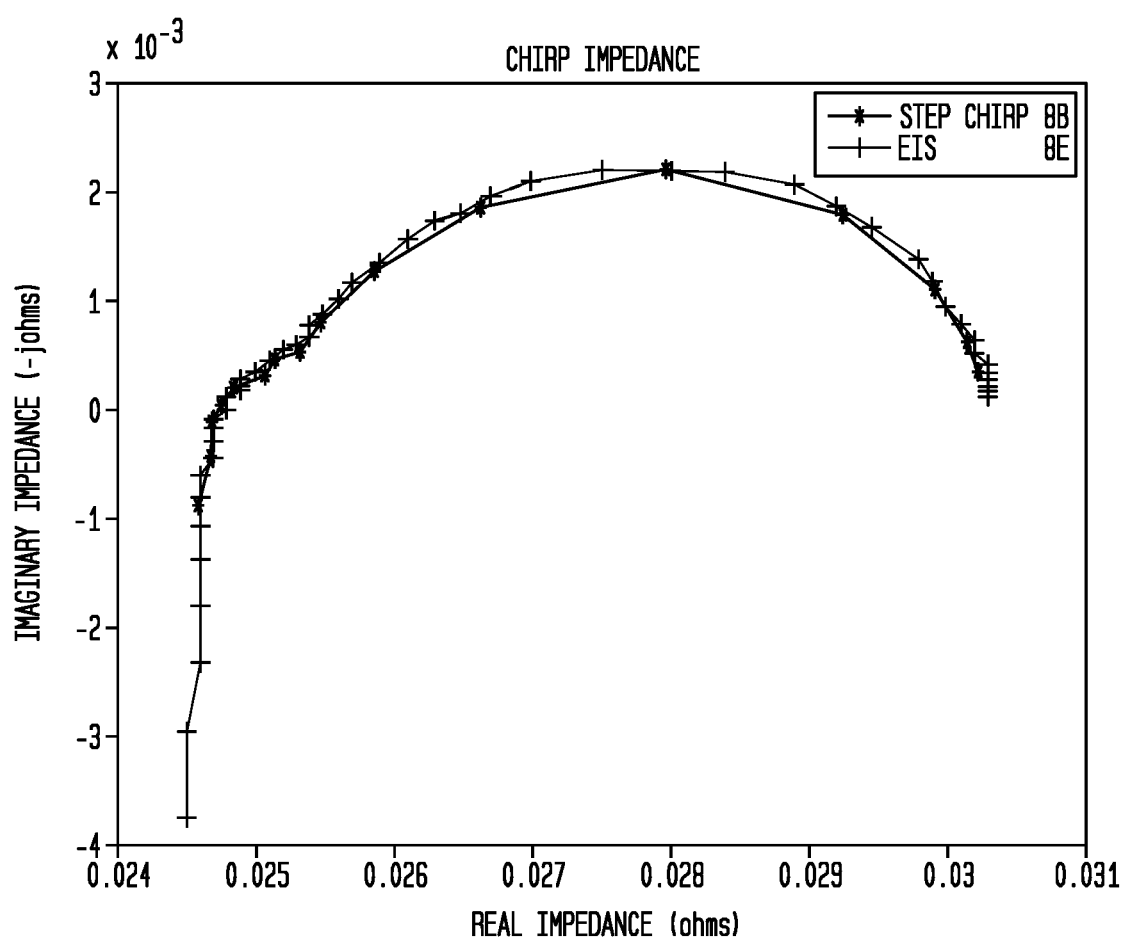
FIG. 26 depicts the resultant measured step chirp impedance spectrum plot of the embodiment of FIG. 24 superimposed with the EIS reference spectrum plot with the addition of about 0.1mOhm to the real impedance of the step chirp impedance spectrum which results in the step chirp impedance spectrum plot overlaying the EIS reference spectrum plot.

Now with primary reference to FIG. 26, the remaining offset between the step chirp impedance spectrum plot (8B) and the EIS reference spectrum plot (8E) can be resolved by the addition of about 0.1 mOhm to the real impedance of the step chirp impedance spectrum which results in the step chirp impedance spectrum plot (8B) overlaying the EIS reference spectrum plot (8E). The 0.1 mOhm offset may be due to differences in contact resistance between the two measurements.

Step Group Chirp

Figure 27:
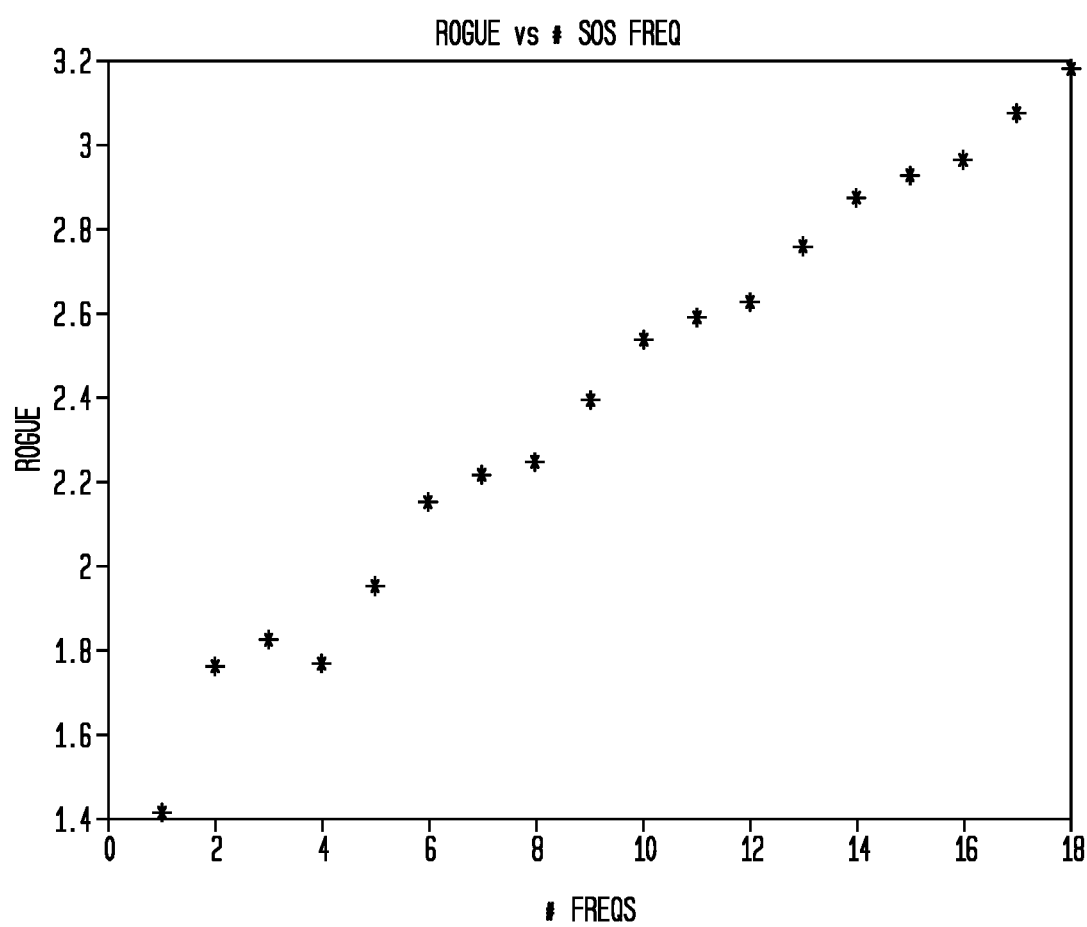
FIG. 27 depicts a plot of rogue wave factor versus the number of octave harmonic sine waves in a sum of sines.

Now, with reference to FIG. 27, rogue wave is defined as: signal peak/signal RMS. For a single sine wave with a unity peak amplitude ($V_P=1$), the rogue wave is 1.414. Step chirp (26B) as above described makes a tradeoff between time record duration and a minimal rogue wave. As an illustrative example, in a step chirp (26B) with a step chirp excitation time record (25B) including 16 frequencies stepping down from 2 kHz by harmonic octaves with one period for each frequency the duration of a step chirp time record (25B) can be about 32.75 seconds and includes a rogue wave of about 1.414. When individual frequencies are added together in a sum-of-sines, the time record duration may be decreased, but the rogue wave may be increased. FIG. 27 plots the rogue wave versus the number of octave harmonic sine waves in an SOS.

As evidenced by the plot in FIG. 27, including four sine waves with octave harmonic separation within a SOS can be utilized in an excitation signal (26) for sequential stepping in frequency groups (59)(also referred to as "step group" or "group chirp (26C)") rather than stepping as single sine waves since there is a local minimum in the rogue wave factor. However, the illustrative example of four sine waves within an SOS is not intended to preclude other embodiments including frequency groups (59) having less than (as examples 2 or 3) or more than four (as examples, 8, 12, 16 . . . ) sine waves within a SOS, including groups that have harmonic or non-harmonic separation. In the illustrative example using four sine waves in a frequency group (59), the rogue wave factor was 1.75. In particular embodiments, group chirp (26C) can further include additional periods at higher frequencies. For example, the highest frequency group including 2 kHz, may include 20 periods. For step SOS with frequency groups (59) of 4 with 16 frequencies stepping down from 2 Hz and the highest frequency group (59) having 20 periods with a time duration of about 17.55 sec.

Now, with general reference to FIGS. 28 through 35, the illustrative examples of group chirp (26C) were implemented based upon 16 frequencies (11) with each frequency group (59) having four frequencies (11). The simulated test electrical circuit (4) was used in each of the first two examples of group chirp (26C). The first example of group chirp (26C), implemented a step group chirp excitation time record (25C) which stepped up from 0.05 Hz by harmonic octaves include 16 frequencies with four frequencies within each frequency group (59). The second example of step group chirp (26C), implemented a step group chirp excitation time record (25C) which stepped down from 2 kHz by harmonic octaves to include 16 frequencies (11) with four frequencies within each frequency group (59). In both examples, the highest different frequency group included twenty periods of the lowest frequency within the group; the next highest frequency group included five periods of the lowest frequency within the group; the penultimate frequency group included three periods of the lowest frequency within the group; the lowest frequency group included 1 period of the lowest frequency within the group. In each example, TCTC was used to process the step group chirp response time record (23C) and the steady state assumption was realized by deleting the initial portion (56)(about 20%; although a greater or lesser portion can be deleted depending upon the application) of the step group chirp response time record (23C) in each frequency group (59).

Figure 28:
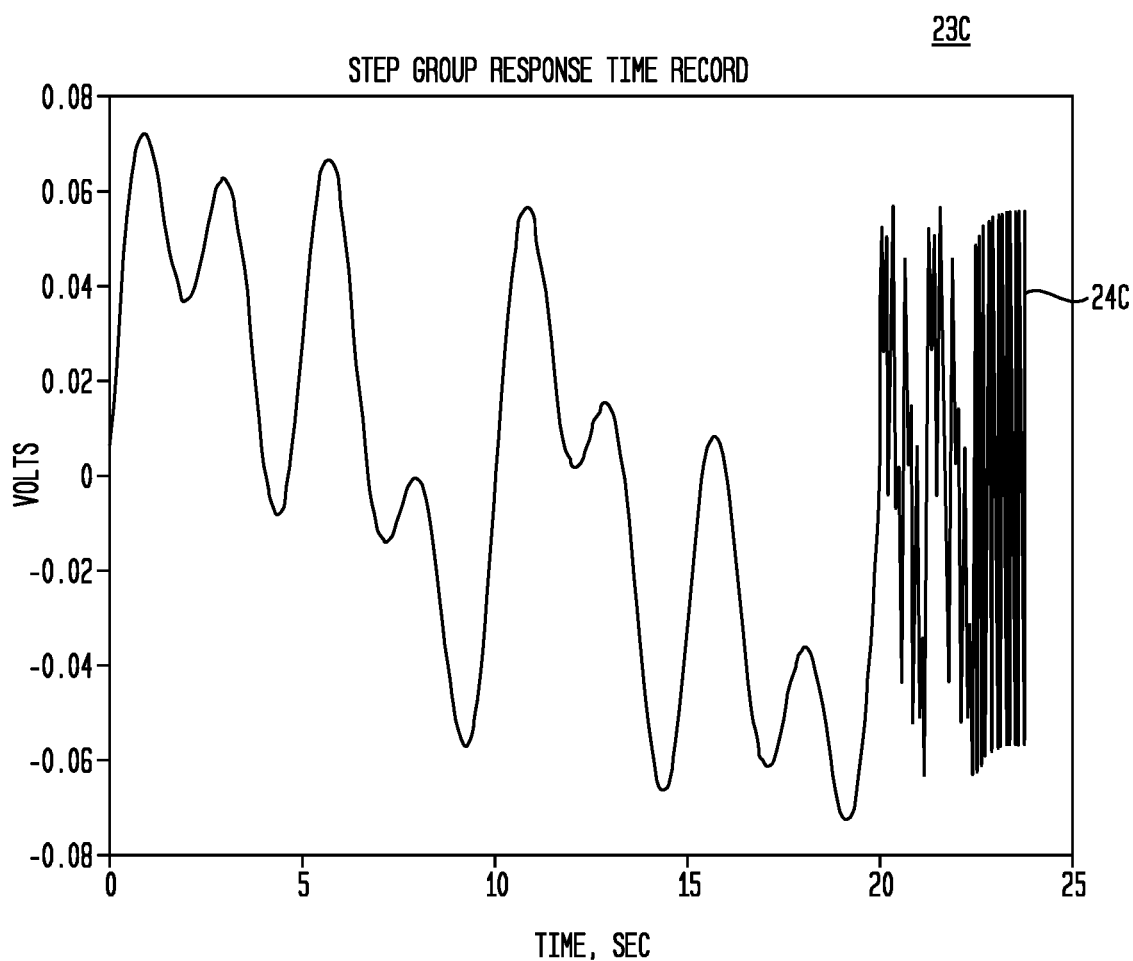
FIG. 28 depicts another embodiment of a simulated step group chirp response time record of the test electrical circuit shown in FIG. 4.
Figure 29:
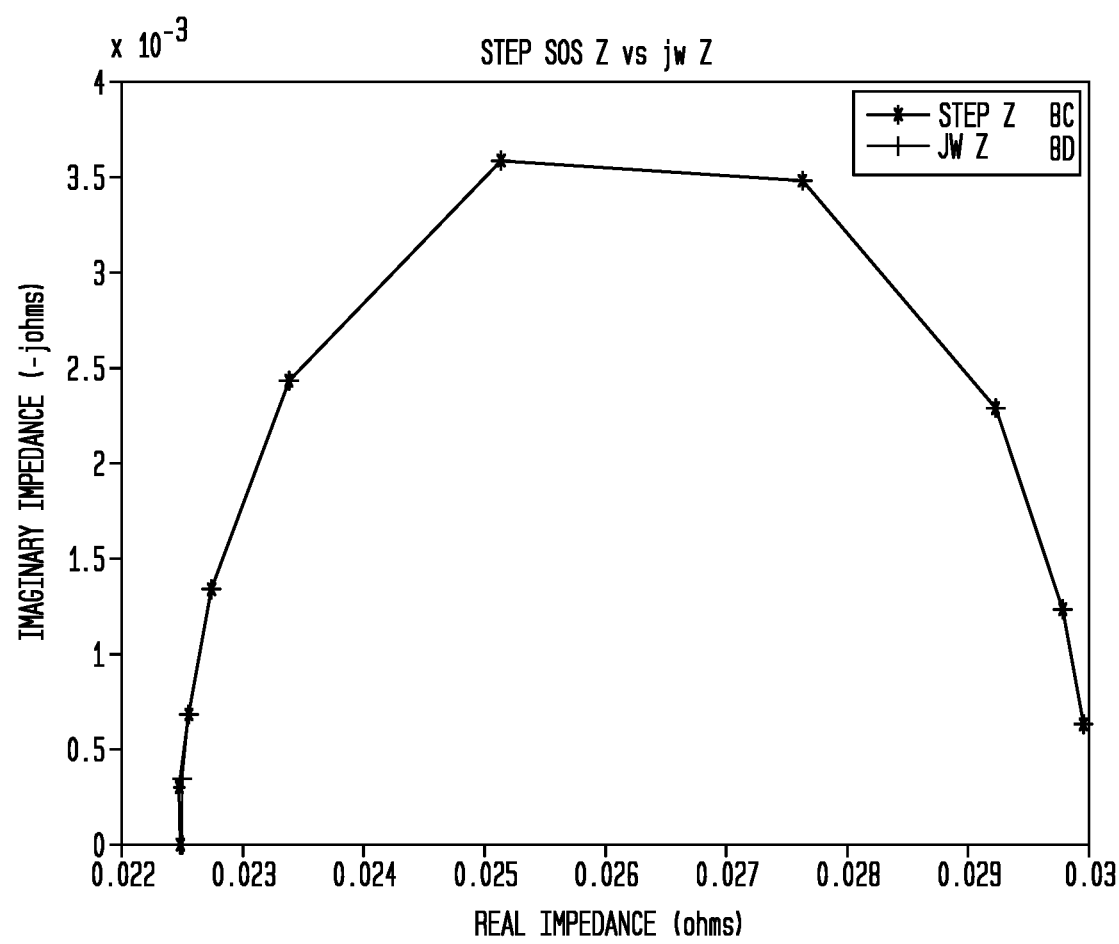
FIG. 29 depicts the resultant simulated step group chirp impedance spectrum plot of the embodiment of FIG. 28 superimposed with the ideal jw impedance spectrum plot.

STEP GROUP CHIRP EXAMPLE I. Now, with primary reference to FIGS. 28 and 29, in the first simulation of step group chirp (26C), FIG. 28 depicts a step chirp response time record (23C) of the step group chirp response signal (24C) of the test electronic circuit (4) to the step group chirp SOS current excitation signal (26C), and FIG. 29 depicts the step chirp impedance spectrum plot (8C) for the TCTC processed step group chirp response time record (23C) of the test electronic circuit (4) superimposed with the ideal jw impedance spectrum plot (8D).

Figure 30:
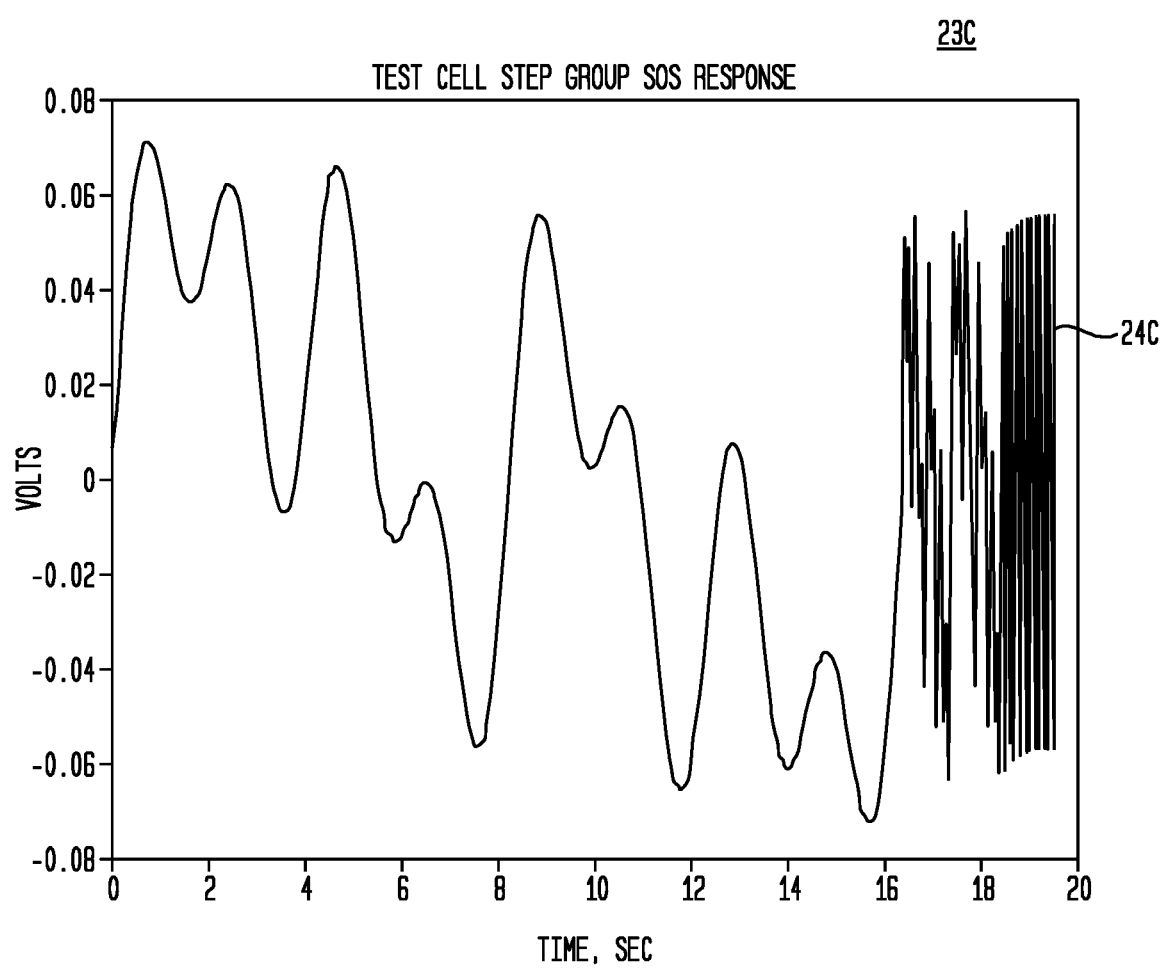
FIG. 30 depicts another embodiment of a simulated step group chirp response time record of the test electrical circuit shown in FIG. 4.
Figure 31:
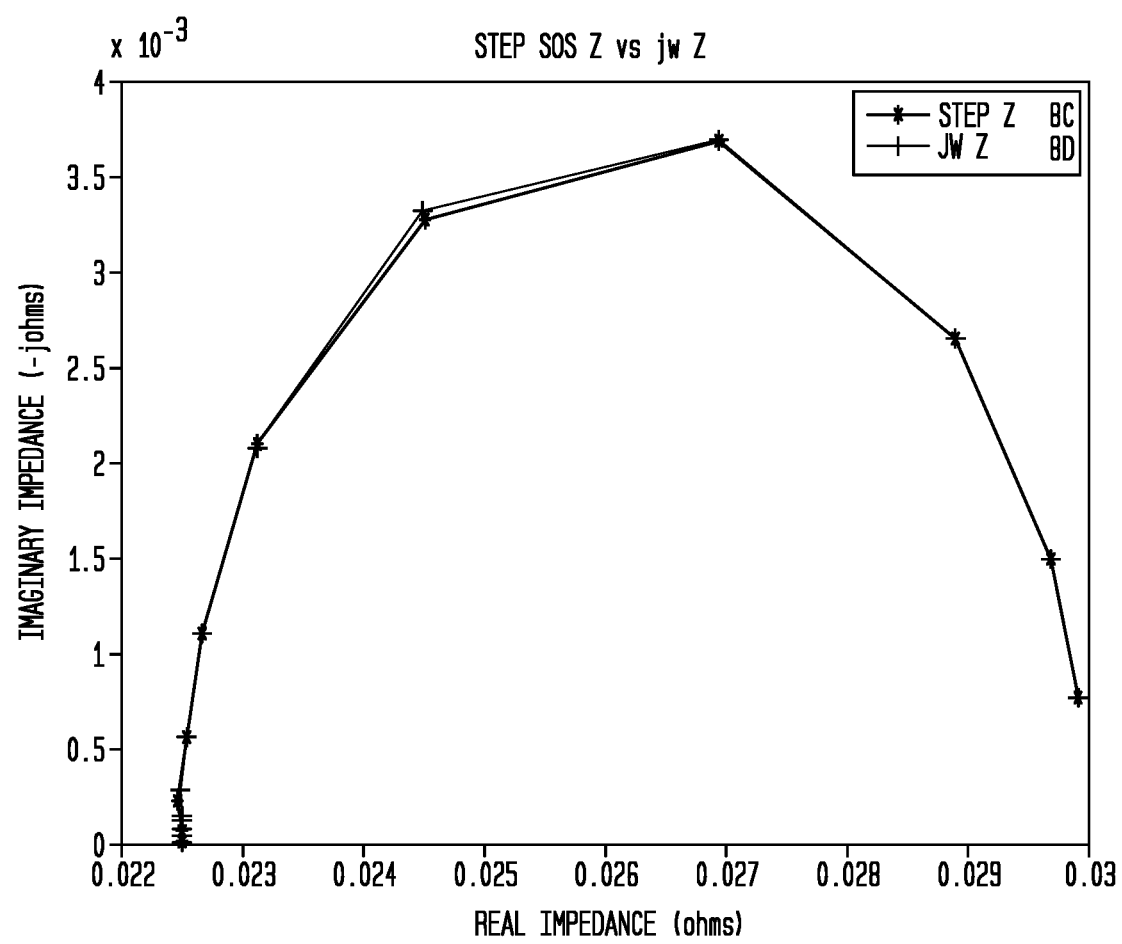
FIG. 31 depicts the simulated step group chirp impedance spectrum plot of the embodiment of FIG. 30 superimposed with the ideal jw impedance spectrum plot.

STEP GROUP CHIRP EXAMPLE II. Now, with primary reference to FIGS. 30 and 31, in the second simulation of group chirp (26C), FIG. 30 depicts a step group chirp response time record (23C) of the step group chirp response signal (24C) of the test electronic circuit (4), and FIG. 31 depicts the step chirp impedance spectrum plot (8C) for the TCTC processed step group chirp response time record (23C) of the test electronic circuit (4) superimposed with the ideal jw impedance spectrum plot (8D).

Illustrative examples of impedance measurements (2) of the test device (3) using step group chirp (26C) were performed using an IMD (1) as above described. The RMS of the excitation current was about 500 mA, otherwise all the parameters of the excitation signals (26) were established substantially as above described. The test device (3) was substantially equivalent or equivalent to the test device (3) above described and depicted in FIG. 4. The EIS reference spectrum plot (8E) used for all of the illustrative impedance measurements of the test device (3) was a plot of data obtained using a Solartron Potentiostat Galvanostat instrument. The nominal parameters for the EC were: R1=15 mOhm, R2=15 mOhm, R3=15 mOhm, C1=9F. The impedance measurements (2) were calibrated in order to account for gains and frequency response of the IMD (1) by performing measurements with a shunt (57) of known value with substantially identical measurement conditions as performed with the test device (3). The shunt response time record (58) from the shunt (57) was normalized to the shunt value. The step group response time record (23C) and the normalized shunt response time record (58) were transformed to the frequency domain and the ratio recorded as measured impedance of the test device (3).

Figure 32:
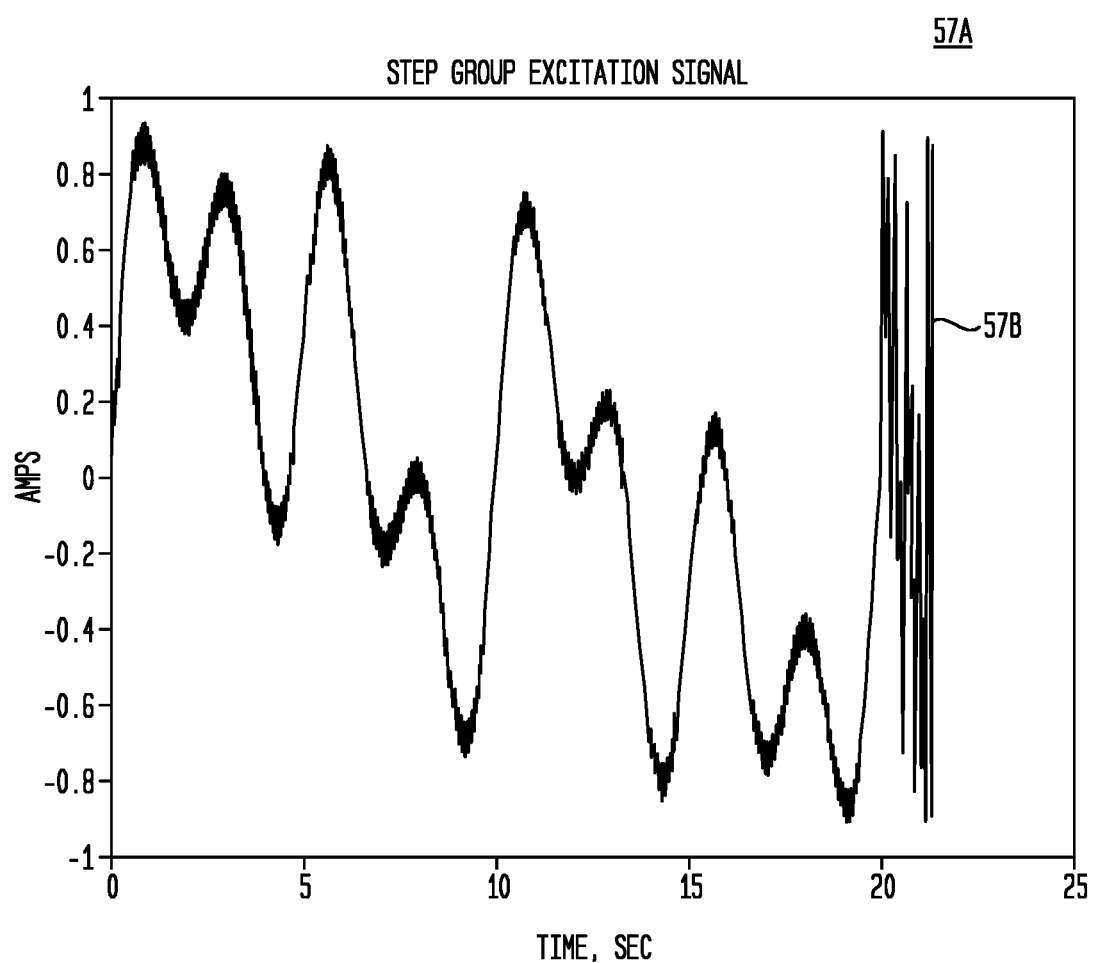
FIG. 32 depicts an embodiment of a step group chirp measured excitation time record applied to the test electrical circuit shown in FIG. 4.
Figure 33:
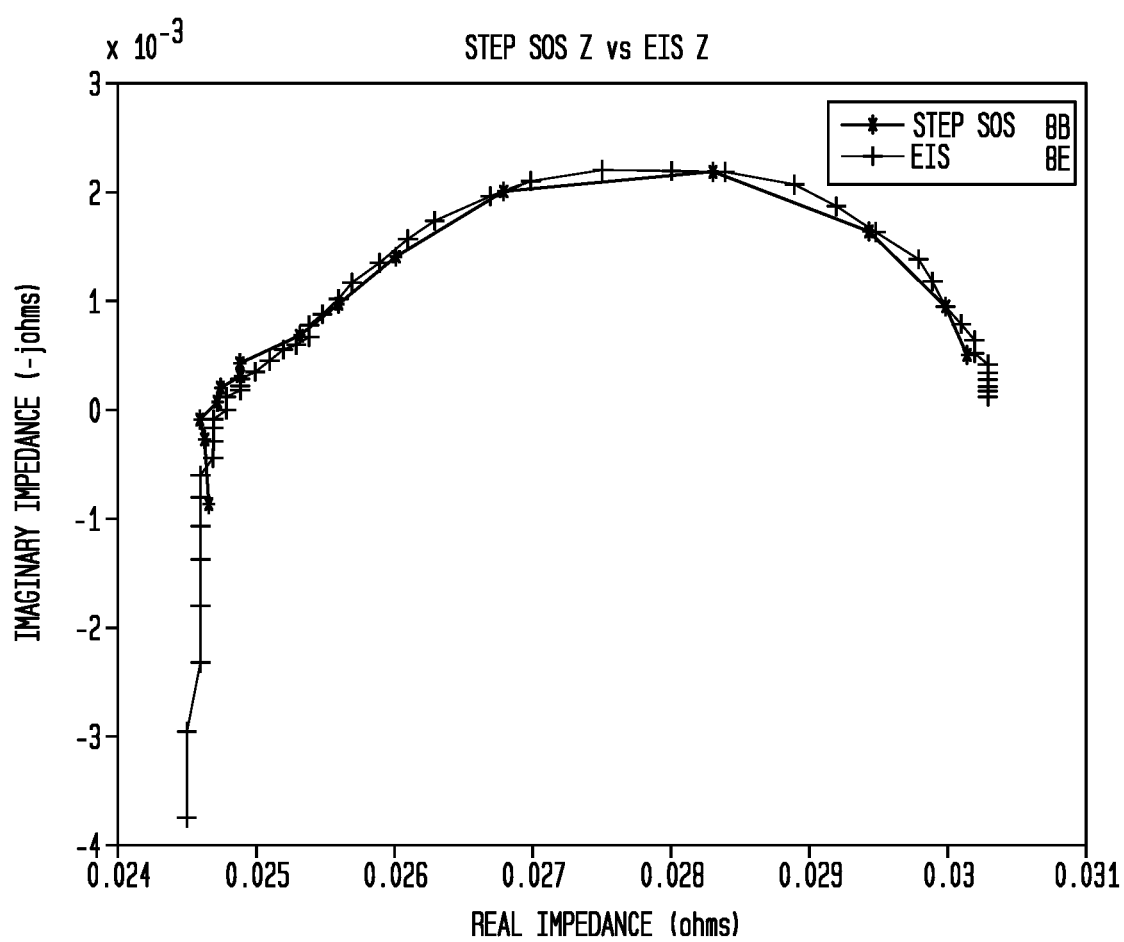
FIG. 33 depicts the resultant measured step group chirp impedance spectrum plot of the embodiment of FIG. 32 superimposed with the EIS reference spectrum plot.

STEP GROUP CHIRP EXAMPLE III. Now, with primary reference to FIGS. 32 and 33, in a third example of step group chirp, the step group excitation time record (25C) is the same as used in the first and second simulations of group chirp (26C) with the RMS excitation current of 500 mA with 16 frequencies stepping up from 0.05 Hz applied to a physical test device (3) and a 50 mOhm shunt (57). The step group chirp response time records (23C) were captured and processed with TCTC substantially as performed in the first and second simulations of group chirp (26C). FIG. 32 depicts the step group excitation time record (57A) including a plot of the step group chirp excitation signal (57B), and FIG. 33 depicts the group chirp impedance spectrum plot (8C) of the step group chirp response time record (23C) of the test device (3) processed using TCTC superimposed with the EIS reference impedance spectrum plot (8E). An offset of about +0.5 mOhm can be added to group chirp SOS impedance spectrum (8C) resulting in a substantial match with the EIS impedance reference spectrum plot (8E).

Figure 34:
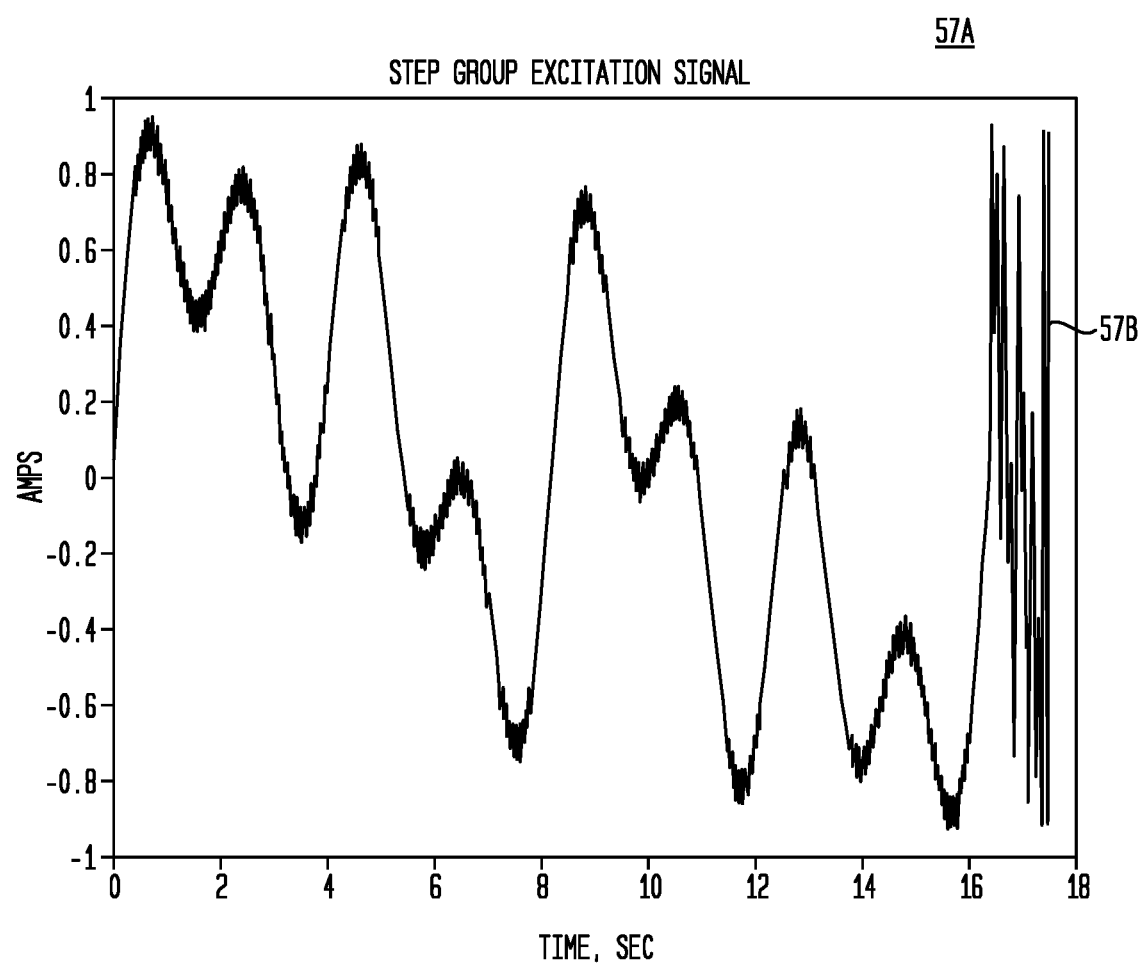
FIG. 34 depicts another embodiment of a step group chirp measured excitation time record applied to the test electrical circuit shown in FIG. 4.
Figure 35:
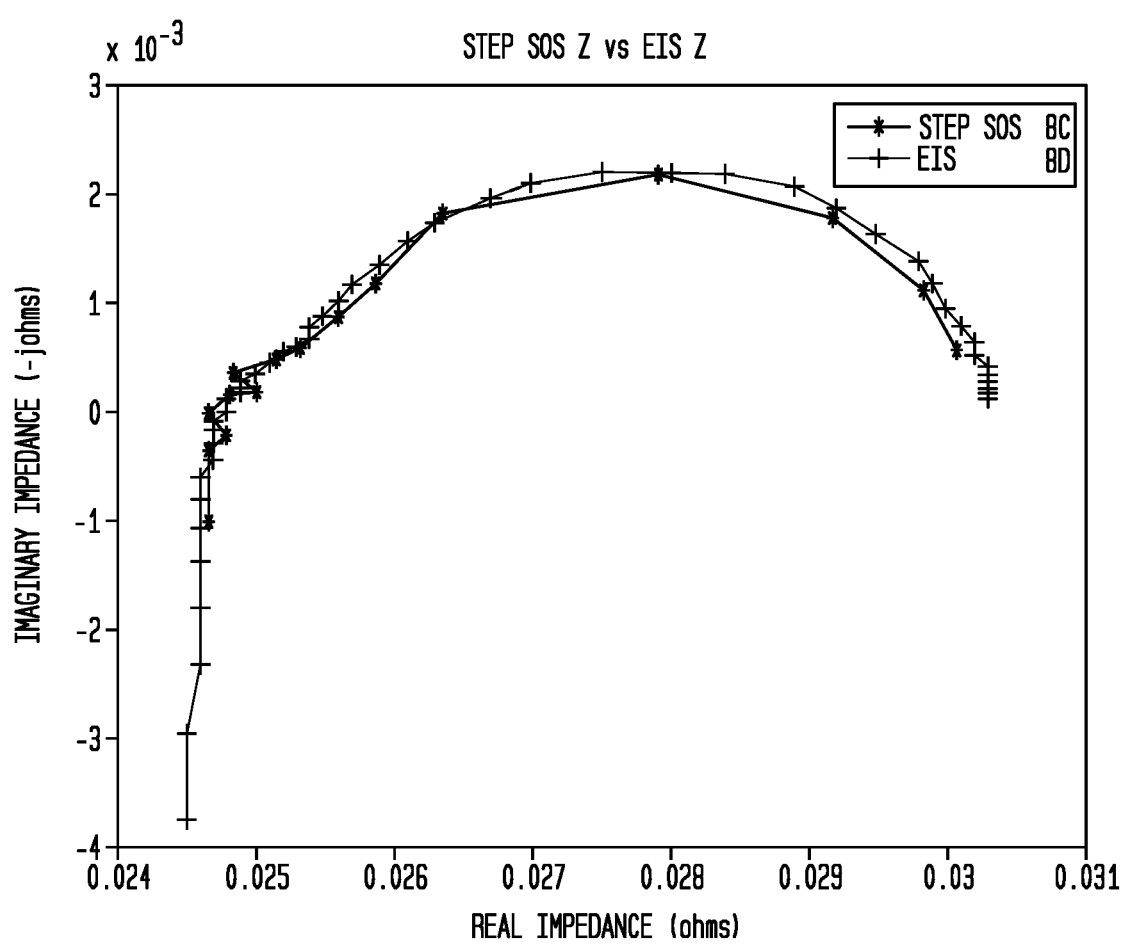
FIG. 35 depicts the resultant measured step group chirp impedance spectrum plot of the embodiment of FIG. 34 superimposed with the EIS reference spectrum plot.

STEP GROUP CHIRP EXAMPLE IV. Now, with primary reference to FIGS. 34 and 35, in a fourth example of step group chirp (26C), the step group chirp excitation time record (25C) was as used in the prior examples of step group chirp (26C) with the RMS excitation current of 500 mA with 16 frequencies stepping down from 2000 Hz applied to the test device (3) and a 50 mOhm shunt (57). The step group chirp response time records (23C) were captured and processed with TCTC substantially as performed in the prior examples of step group chirp (26C). FIG. 34 depicts the step group chirp excitation time record (57A) including the step group chirp excitation signal (57B), and FIG. 35 depicts the group chirp impedance spectrum plot (8C) of the step group chirp response time record (23C) of the test device (3) processed using TCTC superimposed with the EIS reference impedance spectrum plot (8E).

As evidenced by the above examples, step group chirp (26C) can be performed with advantageous results in both analytical simulations using the electrical test circuit (4) and physical test devices (3). In particular embodiments, the initial portion (56) of each SOS chirp group response signal (24C) can be discarded to validate the steady state assumption and the step group chirp response time record (23C) processed with TCTC. Additionally, while the examples took advantage of the local minimum including four frequencies for the rogue wave depicted in FIG. 27; this is not intended to preclude the use of embodiments using other frequency spreads based on the application.

Figure 36:
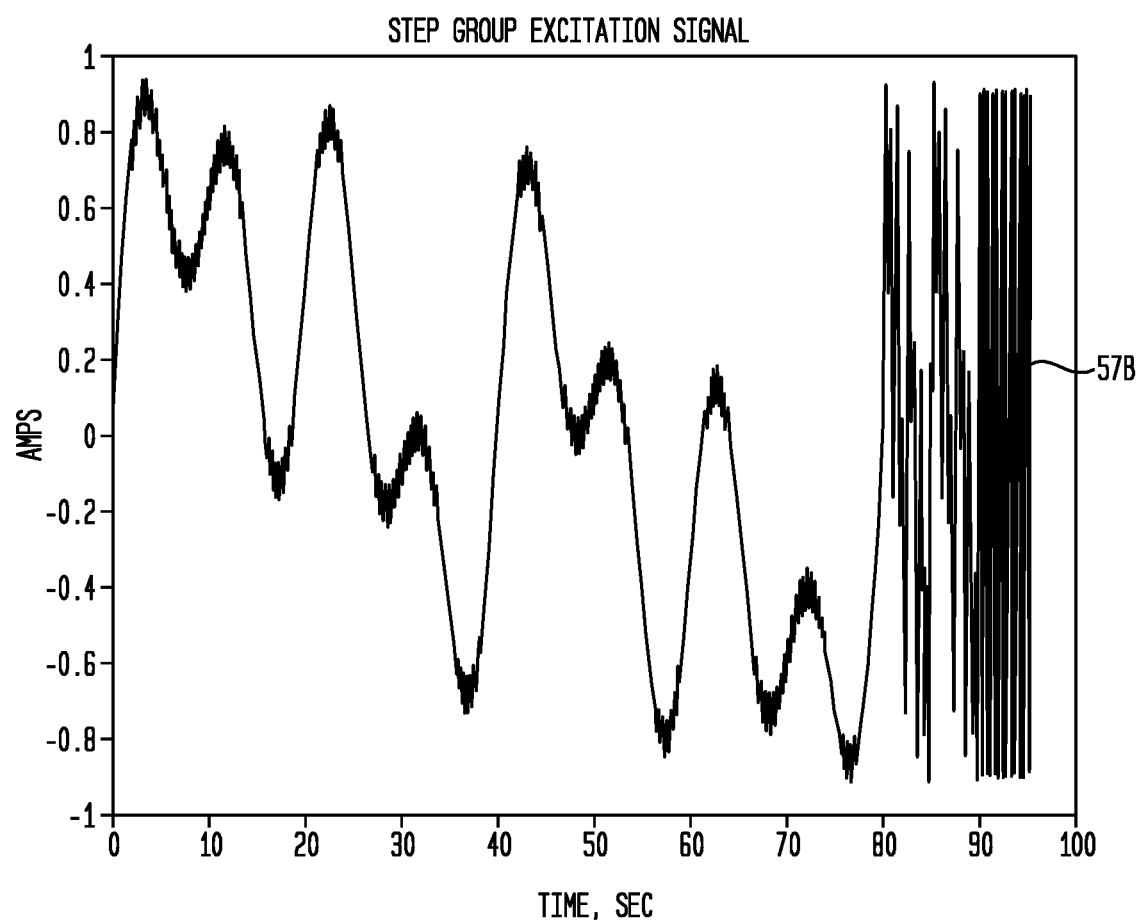
FIG. 36 depicts another embodiment of a step group chirp measured excitation time record applied to the test electrical circuit shown in FIG. 4.

Further illustrative examples of step group chirp (26C) were implemented by the IMD (1) based upon an step group chirp excitation time record (25C) to generate a step group chirp excitation signal (26C) at an RMS excitation current of 500 mA including 18 frequencies occurring in a range of about 0.125 Hz to about 1638.4 Hz with the first four frequency groups (59) including four frequencies and the fifth frequency group including two frequencies with additional periods at higher frequencies. FIG. 36 depicts a plot of the step group chirp excitation signal (57B) over time in seconds. Note that an SOS with 18 frequencies yields a rogue wave factor of 3.17 but the frequency groups with 2 or 4 frequencies within each group have a rogue wave factor of about 1.7, as depicted in FIG. 21.

Figure 37:
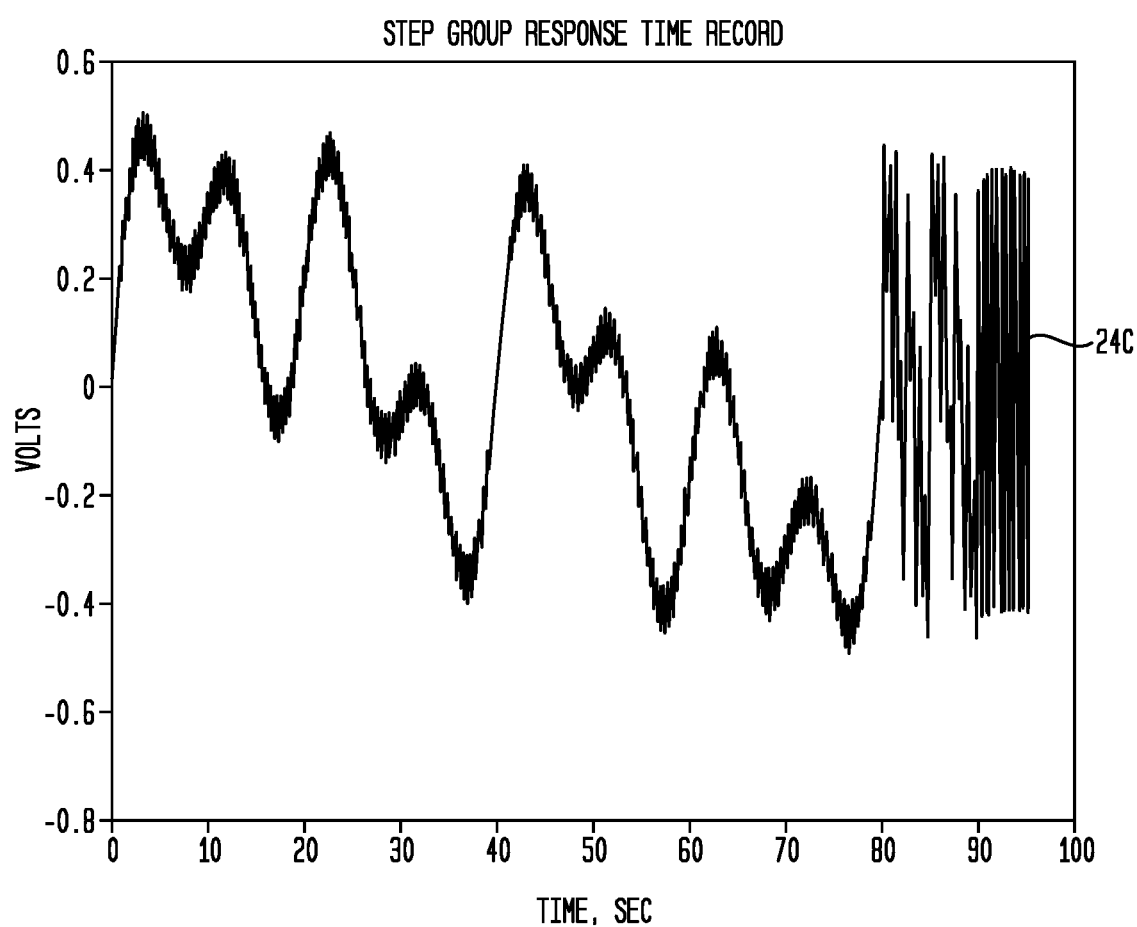
FIG. 37 depicts the measured step group chirp response time record of the test electrical circuit shown in FIG. 4.
Figure 38:
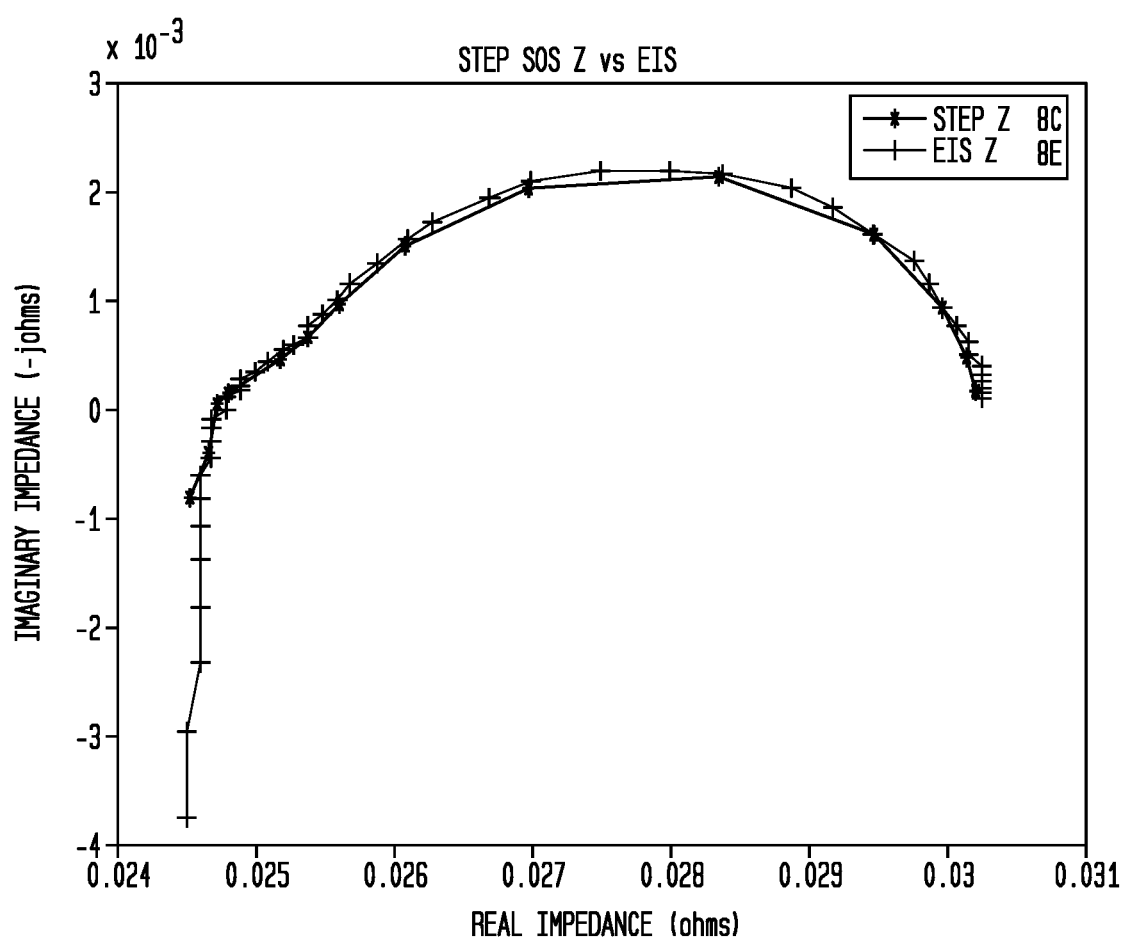
FIG. 38 depicts the resultant measured step group chirp spectrum plot of the impedance spectrum of the embodiment of FIG. 37 superimposed with the EIS reference impedance spectrum.

STEP GROUP CHIRP EXAMPLE V. Now, referring primarily to FIGS. 37 and 38 which respectively depict a plot of the test device voltage response (24C) over time in seconds and the Nyquist step chirp spectrum plot (8C) of the impedance spectrum (7) for the step group chirp response time record (23C) of the test device (3) processed using TCTC superimposed with the EIS reference impedance spectrum (8E) for the test device (3) which evidences that the test device impedance measurement (2) performed using group chirp (26C) results in a substantial match with the EIS reference impedance spectrum (8E) for the test device (3).

The step group chirp time response time record (23C) was processed using TCTC and the steady state assumption was achieved by deleting the initial portion (56) of step chirp response time record (23C) of each frequency group (59) (in the examples of FIGS. 36 through 41 the initial portion (56) comprises an initial portion of 20%).

STEP GROUP CHIRP EXAMPLE VI. Now, with general reference to FIGS. 39 and 40, a further illustrative example of step group chirp (26C) was implemented by the IMD (1) based upon a harmonic frequency sweep over decades structured to yield seven harmonic frequencies (11) per decade: 1, 2, 3, 4, 5, 7, 9 and assembling an step group chirp excitation time record (25C) to generate an excitation signal at an RMS excitation current of 500 mA including four decades with the starting frequency in each decade: 0.1, 1, 10, 100 yielding a total of 28 frequencies. The group SOS rogue wave constant is 2.657.

The frequency distribution factor for these frequency groups is:

$$\sqrt{\frac{2}{7}}$$

Without the step group chirp separation, the full SOS excitation for 28 frequencies, would have a distribution factor of:

$$\sqrt{\frac{2}{28}}$$

The group chirp time response time record (23C) was processed using TCTC and the steady state assumption was achieved by deleting the initial portion (56) of the step group chirp response time record (23C) of each frequency group (59) (in the examples of FIGS. 39 and 40) the initial portion comprises the initial portion of 20%).

Figure 39:
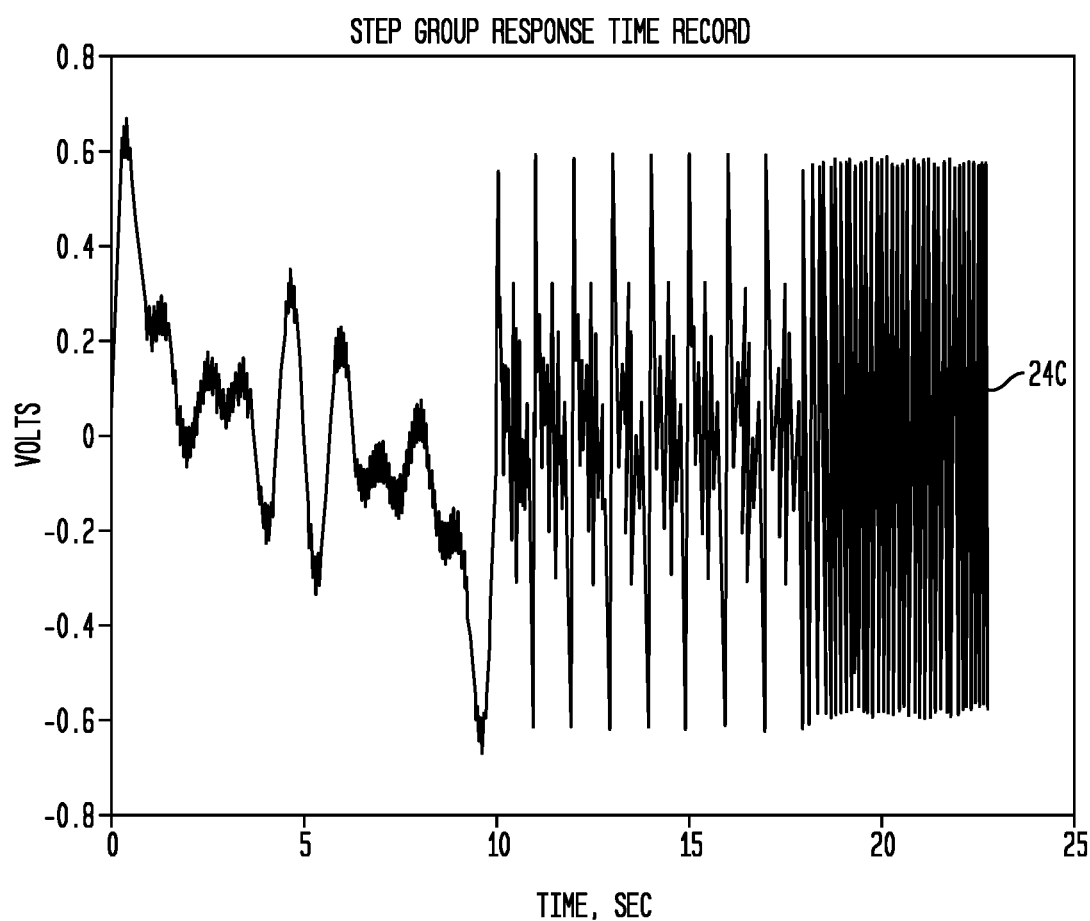
FIG. 39 depicts another embodiment of a measured step group chirp response time record of the test device shown in FIG. 4.
Figure 40:
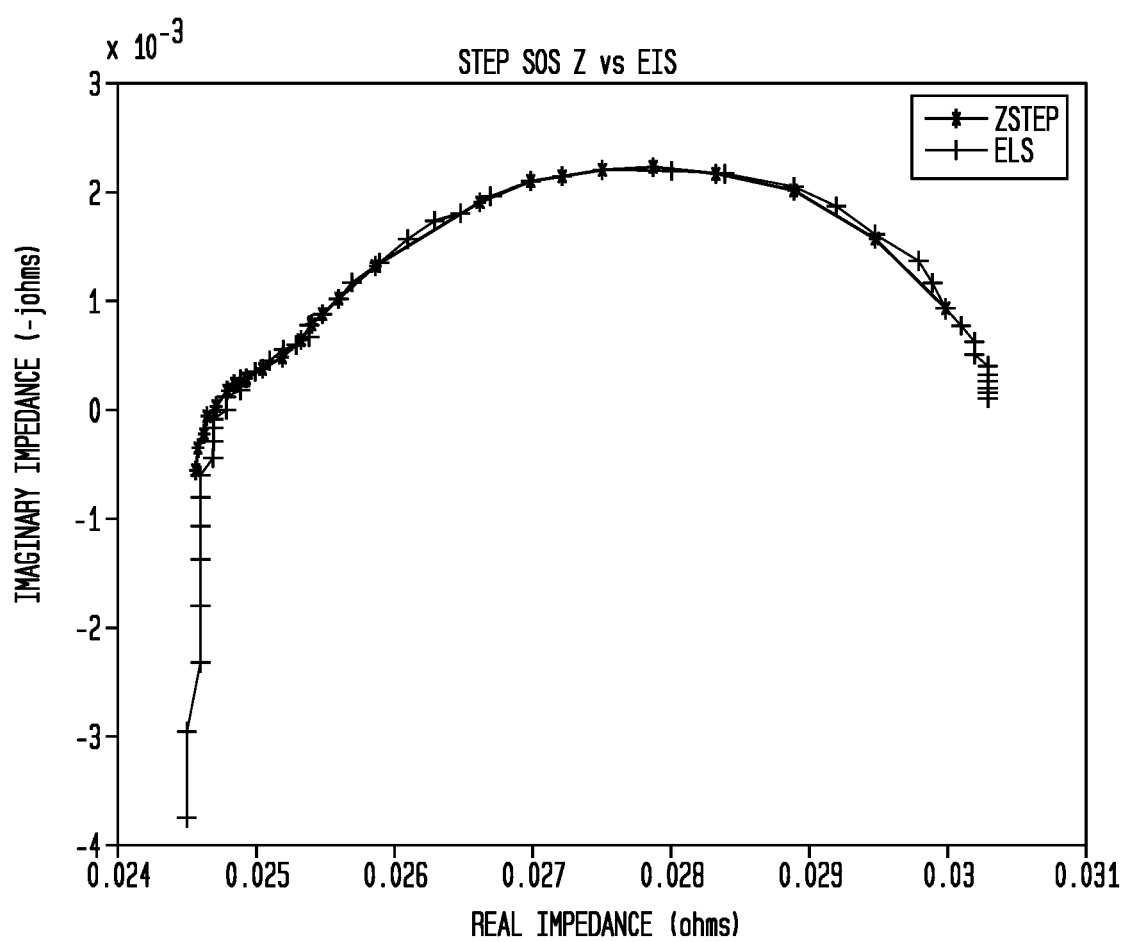
FIG. 40 depicts the resultant measured step group chirp spectrum plot of the impedance spectrum of the embodiment of FIG. 39 superimposed with the EIS reference impedance spectrum.

FIG. 39 depicts a plot of the group chirp response time record (25C) of the group chirp SOS current response signal (24C), as above described, and FIG. 40 depicts the Nyquist step group chirp plot (8C) of the impedance spectrum for the TCTC processed step group chirp response time record 23C) of the test device (3) superimposed with the EIS reference spectrum plot (8E). FIG. 40 evidences a substantial match with the EIS reference impedance spectrum plot (8E) for the test device (3).

STEP GROUP CHIRP EXAMPLE VII. Now, with primary reference to FIGS. 41 and 42, a further illustrative example of step group chirp (26C) was implemented by the IMD (1) based upon establishing frequencies separated by a factor of $\sqrt{2}$ for a total of 29 frequencies. Although this may not comprise a harmonic frequency sweep, the IMD (1) can assemble the step group chirp excitation time record (25C) to generate a step group excitation signal (26C) at an RMS excitation current of 500 mA comprised of frequency groups (59) of every other frequency to achieve octave harmonics. Thus, the sequence of frequencies assigned to each group can be reformatted to achieve the desired 29 frequency spread while keeping octave harmonic separation within each frequency group. The time step group chirp response time record (23C) was processed using TCTC and the steady state assumption was achieved by deleting the initial portion (56) of step chirp response time record (23C) of each frequency group (59) (in the examples of FIGS. 41 and 42 the initial portion (56) comprises an initial portion (56) of 20%).

Figure 41:
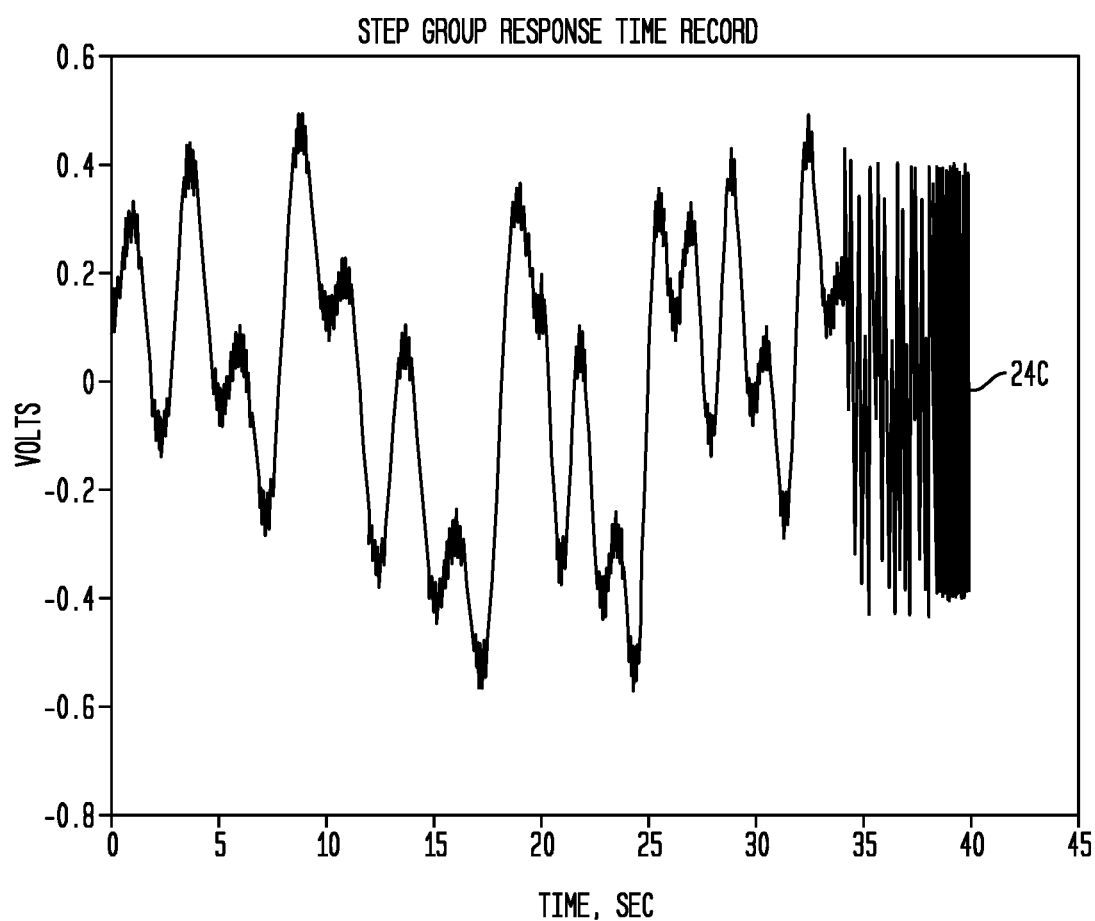
FIG. 41 depicts another embodiment of a measured step group chirp response time record of the test device shown in FIG. 4.
Figure 42:
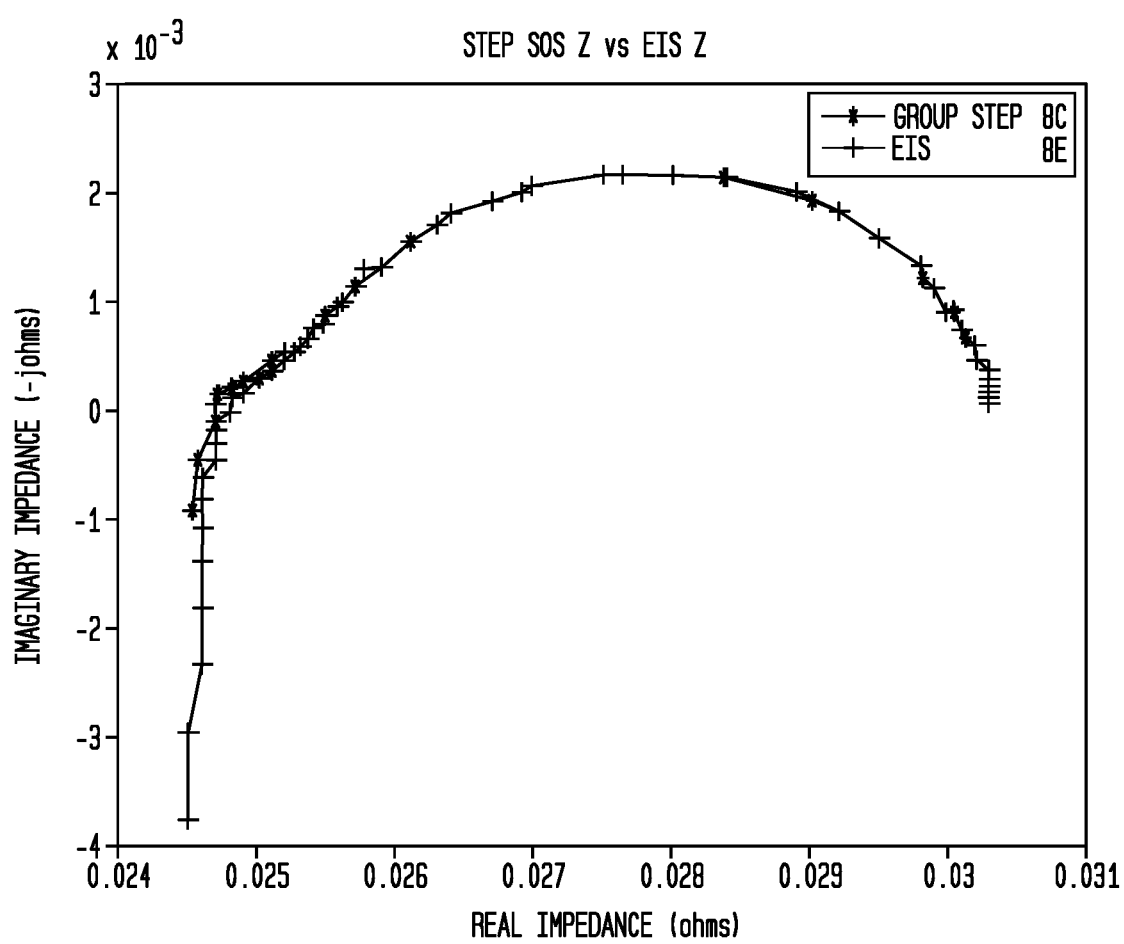
FIG. 42 depicts the resultant measured step group chirp spectrum plot of the impedance spectrum of the embodiment of FIG. 41 superimposed with the EIS reference impedance spectrum.
Figure 43:
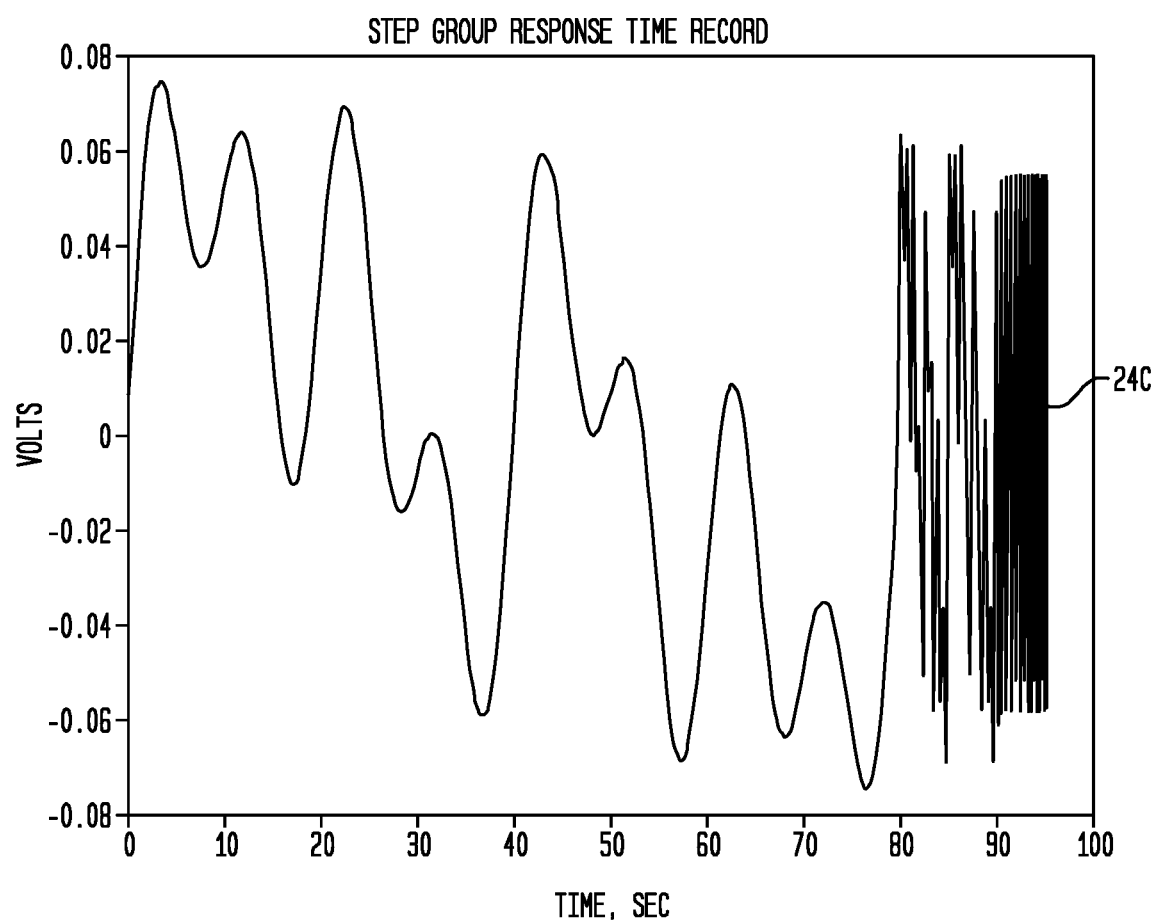
FIG. 43 depicts another embodiment of a simulated step group chirp response time record of the test electrical circuit shown in FIG. 4.
Figure 44:
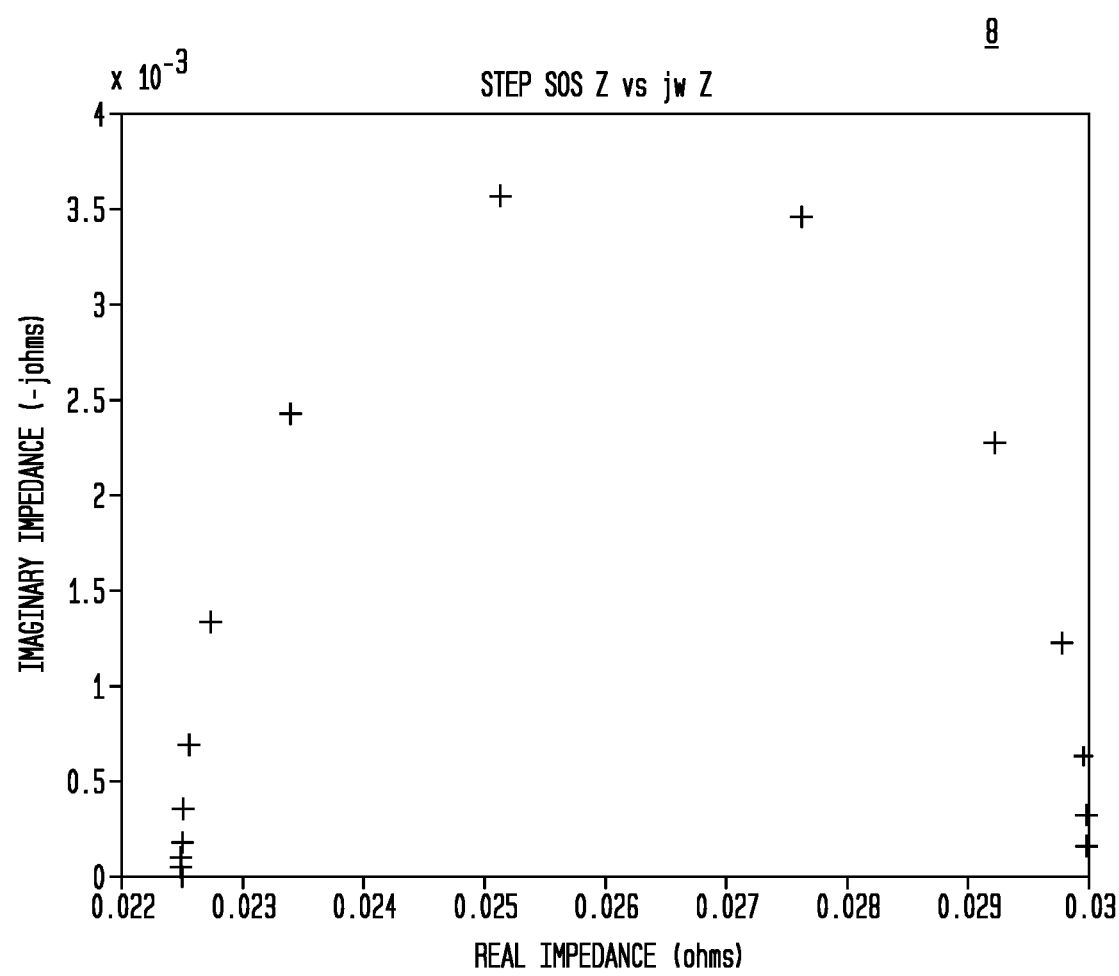
FIG. 44 depicts the resultant simulated step group chirp spectrum plot of the impedance spectrum of the embodiment of FIG. 43.
Figure 45:
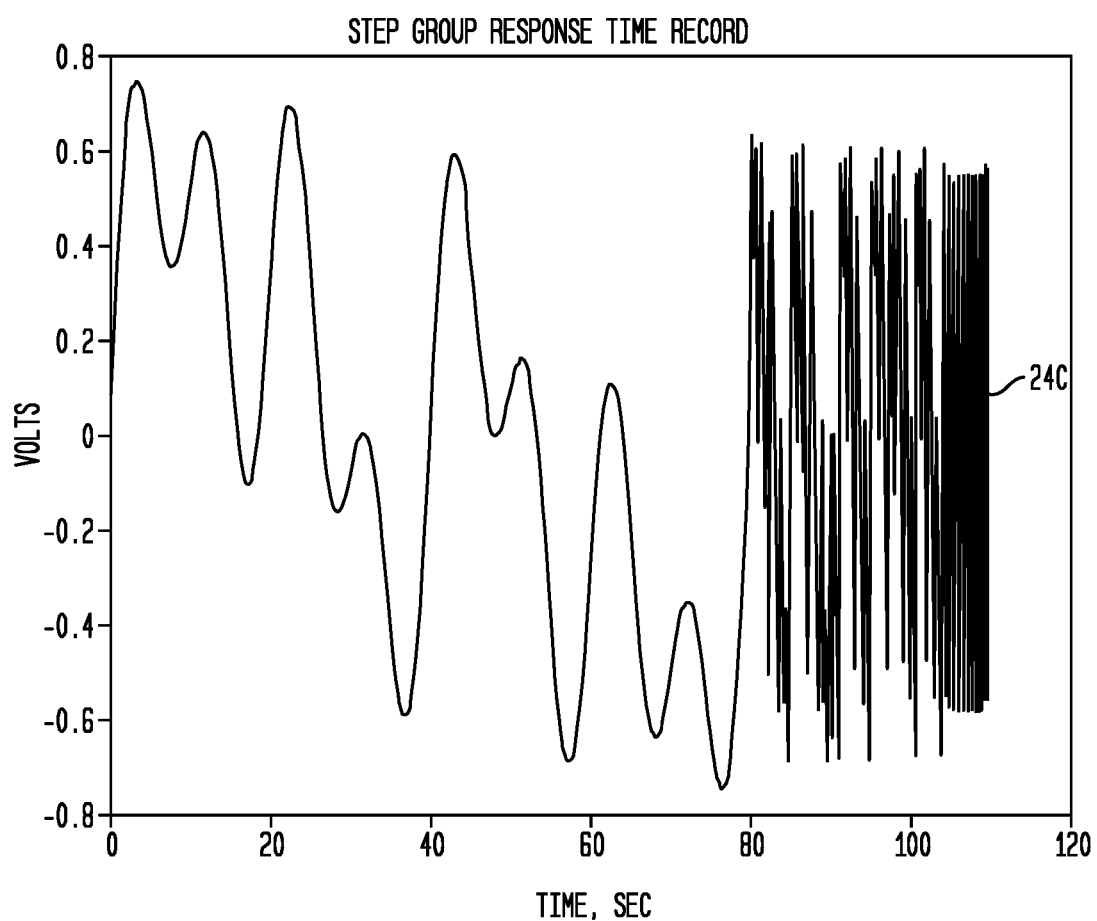
FIG. 45 depicts another embodiment of a simulated step group chirp response time record of the test electrical circuit shown in FIG. 4.
Figure 46:
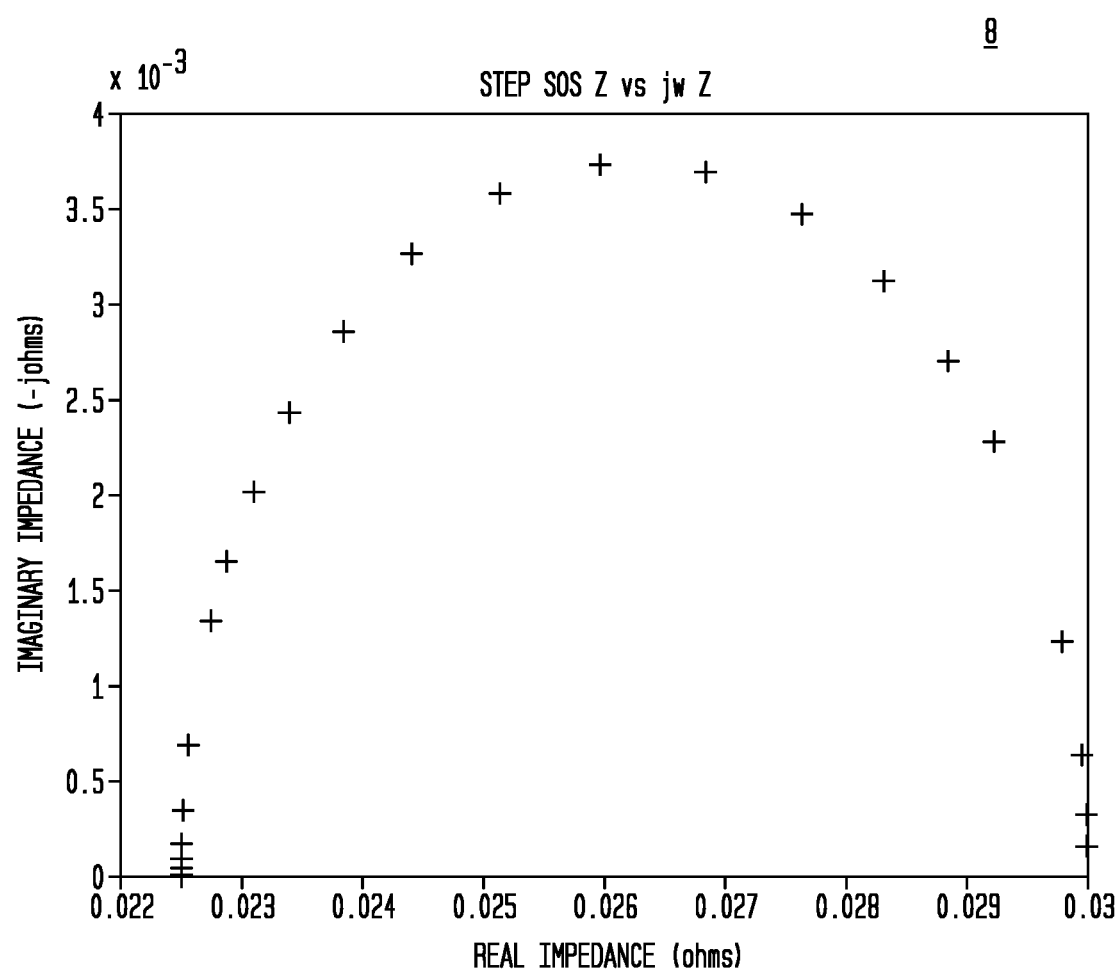
FIG. 46 depicts the resultant simulated group chirp spectrum plot of the impedance spectrum of the embodiment of FIG. 45.
Figure 47:
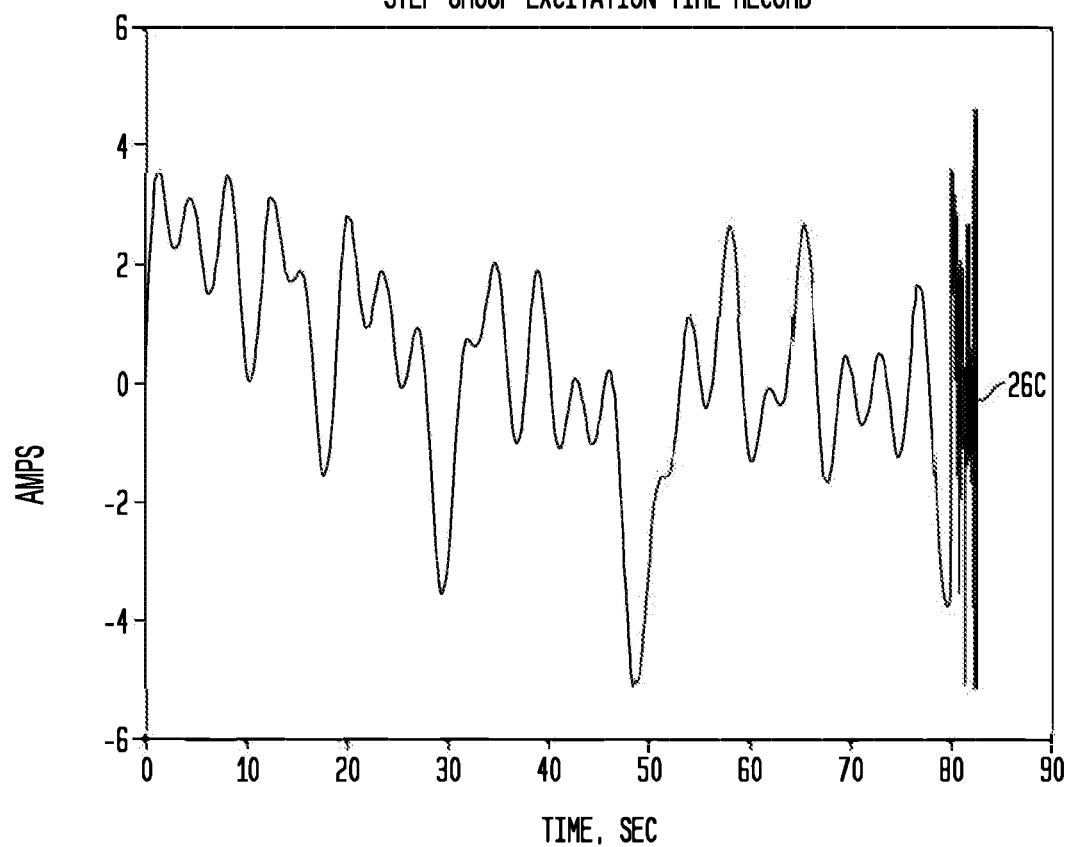
FIG. 47 depicts another embodiment of a simulated step group chirp response time record of the test electrical circuit shown in FIG. 4.

Now, referring to FIG. 41 which depicts the step group chirp response time (23C) for the test device (3) and FIG. 42 depicts the step group chirp impedance spectrum plot (8C) superimposed with EIS reference impedance spectrum plot (8E). The step group chirp response time record (23C) has a duration comparable to a 20 second HCSD SOS time record of 16 frequencies with a rogue wave of about 3 and a frequency distribution factor of $$\sqrt{\frac{2}{16}}.$$

By comparison, this step group chirp (26C) approach yields a rogue wave factor of about 1.7 and a frequency distribution factor of about 0.7. This comprises a substantial improvement, however, this approach doubles the time record.

STEP GROUP CHIRP EXAMPLES VIII AND IX. Now, with general reference to FIGS. 43 through 48, in particular embodiments, a very high-fidelity impedance spectrum can also be achieved using step group chirp (26C) at the expense of greater duration in the time records. For example, the root-2 separation in the prior Example VII can be increased to a cube-root of 2 ($2^{\wedge}\frac{1}{3}$) for 43 frequencies, where every third frequency is an octave harmonic. Alternatively, the step group chirp excitation signal (26C) could be developed based on a user-selected number of points per decade of frequency. For example, 10 points per decade of frequencies between 0.1 and 2 kHz would result in 38 frequencies (11) in a linear scale or 39 frequencies in a logarithmic scale. The frequency groups (59) would be selected such that the rogue wave is minimized in either case (as described above). Processing the step group chirp response time record (23C) with TCTC, may obviate the need for harmonic separation between frequencies in frequency groups.

In particular embodiments, the step group chirp excitation time record (26C) can be supplemented with offset frequency groups (60). As an illustrative example, the step group chirp excitation time record (25C) can include 18 frequencies with octave harmonic separation comprising four groups (59) each including four frequencies and a fifth frequency group (59) including two frequencies, and where additional fidelity is required (for example, at about 1 Hz), then offset frequency groups (60), offset by the square-root of 2 (0.28 Hz, 0.57 Hz, 1.13 Hz, 2.26 Hz) can be added to the step group chirp excitation time record (25C) after the second frequency group (0.2 Hz, 0.4 Hz, 0.8 Hz, and 1.6 Hz), additional offset groups (60) can also be added to ensure sufficient fidelity in a range of interest.

Again, with primary reference to FIGS. 43 through 48, this illustrative example of step group chirp (26C) used a recursive model electrical circuit (4) as depicted in FIG. 4, the IMD (1) assembled step group chirp excitation record (25C) for Example VIII (FIGS. 43 and 44) including 16 frequencies comprised of 4 frequency groups, each having 4 frequencies to afford the advantage of the local minimum for crest factor. The 16 frequencies (11) comprising octave harmonics starting at 0.0125 Hz and ending at 409.2 Hz. In Example IX (FIGS. 45 and 46), the IMD (1) assembled a step group chirp time excitation record (25C) for high resolution group chirp including, the first 2 frequency groups (59) as octave harmonic, the third frequency group (59) included offset frequencies (60) of those frequencies in the second frequency group (59) with the frequencies (11) adjusted by a factor of 2 to the ⅓ power, the fourth frequency group (59) included those frequencies in the second frequency group but those frequencies were adjusted by a factor of 2 to the ⅔ power, and the final two frequency groups (59) were a continuation of octave harmonic for a total of 24 frequencies. The recursive model test circuit (4) step group chip response time records (23C) were obtained for each of the examples (FIGS. 43 and 45) and processed using TCTC. The jw Nyquist plot (8D) of the model test electrical circuit (4) of each example is depicted FIGS. 44 and 46 respectively. In this illustrative example, the only disadvantage to the use of the high resolution step group chirp (26C) may be an increase in the time record of about 15 seconds. The crest factor and the frequency distribution factor remained substantially the same.

Broader ranges of frequencies can also be considered with step chirp (26B) and step group chirp (26C). Higher frequencies may require multiple periods to ensure capture of sufficient data points for accurate impedance calculations. Lower frequencies may have reduced sampling rates provided there are sufficient datapoints to achieve good signal-to-noise ratios in the impedance calculation. For example, a minimum frequency of 0.00125 Hz can be used (an order of magnitude lower than the 0.0125 Hz in previous examples). Assuming a cube-root of 2 separation a frequency groups of four frequencies in each frequency group), the excitation time record would yield 62 frequencies through 1651.4 Hz. The time records would have duration of 2560 seconds (42.7 minutes).

In another embodiment, a sequence of frequency groups (59) in a step group chirp excitation time record (25C) may include one or more pre-selected target frequencies (61) included within the sequence of frequency groups (59). As an example, an impedance measurement having a pre-selected target frequency (61) at 42 Hz with a starting frequency of 0.0125 Hz and an ending frequency near 2 kHz. The frequency group (59) that encompasses or is nearest to the target frequency (61) of 42 Hz can be shifted to include 42 Hz in the illustrative example. Assuming octave harmonic separation, the nearest frequency group to the target frequency (61) of 42 Hz would include frequencies 51.2 Hz, 102.4 Hz, 204.8 Hz, and 409.6 Hz. This frequency group could be shifted by a scaling factor of 0.82 to formulate a new frequency group including 42 Hz, 84 Hz, 168 Hz, and 336 Hz. Further, in cases where the targeted frequency (61) tends to shift as a function of age and use of the device (3) as depicted in FIG. 2, an impedance spectrum can be generated periodically over time and the impedance spectrum can be analyzed by direct observations of the calculated impedance data or equivalent circuit modeling to identify the shift and adjust the targeted frequency (61) to mitigate accumulating error due to drift.

Figure 48:
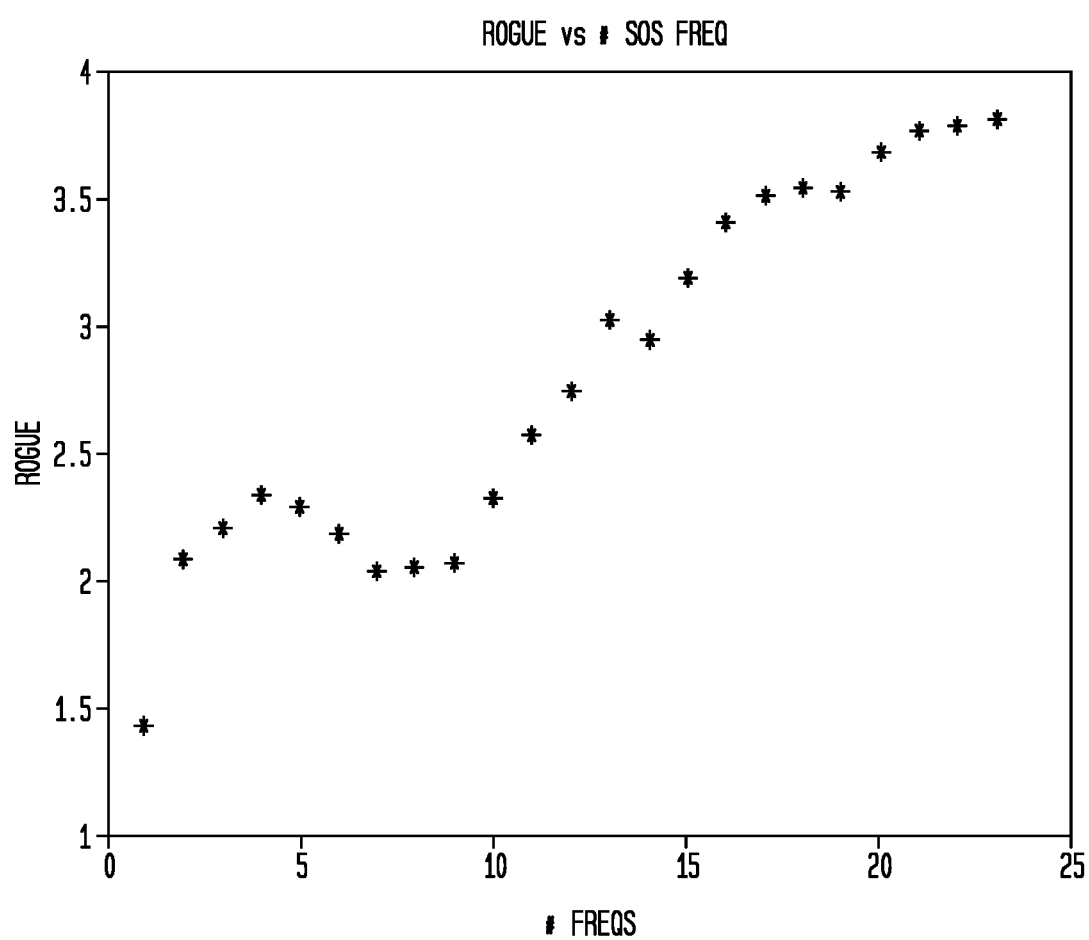
FIG. 48 depicts a plot of the rogue wave for an embodiment of the step group chirp signal to reduce the rogue wave and including target frequencies of FIG. 47.

STEP GROUP CHIRP EXAMPLE XI. Now, with primary reference to FIGS. 47 and 48, in particular embodiments, the maximum number of frequencies (11) to be included within an impedance measurement (2) (for example, 30 frequencies) can be pre-selected, the excitation time record (25) can be assembled using a logarithmic scale to calculate the total number of frequencies required to reach the example target frequency (61) of 42 Hz (16 frequencies in this case) which can used to determine the spacing between frequencies. The resulting excitation time record (25) produces 42 Hz at the sixteenth frequency and includes a total of 23 frequencies with a maximum of 1857.3 Hz. As depicted in FIG. 48, the rogue wave (Peak/RMS) for the twenty third frequency equals 3.8273 with the local minimum at the seventh frequency equals 2.03. Thus, this approach can be used with step group chirp, where each frequency group includes seven frequencies, and processed using TCTC. Further, in cases where the targeted frequency (61) tends to shift as a function of age and use of the device (3) as depicted in FIG. 2, an impedance spectrum can be generated periodically over time and the impedance spectrum can be analyzed by direct observations of the calculated impedance data or equivalent circuit modeling to identify the shift and adjust the targeted frequency (61) to mitigate accumulating error due to drift.

MIXED STEP CHIRP AND STEP GROUP CHIRP. In particular embodiments, it may be useful to include one or more specific target frequencies (61) in a sequence by combining the step chirp (26B) and step group chirp (26C) sequences. In this approach, a step chirp-group chirp excitation time record (25) can be assembled based on the required upper and lower frequency limits. The resulting excitation time record (25) would include step group chirp (26C) frequency groups (59) interspersed with step chirp (26B) single frequencies. Although this approach may require time records of greater duration, it may be useful for a pre-selected set of frequencies of interest for diagnostic purposes. In this case, multiple periods at the targeted frequencies could be conducted for improved measurement accuracy at critical points. Further, in cases where the targeted frequency tends to shift as a function of age and use as depicted in FIG. 2, the full-spectrum algorithm analysis could be used to identify the shift and adjust the targeted frequency to mitigate accumulating error due to drift and adjust the excitation signal accordingly.

Figure 49:
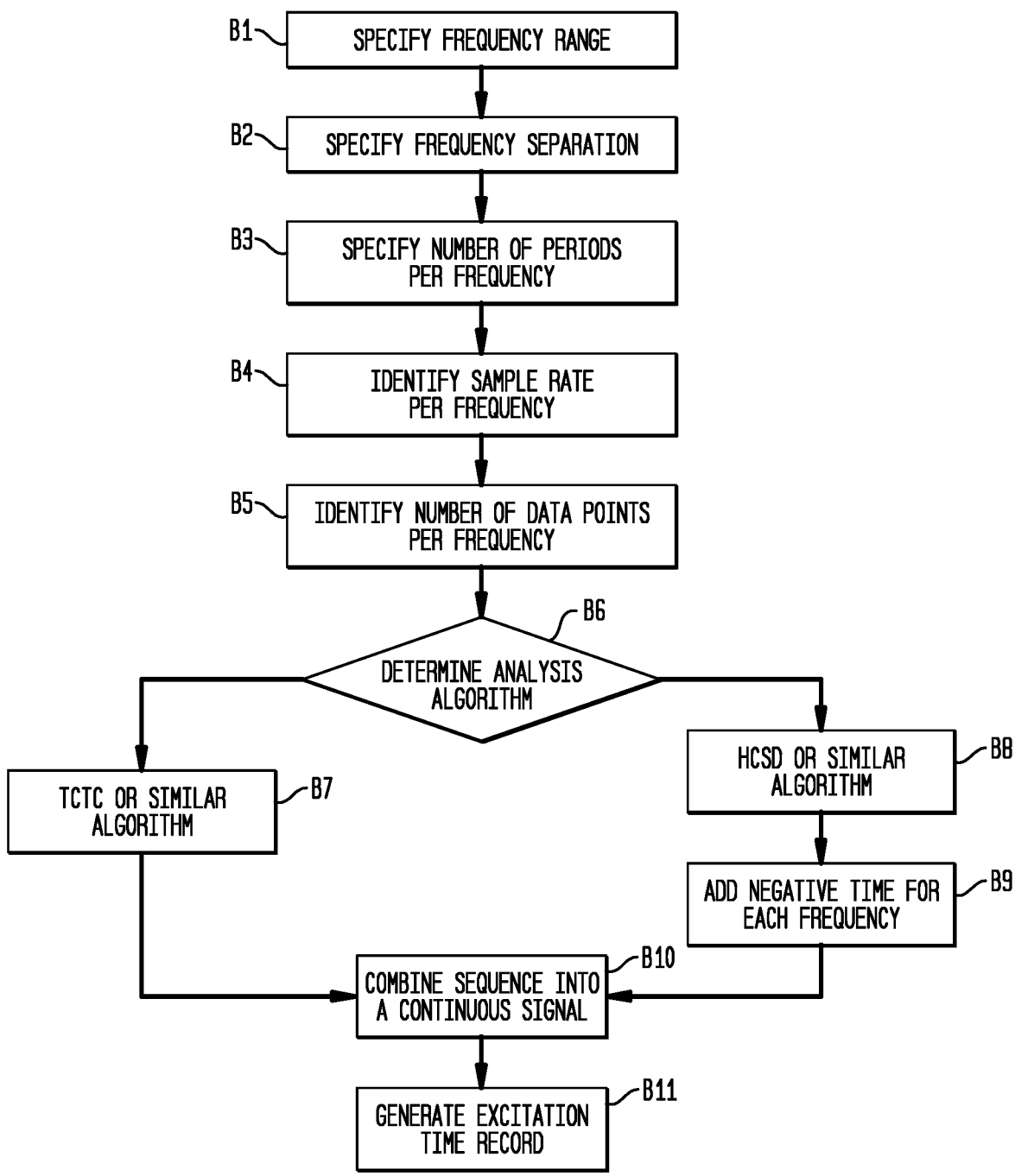
FIG. 49 is a block flow diagram of a method of assembling an excitation time record for embodiments of step chirp.

Now, with primary reference to FIG. 49, embodiments include a method of assembling an excitation time record for step chirp including one or more of specifying a frequency range (B1), specifying the separation between frequencies in the frequency range (B2), specifying the number periods for each frequency (B3), identifying the sample rate for each frequency (B4), identifying the number of data points collected for each frequency (B5), determining the response time record analysis algorithm (B6), selecting TCTC (B7) or selecting HCSD (B8), and if HCSD, then adding a negative time period to each frequency (B9), combining the sequence of frequencies into a continuous excitation time record (B10), and generating a excitation time record (B11) for step chirp impedance measurement of a test device (3), for example, an electrochemical cell.

Figure 50:
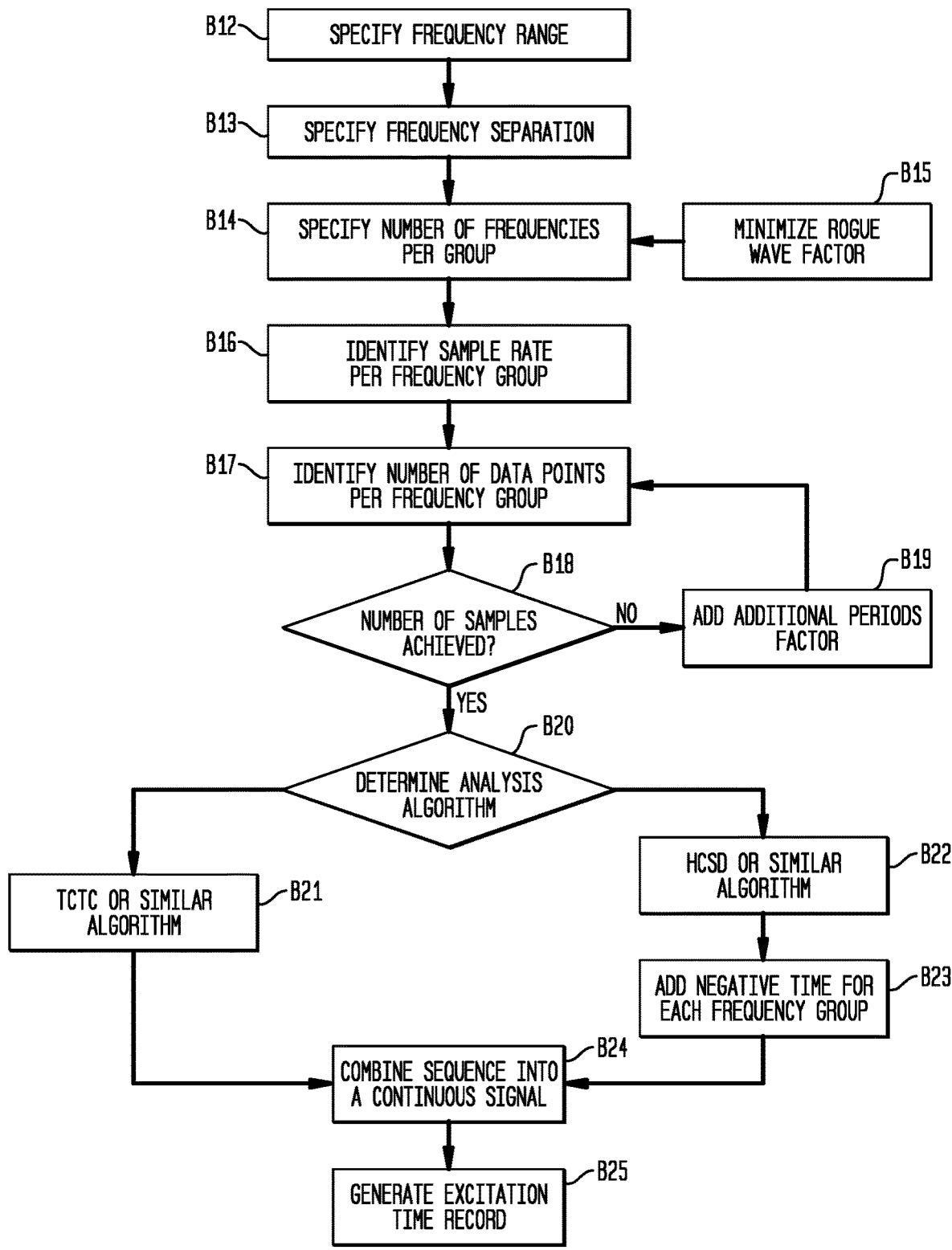
FIG. 50 is block flow diagram of a method of assembling an excitation time record for embodiments of step group chirp.

Now, with primary reference to FIG. 50, embodiments include a method of assembling an excitation time record for step group chirp including one or more of specifying a frequency range (B12), specifying the separation between frequencies in the frequency range (B13), specifying the number frequencies per frequency group (B14), wherein specifying the number of frequencies per group can further include selecting the frequencies per group to minimize the rogue wave (B15); identifying the sample rate for each frequency group (B16), identifying the number of data points collected for each frequency group (B17), determining if a sufficient number of samples have been collected in each frequency group (B18), and if no, adding additional periods to frequency groups having an insufficient number samples collected (B19); determining the response time record analysis algorithm (B20), selecting TCTC (B21) or selecting HCSD (B22), and if HCSD, then adding a negative time period to each frequency group (B23), combining the sequence of frequencies into a continuous excitation time record (B24), and generating a excitation time record (B25)

for group chirp impedance measurement of a test device (3), for example, an electrochemical cell.

Figure 51:
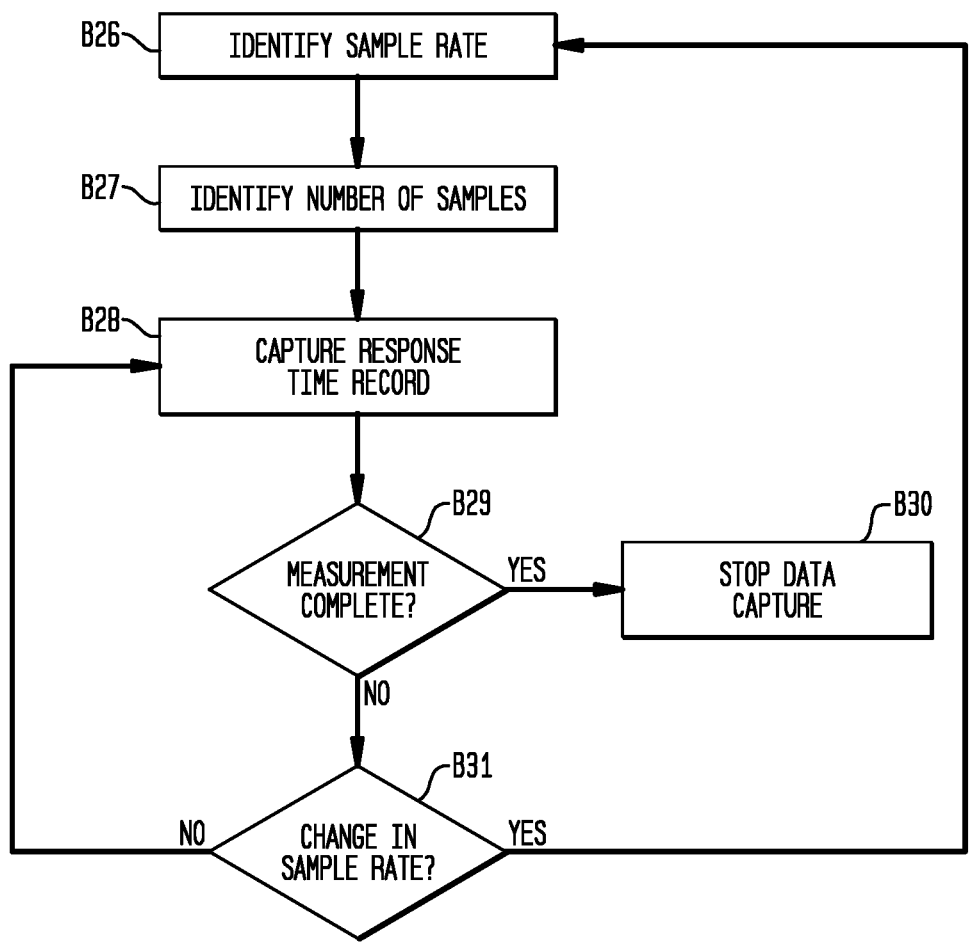
FIG. 51 is block flow diagram of a method of capturing a response time record for embodiments of step chirp and step group chirp.

Now, with primary reference to FIG. 51, embodiments include a method of capturing a response time record including one or more of identifying a sample rate of said response signal of the device under test (26), identifying the number of samples collected in the response signal (B27), capturing a response time record of the EC under test (B28), determining whether impedance measurement complete (B29), if yes, then stop data capture of response time record (B30), and if no, determine whether sample rate should be changed (B31), and if no, capturing response time record (B28), and if yes, identifying sample rate (B26).

Figure 52:
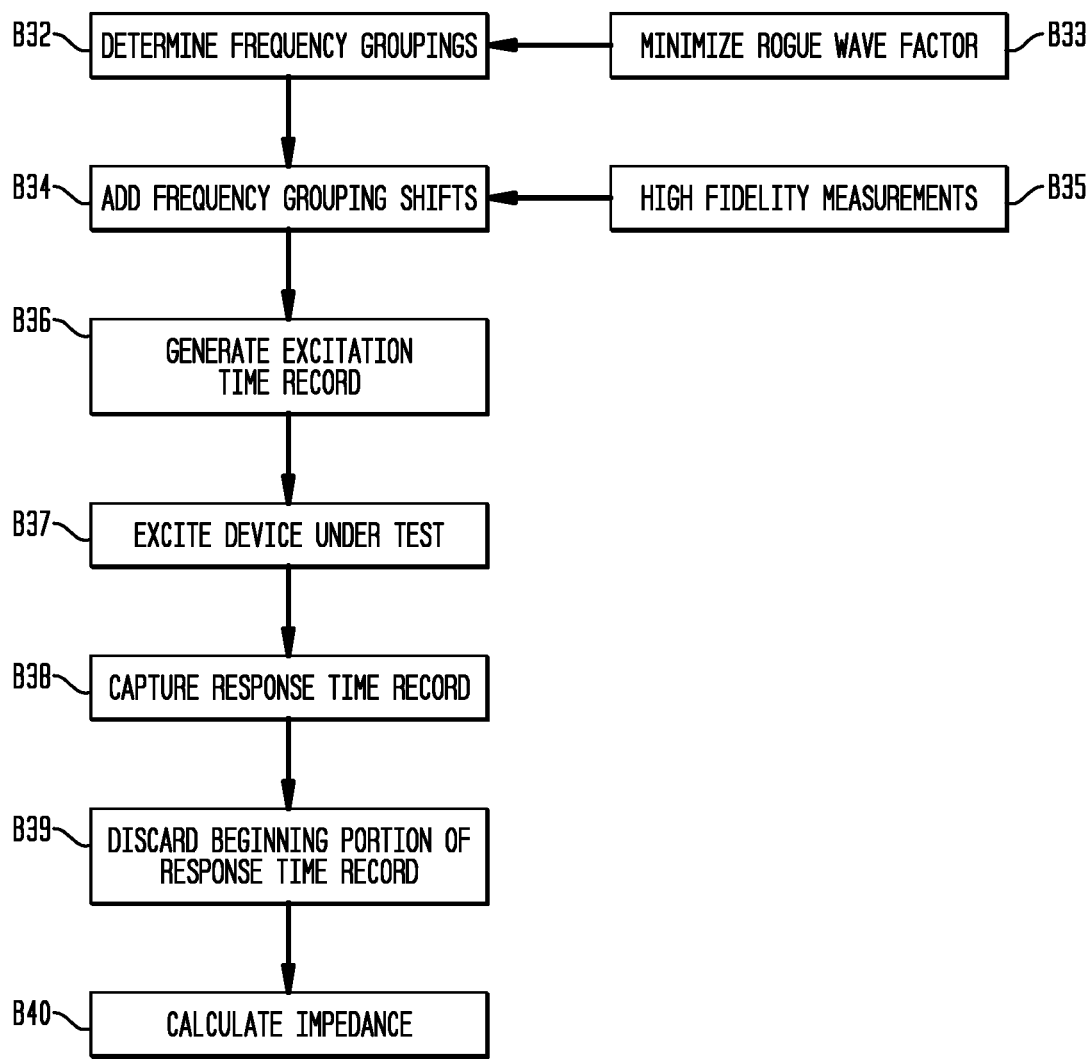
FIG. 52 is block flow diagram of a method of performing embodiments of high fidelity impedance measurements of a device with step group chirp.

Now with primary reference to FIG. 52, embodiments include a method of performing impedance measurement of a device with step group chirp comprising one or more of: assembling frequency groups (B32) including specifying a frequency range, specifying the separation between frequencies in the frequency range, and specifying the number frequencies per frequency group, wherein specifying the number of frequencies per group can further include selecting the frequencies per group to minimize the rogue wave (B33), supplementing the frequency groups with frequency group shifts (B34), determining measurement parameters for frequency group shifts and location of the frequency group shifts to acquire sufficient fidelity in frequencies of interest (B35) including one or more of: identifying the sample rate for each frequency group, identifying the number of data points collected for each frequency group, determining if a sufficient number of samples have been collected in each frequency group, and if no, adding additional periods to frequency groups having an insufficient number samples collected, selecting an impedance spectrum algorithm, for example TCTC or HCSD, and if HCSD, then adding a negative time period to each frequency group, combining the sequence of frequencies into a continuous excitation time record, and generating a excitation time record for high-fidelity group chirp impedance measurement of the test device, for example an electrochemical cell (B36), exciting the test device using the excitation time record including a root mean squared current or a root mean squared voltage in a sequence of one or more frequency groups, wherein each of said frequency groups includes a summation of one or more frequencies within a frequency spread (B37), recording a response time record of a response of the test device (3) to the excitation time record (B38), discarding an initial time period of said response time record of each of said one or more frequency groups (B39), and processing the response time record using the impedance spectrum algorithm to determine impedance of the test device (3) (B40).

Now with primary reference to FIG. 53, embodiments include a method of performing high-fidelity impedance measurement of a device (3) with step group chirp comprising one or more of: assembling frequency groups (B41) including specifying a frequency range, specifying the separation between frequencies in the frequency range, and specifying the number frequencies per frequency group, wherein specifying the number of frequencies per group can further include selecting the frequencies per group to minimize the rogue wave (B42), identifying one or more target frequencies (B43), identifying frequency groups closest to or encompassing the target frequencies (B44); shifting frequency groups closest to target frequencies to include target frequency or supplementing the frequency groups closest to target frequencies to include target frequencies (B45), identifying additional target frequency (B46), if yes, repeat procedures (B44) and (B45), if no, generating a excitation time record for group chirp impedance measurement of the test device (3) (B47), exciting the test device (3) using the excitation time record including a root mean squared current or a root mean squared voltage in a sequence of one or more frequency groups, wherein one or more frequency groups include the target frequencies, wherein each of said frequency groups includes a summation of one or more frequencies within a frequency spread (B48), recording a response time record of a response of the test device (3) to said excitation time record (B49), discarding an initial time period of said response time record of each of said one or more frequency groups (B50), and processing the response time record using the impedance spectrum algorithm to determine impedance of the test device (3) (B51), assessing shift in target frequency (B52), if yes, adjust target frequencies in the excitation time record (B53) for the next measurement sequence.

As can be easily understood from the foregoing, the basic concepts of the present invention may be embodied in a variety of ways. The invention involves numerous and varied embodiments of an IMD configured to perform impedance spectroscopy to provide rapid, broadband impedance measurements of electrochemical cells, such as: battery packs, modules or cells or combinations or components thereof using chirp, step chirp, or group chirp excitation signals, or combinations thereof, including the best mode.

As such, the particular embodiments or elements of the invention disclosed by the description or shown in the figures or tables accompanying this application are not intended to be limiting, but rather illustrative of the numerous and varied embodiments generically encompassed by the invention or equivalents encompassed with respect to any particular element thereof. In addition, the specific description of a single embodiment or element of the invention may not explicitly describe all embodiments or elements possible; many alternatives are implicitly disclosed by the description and figures.

It should be understood that each element of an apparatus or each step of a method may be described by an apparatus term or method term. Such terms can be substituted where desired to make explicit the implicitly broad coverage to which this invention is entitled. As but one example, it should be understood that all steps of a method may be disclosed as an action, a means for taking that action, or as an element which causes that action. Similarly, each element of an apparatus may be disclosed as the physical element or the action which that physical element facilitates. As but one example, the disclosure of a "impedance measurement" should be understood to encompass disclosure of the act of "impedance measuring"—whether explicitly discussed or not—and, conversely, were there effectively disclosure of the act of "impedance measuring", such a disclosure should be understood to encompass disclosure of a "impedance measurement" and even a "means for impedance measuring." Such alternative terms for each element or step are to be understood to be explicitly included in the description.

In addition, as to each term used it should be understood that unless its utilization in this application is inconsistent with such interpretation, common dictionary definitions should be understood to be included in the description for each term as contained in Merriam-Webster's Collegiate Dictionary, each definition hereby incorporated by reference.

All numeric values herein are assumed to be modified by the term "about", whether or not explicitly indicated. For the purposes of the present invention, ranges may be expressed as from "about" one particular value to "about" another particular value. When such a range is expressed, another embodiment includes from the one particular value to the other particular value. The recitation of numerical ranges by endpoints includes all the numeric values subsumed within that range. A numerical range of one to five includes for example the numeric values 1, 1.5, 2, 2.75, 3, 3.80, 4, 5, and so forth. It will be further understood that the endpoints of each of the ranges are significant both in relation to the other endpoint, and independently of the other endpoint. When a value is expressed as an approximation by use of the antecedent "about," it will be understood that the particular value forms another embodiment. The term "about" generally refers to a range of numeric values that one of skill in the art would consider equivalent to the recited numeric value or having the same function or result. Similarly, the antecedent "substantially" means largely, but not wholly, the same form, manner or degree and the particular element will have a range of configurations as a person of ordinary skill in the art would consider as having the same function or result. When a particular element is expressed as an approximation by use of the antecedent "substantially," it will be understood that the particular element forms another embodiment.

Moreover, for the purposes of the present invention, the term "a" or "an" entity refers to one or more of that entity unless otherwise limited. As such, the terms "a" or "an", "one or more" and "at least one" can be used interchangeably herein.

Thus, the applicant(s) should be understood to claim at least: i) each IMD, ii) the related methods of exciting an IMD disclosed and described, iii) similar, equivalent, and even implicit variations of each of these devices and methods, iv) those alternative embodiments which accomplish each of the functions shown, disclosed, or described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) methods and apparatuses substantially as described hereinbefore and with reference to any of the accompanying examples, x) the various combinations and permutations of each of the previous elements disclosed.

The background section of this patent application provides a statement of the field of endeavor to which the invention pertains. This section may also incorporate or contain paraphrasing of certain United States patents, patent applications, publications, or subject matter of the claimed invention useful in relating information, problems, or concerns about the state of technology to which the invention is drawn toward. It is not intended that any United States patent, patent application, publication, statement or other information cited or incorporated herein be interpreted, construed or deemed to be admitted as prior art with respect to the invention.

The claims set forth in this specification, if any, are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent application or continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

Additionally, the claims set forth in this specification, if any, are further intended to describe the metes and bounds of a limited number of the preferred embodiments of the invention and are not to be construed as the broadest embodiment of the invention or a complete listing of embodiments of the invention that may be claimed. The applicant does not waive any right to develop further claims based upon the description set forth above as a part of any continuation, division, or continuation-in-part, or similar application.

We claim:

1. A method for determining impedance of a device, comprising:
   exciting said device using an excitation time record including a root mean squared current or a root mean squared voltage in a sequence of a plurality of frequency groups, wherein each of said plurality of frequency groups includes a summation of one or more frequencies within a frequency spread;
   recording a response time record of a response of said device to said excitation time record;
   processing said response time record using an impedance spectrum algorithm; and
   determining impedance of said device.

2. The method of claim 1, wherein said excitation time record comprises continuous excitation of said root mean squared current or root mean squared voltage including said one or more frequency groups.

3. The method of claim 1, wherein said excitation time record of each of said plurality of frequency groups includes a plurality of frequencies and a duration of at least one period of the lowest frequency within said plurality of frequencies within said frequency group.

4. The method of claim 1, wherein said excitation time record of each of said one or more frequency groups includes one frequency and a duration of at least one period of said frequency.

5. The method of claim 1, wherein said impedance spectrum algorithm comprises time cross talk compensation.

6. The method of claim 1, wherein said excitation time record of each of said plurality of frequency groups includes:
   one or more frequencies having a harmonic separation and a duration of at least one period of said frequency; and
   a negative time period preceding said at least one period of said frequency.

7. The method of claim 6, wherein said impedance spectrum algorithm comprises harmonic compensated synchronous detection.

8. The method of claim 1, wherein said excitation time record includes at least one frequency group having at least one target frequency.

9. The method of claim 8, further comprising modifying said at least one target frequency based on determining an impedance spectrum shift of said device.

10. The method of claim 9, further comprising determining said impedance spectrum shift directly based on calculated impedance data.

11. The method of claim 9, further comprising determining said impedance spectrum shift directly based on equivalent circuit modeling.

12. The method of claim 9, wherein said method for determining impedance of a device repeats based on exceeding a pre-defined impedance spectrum shift threshold value.

13. The method of claim 1, wherein said one or more frequency groups comprise:
one or more base frequency groups, wherein each of said base frequency groups includes a summation of said one or more frequencies within said frequency spread; and
one or more offset frequency groups, wherein each of said offset frequency groups includes a summation of said one or more frequencies within said frequency spread, said one or more offset frequency groups shifted in relation to said one or more base frequency groups.

14. The method of claim 13, wherein said excitation time record includes at least one frequency group having at least one targeted frequency.

15. The method of claim 14, further comprising adjusting said targeted frequency based on said impedance spectrum shift.

16. The method of claim 1, wherein said one or more frequency groups determined based on a minimized rogue wave.

17. The method of claim 1, wherein a sample rate of said response time record adjusted based on period of lowest frequency of said one or more frequencies within said one or more frequency groups, wherein said sample rate of said response time record reduced as said period of lowest frequency increases, wherein said sample rate of said response time record increased as said period of lowest frequency with said frequency group decreases within each said one or more frequency groups.

18. The method of claim 1, wherein said frequency spread within each frequency group comprises an octave harmonic.

19. The method of claim 1, wherein the frequency spread within each frequency group comprises a non-octave harmonic and said an impedance spectrum algorithm comprises time cross talk compensation.

* * * * *